(12) United States Patent
Kanchiku

(10) Patent No.: US 8,012,671 B2
(45) Date of Patent: Sep. 6, 2011

(54) CURABLE COMPOSITION, IMAGE FORMING MATERIAL, AND PLANOGRAPHIC PRINTING PLATE PRECURSOR

(75) Inventor: Shigefumi Kanchiku, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 153 days.

(21) Appl. No.: 12/236,534

(22) Filed: Sep. 24, 2008

(65) Prior Publication Data

US 2009/0087788 A1    Apr. 2, 2009

(30) Foreign Application Priority Data

Sep. 27, 2007 (JP) ................... 2007-252532

(51) Int. Cl.
*G03F 7/027* (2006.01)
*G03F 7/00* (2006.01)

(52) U.S. Cl. .............. 430/281.1; 430/302; 430/284.1; 430/919; 430/920; 430/916; 430/914; 522/25

(58) Field of Classification Search .............. None
See application file for complete search history.

(56) References Cited

U.S. PATENT DOCUMENTS

| | | | | |
|---|---|---|---|---|
| 3,294,537 A | * | 12/1966 | Milton | 430/266 |
| 4,148,658 A | * | 4/1979 | Kondoh et al. | 522/8 |
| 4,308,367 A | * | 12/1981 | Green et al. | 525/529 |
| 4,423,136 A | * | 12/1983 | Crivello et al. | 430/281.1 |
| 5,045,433 A | * | 9/1991 | Kakumaru et al. | 430/281.1 |
| 5,061,602 A | * | 10/1991 | Koch et al. | 430/281.1 |
| 5,364,736 A | * | 11/1994 | Eramo et al. | 430/280.1 |
| 6,075,065 A | * | 6/2000 | Yamazaki et al. | 522/64 |
| 2004/0009414 A1 | | 1/2004 | Araki | |
| 2004/0072101 A1 | * | 4/2004 | Sugasaki et al. | 430/281.1 |
| 2007/0030541 A1 | | 2/2007 | Hayase et al. | |

FOREIGN PATENT DOCUMENTS

| | | | |
|---|---|---|---|
| EP | 1538185 A1 | | 6/2005 |
| JP | 08-127630 A | * | 5/1996 |
| JP | 11-038633 | | 2/1999 |
| JP | 2002-274004 A | | 9/2002 |
| JP | 2004-318053 A | | 11/2004 |
| JP | 2006-264304 A | | 10/2006 |

OTHER PUBLICATIONS

RN 100-97-0, Registry file from ACS on STN, entered Nov. 16, 1984, two pages.*
English translation of JP, 08-127630, A (1996) from machine translation from AIPN Japan Patent Office National Center for Industrial Property Information and Training, generated Apr. 19, 2010, 5 pages.*
RN 6674-22-2, Registry file from ACS on STN, entered Nov. 16, 1984, one page.*
AN 1985:479531, file CAPLUS from ACS on STN, entered Sep. 7, 1985, abstract of SU 1150614, one page.*
"Onium compounds" IUPAC Conpendium of Chemical Terminology, snd Edition (1997) obtained from online from http://old.iupac.org/goldbook/O04291.pdf, one page.*
Crivello, J.V. "Cationic polymerization—Iodonium ans sulfonium salt photoinitiators", Advances in Polymer Science, 1984, vol. 62/1984, pp. 1-48.*

* cited by examiner

*Primary Examiner* — Cynthia Hamilton
(74) *Attorney, Agent, or Firm* — Sughrue Mion, PLLC

(57) ABSTRACT

A curable composition in which polymerization inhibition due to oxygen is suppressed and which may be cured with high sensitivity by exposure to laser light or the like is provided. The curable composition includes: a polymerizable compound having an ethylenically unsaturated bond; a binder; a radical polymerization initiator; and at least one specific amine compound. Also provided is an image forming material and a negative-working planographic printing plate precursor including the curable composition.

16 Claims, No Drawings

CURABLE COMPOSITION, IMAGE FORMING MATERIAL, AND PLANOGRAPHIC PRINTING PLATE PRECURSOR

CROSS-REFERENCE TO RELATED APPLICATION

This application claims priority under 35 USC 119 from Japanese Patent Application No. 2007-252532, the disclosure of which is incorporated by reference.

BACKGROUND OF THE INVENTION

1. Technical Field

The present invention relates to a curable composition which may be cured with high sensitivity by the application of energy, such as exposure to laser light, an image forming material which includes the curable composition in a recording layer and which allows direct drawing thereon with high sensitivity by a laser beam, and a negative-working planographic printing plate precursor in which the image forming material is used.

2. Related Art

Conventionally, a PS plate having a lipophilic photosensitive resin layer provided on a hydrophilic support has been widely used as a planographic printing plate precursor, and a desired printing plate is obtained by a plate-making method which usually involves mask exposure (surface exposure) via a lithographic film and then removal of non-image regions by dissolving. In recent years, digitalization techniques which involve electronic processing, accumulation and output of image information with a computer have been spreading. A wide variety of new image output systems compatible with such digitalization techniques have come to be practically used. As a result, there has been demand for computer-to-plate (CTP) techniques of producing a printing plate directly by scanning a highly directional light, such as laser light, according to digitalized image information, without employing a lithographic film. It has been a critical technical issue to provide a planographic printing plate precursor suitable for these techniques.

As a negative-working planographic printing plate precursor capable of such scanning exposure to light, a planographic printing plate precursor has been proposed which includes, on a hydrophilic support, a photopolymerizable photosensitive layer including a photopolymerization initiator, an addition polymerizable ethylenically unsaturated compound, and a binder polymer having a specifically structured repeating unit which is soluble in an alkali developer, and, according to necessity, a oxygen blocking protective layer (see, for example, Japanese Patent Application Laid-Open (JP-A) No. 2004-318053). In addition, a negative-working planographic printing plate precursor has been proposed which includes a photopolymerizable photosensitive layer and an oxygen blocking protective layer including an inorganic laminar compound, provided on a hydrophilic support (see, for example, JP-A No. 11-38633).

In the negative-working planographic printing plate precursor having a photopolymerization curable photosensitive layer, a radical polymerization reaction is inhibited in the presence of oxygen, which is likely to cause problems such as reductions in sensitivity and changes in sensitivity due to changes in oxygen concentration. In general, in order to prevent the occurrence of such problems, an oxygen-blocking protective layer is provided on the surface of the photosensitive layer, or the surface of the photosensitive layer is covered with a covering sheet as described above. However, the formation of the protective layer or the covering sheet increases the number of processes, and moreover, the protective layer and the covering sheet need to be thoroughly removed upon producing a plate from the planographic printing plate precursor, causing problems such as an increase in the number of processes, or an increase in the amount of developer used.

Therefore, attempts have been made to develop a negative photosensitive composition which does not require a protective layer, such as increasing the sensitivity of a recording layer. For example, attempts have been made to improve storage stability by adding an amine compound to quench oxygen, and techniques inhibiting the obstruction of polymerization due to oxygen, and the like, have also been proposed (for example, Japanese Patent Application Laid-Open (JP-A) No. 2002-274004 and JP-A No. 2006-264304). However, even when an amine compound such as the above is used, it has not been possible in practice to obtain curing properties which are completely problem-free. Moreover, a low molecular weight amine compound in particular has posed problems with respect to handling properties, in that a low molecular weight amine compound is likely to volatilize while heating, or the low molecular weight amine compound emits an odor at the time of the formation of a cured coating film, and so on.

Therefore, a curable composition has been demanded which is cured with high sensitivity by exposure to light and allows problem-free handling in practice.

SUMMARY OF THE INVENTION

The present invention addresses the existing problems with the conventional technologies, and provides the following.

That is, according to the invention, a curable composition in which polymerization inhibition due to oxygen is suppressed and which may be cured with high sensitivity by application of energy, such as exposure to laser light, is provided.

Further, according to the invention, an image forming material including the curable composition in a recording layer is provided which allows forming images with high sensitivity, and a negative-working planographic printing plate precursor which includes the image forming material is provided.

According to a first aspect of the invention, a curable composition includes:

a polymerizable compound having an ethylenically unsaturated bond;

a binder;

a radical polymerization initiator; and at least one amine compound represented by Formula (I), Formula (II), or Formula (III):

(I)

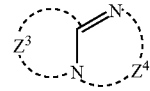

(II)

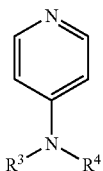

wherein, in Formulae (I) to (III), $R^1$ and $R^2$ each independently represent a hydrogen atom, an alkyl group, a cycloalkyl group, an aralkyl group, an aryl group, or an acyl group; $R^3$ and $R^4$ each independently represent a hydrogen atom, an alkyl group, a cycloalkyl group, an aralkyl group, or an aryl group; $Z^1$ to $Z^4$ each independently represent an atomic group that forms a monocyclic or polycyclic structure with the amino group(s); and $Z^1$ and $Z^2$ may be combined with each other to form a ring and $Z^3$ and $Z^4$ may be combined with each other to form a ring.

According to a second aspect of the invention, an image forming material includes:

a support; and a recording layer provided on the support, the recording layer including a curable composition including:

a polymerizable compound having an ethylenically unsaturated bond;

a binder;

a radical polymerization initiator; and at least one amine compound represented by Formula (I), Formula (II), or Formula (III):

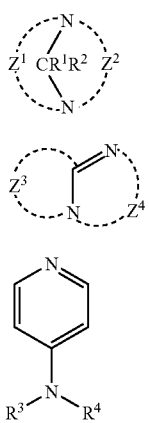

wherein, in Formulae (I) to (III), $R^1$ and $R^2$ each independently represent a hydrogen atom, an alkyl group, a cycloalkyl group, an aralkyl group, an aryl group, or an acyl group; $R^3$ and $R^4$ each independently represent a hydrogen atom, an alkyl group, a cycloalkyl group, an aralkyl group, or an aryl group; $Z^1$ to $Z^4$ each independently represent an atomic group that forms a monocyclic or polycyclic structure with the amino group(s); and $Z^1$ and $Z^2$ may be combined with each other to form a ring and $Z^3$ and $Z^4$ may be combined with each other to form a ring.

According to a third aspect of the invention, a planographic printing plate precursor includes the image forming material.

DETAILED DESCRIPTION OF THE INVENTION

According to an exemplary embodiment of the invention, a curable composition in which polymerization inhibition due to oxygen is suppressed and which may be cured with high sensitivity by application of energy, such as exposure to laser light, is provided.

Further, according to another exemplary embodiment of the invention, an image forming material including the curable composition in a recording layer is provided which allows forming images with high sensitivity. According to yet another exemplary embodiment of the invention, a negative-working planographic printing plate precursor which includes the image forming material is provided.

Curable Composition

The curable composition of the present invention includes a polymerizable compound (A), an alkali soluble binder (B), a polymerization initiator (C), and at least one amine compound (D) represented by Formula (I), Formula (II), or Formula (III), and an infrared absorbing agent, and other components as necessary.

The curable composition of the present invention may be cured by polymerization of a polymerizable compound due to an initiation species such as a radical generated from a polymerization initiator by the application of energy, such as exposure to light.

Hereinafter, each component included in the curable composition of the present invention will be described. First, the amine compound represented by Formula (I), Formula (II), or Formula (III), which is a characteristic component of the invention, (hereinafter sometimes referred to as "a specific amine compound") will be described.

Amine Compound (D) Represented by Formula (I), Formula (II), or Formula (III)

In the present invention, a specific amine compound including at least one ring structure and at least one amine structure in a single molecule, which is shown below, is used as an additive.

Examples of such a specific amine compound include compounds represented by Formula (I), Formula (II), or Formula (III).

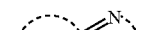
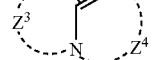

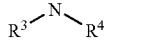

In Formulae (I) to (III), $R^1$ and $R^2$ each independently represent a hydrogen atom, an alkyl group, a cycloalkyl group, an aralkyl group, an aryl group, or an acyl group; $R^3$ and $R^4$ each independently represent a hydrogen atom, an alkyl group, a cycloalkyl group, an aralkyl group, or an aryl group; and $Z^1$ to $Z^4$ each independently represent an atomic group which forms a monocyclic or polycyclic structure with the amino group(s), wherein $Z^1$ and $Z^2$ may be combined with each other to form a ring and $Z^3$ and $Z^4$ may be combined with each other to form a ring.

First, an amine compound represented by Formula (I) will be described.

(I)

In Formula (I), $R^1$ and $R^2$ each independently represent a hydrogen atom, an alkyl group, a cycloalkyl group, an aralkyl group, an aryl group, or an acyl group.

When $R^1$ or $R^2$ represents an alkyl group, the alkyl group may have a straight chain structure or may have a branched structure. For example, an alkyl group having 1 to 20 carbon atoms can be used. The number of carbon atoms of the alkyl group is preferably 1 to 10, and more preferably 1 to 6. Preferable specific examples thereof include a methyl group, an ethyl group, and an isopropyl group.

When $R^1$ or $R^2$ represents a cycloalkyl group, cycloalkyl groups having 3 to 20 carbon atoms can be used, for example, as the cycloalkyl group. Especially, cycloalkyl groups having 3 to 10 carbon atoms are preferable and cycloalkyl groups having 3 to 6 carbon atoms are more preferable.

When $R^1$ or $R^2$ represents an aralkyl group, examples of the aralkyl group include aralkyl groups having 7 to 20 carbon atoms. Especially, aralkyl groups having 7 to 8 carbon atoms are preferable.

When $R^1$ or $R^2$ represents an aryl group, examples of the aryl group include aryl groups having 6 to 20 carbon atoms. Especially, aryl groups having 6 to 8 carbon atoms are preferable.

When $R^1$ or $R^2$ represents any one of the substituents other than a hydrogen atom, the substituent represented by $R^1$ or $R^2$ may itself have an optional substituent. Examples of the optional substituent that can be introduced include an alkyl group, a cycloalkyl group, an aralkyl group, an aryl group, an acyl group, a hydroxyl group, an amino group, a halogen group, a carboxyl group, a carbonyl group, a sulfonyl group, and a nitro group.

Preferable specific examples of the substituent represented by $R^1$ or $R^2$ include a hydrogen atom, a methyl group, an ethyl group, an isopropyl group, a hydroxyl group, and an amino group. Moreover, $R^1$ and $R^2$ may be the same as or different from each other.

$Z^1$ and $Z^2$ are not limited insofar as $Z^1$ and $Z^2$ each independently represent an atomic group which forms a monocyclic or polycyclic structure with the amino group(s). Moreover, $Z^1$ and $Z^2$ may be combined with each other to form a ring.

The number of carbon atoms of $Z^1$ or $Z^2$ is, for example, 2 to 10. Alkylene groups having 2, 3, or 4 carbon atoms are preferable and alkylene groups having 2 or 3 carbon atoms are more preferable.

Moreover, the ring structure may include a hetero atom, such as N, O, or S.

$Z^1$ and $Z^2$ may each form a monocyclic or polycyclic structure with the amino group(s). In the ring structure, a substituent may be further included and another ring may be condensed.

Examples of the substituent which can be introduced into the ring structure include an alkyl group, a cycloalkyl group, an aralkyl group, an aryl group, an acyl group, a hydroxyl group, an amino group, a halogen group, a carboxyl group, a carbonyl group, a sulfonyl group, and a nitro group.

Among the specific amine compounds (D) that are particularly preferably used in the present invention, compounds represented by Formulae (I-1) to (I-5) are shown below as examples of the compound represented by Formula (I). However, the present invention is not limited to the compounds.

(I-1)

(I-2)

(I-3)

(I-4)

(I-5)

(II)

Next, the amino compound represented by Formula (II) will be described.

$Z^3$ and $Z^4$ in Formula (II) are not limited insofar as $Z^3$ and $Z^4$ each independently represent an atomic group which forms a monocyclic or polycyclic structure with the amino group(s). Moreover, $Z^3$ and $Z^4$ may be combined with each other to form a ring.

The number of carbon atoms of $Z^3$ or $Z^4$ is, for example, 2 to 10. Alkylene groups having 2, 3, or 4 carbon atoms are preferable and alkylene groups having 2 or 3 carbon atoms are more preferable.

Moreover, the ring structure may include a hetero atom, such as N, O, or S.

$Z^3$ and $Z^4$ form a monocyclic or polycyclic structure with the amino group(s). In the ring structure, a substituent may be further included and another ring may be condensed.

Examples of the substituent which can be introduced into the ring structure include an alkyl group, a cycloalkyl group, an aralkyl group, an aryl group, an acyl group, a hydroxyl group, an amino group, a halogen group, a carboxyl group, a carbonyl group, a sulfonyl group, and a nitro group.

Among the specific amine compounds (D) that are particularly preferably used in the present invention, compounds represented by Formulae (II-1) to (II-5) are shown below as examples of the compound represented by Formula (II). However, the present invention is not limited to the compounds.

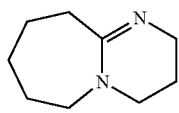

(II-1)

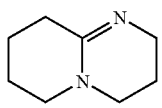

(II-2)

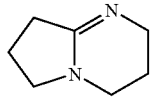

(II-3)

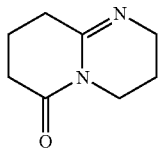

(II-4)

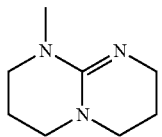

(II-5)

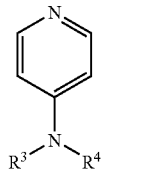

(III)

Next, the amino compound represented by Formula (III) will be described.

In Formula (III), $R^3$ and $R^4$ each independently represent a hydrogen atom, an alkyl group, a cycloalkyl group, an aralkyl group, or an aryl group.

When $R^3$ or $R^4$ represents an alkyl group, the alkyl group may have a straight chain structure or may have a branched structure. For example, alkyl groups having 1 to 20 carbon atoms can be used. The number of carbon atoms is preferably 1 to 10, and more preferably is 1 to 6. Preferable specific examples thereof include a methyl group, an ethyl group, an isopropyl group, and a butyl group.

When $R^3$ or $R^4$ represents a cycloalkyl group, cycloalkyl groups having 3 to 20 carbon atoms can be used, for example, as the cycloalkyl group. Especially, the number of carbon atoms is preferably 3 to 10, and more preferably 3 to 6.

When $R^3$ or $R^4$ represents an aralkyl group, examples of the aralkyl group include aralkyl groups having 7 to 20 carbon atoms. Especially, aralkyl groups having 7 to 8 carbon atoms are preferable.

Moreover, when $R^3$ or $R^4$ represents an aryl group, examples of the aryl group include aryl groups having 6 to 20 carbon atoms. Especially, aryl groups having 6 to 8 carbon atoms are preferable.

When $R^3$ or $R^4$ represents any one of the substituents other than a hydrogen atom, the substituent represented by $R^3$ or $R^4$ may itself have an optional substituent. Examples of the optional substituent that can be introduced include an alkyl group, a cycloalkyl group, an aralkyl group, an aryl group, an acyl group, a hydroxyl group, an amino group, a halogen group, a carboxyl group, a carbonyl group, a sulfonyl group, and a nitro group.

Among these, preferable specific examples of the substituent represented $R^3$ or $R^4$ include a hydrogen atom, a methyl group, an ethyl group, an isopropyl group, a hydroxyl group, and an amino group. Moreover, $R^1$ and $R^2$ may be the same as or different from each other.

Among the specific amine compounds (D) that are particularly preferably used in the present invention, compounds represented by Formulae (III-1) to (III-4) are shown below as specific examples of the compound represented by Formula (III). However, the present invention is not limited to the compounds.

(III-1)

(III-2)

(III-3)

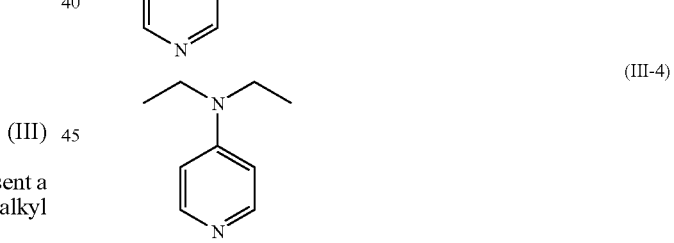

(III-4)

Among the specific amine compounds (D), preferable examples thereof usable for the curable composition of the present invention include hexamethylenetetramine, 1,8-diazabicyclo(5,4,0)-7-undecene, 7-methyl-1,5,7-tri-azabicyclo (4,4,0)dec-5-ene, 4-di(methylamino)pyridine, and 4-(methylamino)pyridine. Particularly, when the curable composition is used for a recording layer of a planographic printing plate precursor, the specific amine compound (D) is preferably hexamethylenetetramine or 4-di(methylamino) pyridine.

When the specific amine compounds (D) are lost by volatilization at the time of film formation using a curable composition, effects produced by the addition thereof may be insufficient. Moreover, there is a concern about generation of an odor of the amine compound. Therefore, upon consideration of desirable effects and volatility in practice, specific amine compounds (D) having a molecular weight of from about 90 to about 1500 can be used, with the molecular weight being preferably in the range of from 100 to 1500, and more preferably in the range of from 120 to 1500.

The curable composition of the present invention may include only a single species of the specific amine compounds or may include two or more species of the specific amine compounds in combination. When two or more species of the specific amine compounds are included in the curable composition, the compounds represented by Formula (I) which are different from each other may be combined or two or more species of compounds suitably selected from the compounds represented by Formulae (I) to (III) may be combined.

In the relationship with the polymerizable compound (A) having an ethylenically unsaturated bond which co-exists in the curable composition of the present invention, the amount of the specific amine compound(s) in the curable composition of the present invention may be in the range of from 1 to 100 parts by mass with respect to 100 parts by mass of the polymerizable compound (A). Especially, from the viewpoint of maintaining the printing performance, the amount of the specific amine compound(s) is/are preferably from 1 to 40 parts by mass, and more preferably from 1 to 20 parts by mass.

Moreover, the addition amount of the specific amine compound (D) relative to the curable composition is preferably in the range of from 0.1 to 30% by mass, and more preferably in the range of from 0.1 to 10% by mass, with respect to the solid content of the curable composition.

(A) Polymerizable Compound having an Ethylenically Unsaturated Bond

A polymerizable compound (which will be referred to as an addition polymerizable compound hereinafter) including an ethylenically unsaturated bond (A) in the present invention is a polymerizable compound including at least one ethylenically unsaturated double bond, and is selected from compounds having at least one terminal ethylenically unsaturated bond, and preferably selected from compounds having two or more terminal ethylenically unsaturated bonds. Such a compound group is widely known in the industrial field, and can be used in the present invention without limitation. These compounds may take chemical forms such as monomer, prepolymer (dimer, trimer, or oligomer), and mixture thereof, and copolymers thereof. Examples of the monomer and the copolymer therefrom include unsaturated carboxylic acids (e.g., acrylic acid, methacrylic acid, itaconic acid, crotonic acid, isocrotonic acid, or maleic acid), esters thereof, and amides thereof. Preferable examples thereof include esters each made form an unsaturated carboxylic acid and an aliphatic polyhydric alcohol compound, and amides each made from an unsaturated carboxylic acid and an aliphatic polyhydric amine compound. Other preferable examples thereof include: addition reaction products each made from (i) an unsaturated carboxylic acid ester or amide having a nucleophilic substituent such as a hydroxyl, amino or mercapto group, and (ii) a monofunctional or polyfunctional isocyanate or an epoxy; and dehydration condensation reaction products each made from (i) an unsaturated carboxylic acid ester or amide having a nucleophilic substituent such as a hydroxyl, amino or mercapto group, and (ii) a monofunctional or polyfunctional carboxylic acid. Further preferable examples thereof include: addition reaction products each made from an unsaturated carboxylic acid ester or amide having an electrophilic substituent such as an isocyanate or epoxy group, and a monofunctional or polyfunctional alcohol, amine or thiol; and substituent reaction products each made from an unsaturated carboxylic acid ester or amide having a leaving group such as a halogen or tosyloxy group, and a monofunctional or polyfunctional alcohol, amine, or thiol. In addition, other examples thereof include an unsaturated phosphonic acid, styrene, vinyl ether, and compounds obtained by substituting the unsaturated carboxylic acids in the above compounds with an unsaturated phosphonic acid, styrene, vinyl ether, or the like.

Specific examples of the ester monomers between aliphatic polyvalent alcohols and unsaturated carboxylic acids include:

acrylic esters such as ethylene glycol diacrylate, triethylene glycol diacrylate, 1,3-butanediol diacrylate, tetramethylene glycol diacrylate, propylene glycol diacrylate, neopentyl glycol diacrylate, trimethylol propane triacrylate, trimethylol propane tri(acryloyloxypropyl)ether, trimethylol ethane triacrylate, hexane diol diacrylate, 1,4-cyclohexane diol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, and polyester acrylate oligomers;

methacrylic esters such as tetramethylene glycol dimethacrylate, triethylene glycol dimethacrylate, neopentyl glycol dimethacrylate, trimethylol propane trimethacrylate, trimethylol ethane trimethacrylate, ethylene glycol dimethacrylate, 1,3-butanediol dimethacrylate, hexane diol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethyl methane, and bis[p-(methacryloxyethoxy)phenyl]dimethyl methane;

itaconic esters such as ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate;

crotonic esters such as ethylene glycol dicrotonate, tetramethylene glycol dicrotonate, pentaerythritol dicrotonate, and sorbitol tetradicrotonate;

isocrotonic esters such as ethylene glycol diisocrotonate, pentaerythritol diisocrotonate, and sorbitol tetraisocrotonate; and maleic esters such as ethylene glycol dimaleate, triethylene glycol dimaleate, pentaerythritol dimaleate, and sorbitol tetramaleate.

Other examples of the esters include aliphatic alcohol esters described in JP-B No. 46-27926, JP-B No. 51-47334 and JP-A No. 57-196231, those having an aromatic skeleton described in JP-A No. 59-5240, JP-A No. 59-5241 and JP-A No. 2-226149, and those having an amino group described in JP-A No. 1-165613. In an embodiment, a mixture of such ester monomers is used.

Examples of monomers of the amides between aliphatic polyvalent amine compounds and unsaturated carboxylic acids include methylene bis-acrylamide, methylene bis-methacrylamide, 1,6-hexamethylene bis-acrylamide, 1,6-hexamethylene bis-methacrylamide, diethylene triamine trisacrylamide, xylylene bisacrylamide, and xylylene bis-methacrylamide.

Preferable examples of other amide monomers include those having a cyclohexylene structure described in JP-B No. 54-21726.

In addition, urethane addition-polymerizable compounds produced by use of addition reaction between an isocyanate and a hydroxyl group are also preferable, and typical examples thereof include the vinylurethane compounds including two or more polymerizable vinyl groups which are prepared by addition-reacting a hydrogen group-including vinyl monomer represented by the following formula (i) to a polyisocyanate compound having two or more isocyanate groups in the molecule, which are described in JP-B No. 48-41708.

$$CH_2=C(R^4)COOCH_2CH(R^5)OH \qquad (i)$$

wherein in Formula (i), $R^4$ and $R^5$ each represent H or $CH_3$.

Further, urethane acrylates as described in JP-A No. 51-37193 and JP-B Nos. 2-32293 and 2-16765 and urethane compounds having an ethylene oxide skeleton as described in JP-B Nos. 58-49860, 56-17654, 62-39417 and 62-39418 may also be suitably used.

Furthermore, when an addition-polymerizable compound having an amino structure or a sulfide structure in the molecule like those described in JP-A Nos. 63-277653, 63-260909 and 1-105238 is used, a photopolymerizable composition that is excellent in photosensitizing speed can be obtained.

Other examples thereof include multifunctional acrylates and methacrylates such as polyester acrylates and epoxy acrylates obtained by reacting epoxy resin with (meth)acrylic acid, as described in JP-A No. 48-64183, JP-B No. 49-43191 and JP-B 52-30490. Specific unsaturated compounds described in JP-B No. 46-43946, JP-B No. 1-40337 and JP-B No. 1-40336 and vinyl phosphonic acid compounds described in JP-A No. 2-25493 can also be mentioned. In some cases, a structure including a perfluoroalkyl group described in JP-A No. 61-22048 is preferably used. Photocurable monomers and oligomers described in the Journal of Japanese Adhesive Society, vol. 20, No. 7, pp. 300-308 (1984) may also be used.

The structure, and particular methods of use (such as using a compound independently or in combination with other compounds) of the addition polymerizable compounds may be selected arbitrarily in accordance with the desired properties of a final polymerizable composition. When the polymerizable composition of the invention is used for, for example, a recording layer (i.e., photosensitive layer) of a negative planographic printing plate precursor, the selection of compound and/or method is made in consideration of achieving a structure including a large amount of unsaturated groups per molecule, which is preferable due to higher photosensitizing speed. In this respect, in many cases, a bifunctional or higher structure is preferable. From the viewpoint of increasing the strength of the resultant image portion (i.e., the cured film), a compound having a trifunctional or higher structure is preferable. It is also effective to use a combination of compounds having different numbers of functional groups and/or different polymerizable groups (such as an acrylic acid ester, a methacrylic acid ester, a styrene based compound, and a vinyl ether compound) for adjusting both of the photosensitivity and the strength. Compounds having a large molecular weight and compounds having a high hydrophobicity are excellent in photosensitizing speed or film strength, but may not be preferable from the viewpoints of developing speed or precipitation in a developer. The selection of the addition polymerizable compound and the method of use thereof are important factors also for compatibility or dispersibility of the compound with or in the other components (such as the binder polymer (B), the radical polymerization initiator (C), or a colorant) in the photosensitive layer. Compatibility may be improved by using, for example, a compound in a low-purity grade, or a combination of two or more of the compounds.

In the present invention, one of the polymerizable compounds (A) including an ethylenically unsaturated bond of the invention may be used alone, or two or more thereof may be used in combination.

In the curable composition of the invention, the amount of the polymerizable compound (A) including an ethylenically unsaturated bond is preferably from 5 to 80% by mass, and more preferably from 25 to 75% by mass, with respect to the nonvolatile components in the curable composition.

The curable composition of the invention may be used for a recording layer (photosensitive layer) of a planographic printing plate precursor, as will be detailed below. When the composition is applied to such an application, the polymerizable compound (A) including an ethylenically unsaturated bond, which has the specific structure, may be selected to improve the adhesive property between the recording layer and the support, overcoat layer, or the like of the planographic printing plate precursor. The blend ratio of the polymerizable compound (A) including an ethylenically unsaturated bond in the photosensitive layer is preferably large from the viewpoint of the sensitivity. However, when the blend ratio is too large, the following problems may occur: an undesired phase separation of the composition; problems concerning the production process caused by tackiness of the photosensitive layer (such as production failure due to the adhesion of the components of the photosensitive layer or the transfer of the components); precipitation of the composition from a developer; and the like.

From such viewpoints, the amount of the polymerizable compound (A) including an ethylenically unsaturated bond, which is included in the photosensitive layer of a planographic printing plate precursor, is preferably from 5 to 80% by mass, and more preferably from 25 to 75% by mass, with respect to nonvolatile components in the photosensitive layer.

Besides, regarding the use manner of the polymerizable compound (A) including an ethylenically unsaturated bond, an appropriate structure, an appropriate blend, and the addition amount thereof may be selected as appropriate from the viewpoints of the degree of polymerization-inhibition due to oxygen, the resolution, the fog resistance, a change in the refractive index, the surface tackiness of the photosensitive layer, and the like. In exemplary embodiments, the polymerizable compound (A) including an ethylenically unsaturated bond may not be incorporated into the photosensitive layer itself, and the polymerizable compound (A) may be incorporated into a layer adjacent to the photosensitive layer by adopting a layer structure or a coating method, such as undercoating or overcoating.

Binder Polymer (B)

The curable composition of the invention includes at least one binder polymer (B). Thus, when the composition is applied to the photosensitive layer of a planographic printing plate precursor in an exemplary embodiment, the film properties of the photosensitive layer formed may be improved.

The binder polymer (B) may be a linear organic polymer. The linear organic polymer may be any known linear organic polymer. The polymer is preferably selected from linear organic polymers which are soluble or swellable in water or weak alkaline water in order to achieve development with water or weak alkaline water. The linear organic polymers may be selected and used according to not only properties as a film forming agent, but also the kind of the developer to be used, such as water, weak alkaline water, or an organic solvent.

Examples of the binder polymer include acrylic resins, polyvinyl acetal resins, polyurethane resins, polyamide resins, epoxy resins, methacrylic resins, styrene resins, and polyester resins. Of those, acrylic resins and polyurethane resins are preferable.

Furthermore, the binder polymer may have crosslinking property to improve the film strength of the image portion to be obtained.

To impart the crosslinking property to the binder polymer, it is advisable to introduce a crosslinkable functional group such as an ethylenically unsaturated bond into the main chain of a polymer or a side chain thereof. The crosslinkable functional group may be introduced by copolymerization or polymer reaction.

The term "crosslinkable group" as used herein refers to a group that makes molecules of the binder polymer to be crosslinked with each other during radical polymerization reaction that occurs in the photosensitive layer when the planographic printing plate precursor is exposed to light. The crosslinkable group is not particularly limited as far as the group has such a function. Examples of the crosslinkable group include functional groups capable of undergoing addition polymerization reaction, such as an ethylenically unsaturated bond group, an amino group, or an epoxy group. The crosslinkable group may be a functional group capable of generating radicals by irradiation with light, and examples thereof include thiol groups, halogen groups, and onium salt structures. Of these groups, ethylenically unsaturated bond groups are preferable. Particularly preferable are functional groups represented by the following Formulae (1) to (3).

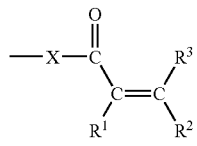

Formula (1)

In Formula (1), $R^1$ to $R^3$ each independently represent a hydrogen atom or a monovalent substituent. $R^1$ preferably represents a hydrogen atom, or a substituted or unsubstituted alkyl group. $R^1$ more preferably represents a hydrogen atom or a methyl group from the viewpoint of high radical reactivity. $R^2$ and $R^3$ each independently represent a hydrogen atom, a halogen atom, an amino group, a carboxyl group, an alkoxycarbonyl group, a sulfo group, a nitro group, a cyano group, a substituted or unsubstituted alkyl group, a substituted or unsubstituted aryl group, a substituted or unsubstituted alkoxy group, a substituted or unsubstituted aryloxy group, a substituted or unsubstituted alkylamino group, a substituted or unsubstituted arylamino group, a substituted or unsubstituted alkylsulfonyl group, or a substituted or unsubstituted arylsulfonyl group. From the viewpoint of high radical reactivity, $R^2$ and $R^3$ each preferably represent a hydrogen atom, a carboxyl group, an alkoxycarbonyl group, a substituted or unsubstituted alky group, or a substituted or unsubstituted aryl group.

X represents an oxygen atom, a sulfur atom, or —N($R^{12}$)— wherein $R^{12}$ represents a hydrogen atom or a monovalent organic group. Examples of $R^{12}$ include substituted or unsubstituted alkyl groups. $R^{12}$ preferably represents a hydrogen atom, a methyl group, an ethyl group, or an isopropyl group from the viewpoint of high radical reactivity.

When any of $R^1$ to $R^3$ is an alkyl group, aryl group, or the like, examples of the substituent which may be introduced thereto include an alkyl group, an alkenyl group, an alkynyl group, an aryl group, an alkoxy group, an aryloxy group, a halogen atom, an amino group, an alkylamino group, an arylamino group, a carboxyl group, an alkoxycarbonyl group, a sulfo group, a nitro group, a cyano group, an amide group, an alkylsulfonyl group, and an arylsulfonyl group.

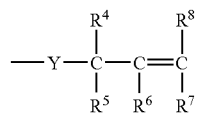

Formula (2)

In Formula (2), $R^4$ to $R^8$ each independently represent a hydrogen atom, a halogen atom, or a monovalent substituent. Preferable examples thereof include a hydrogen atom, a halogen atom, an amino group, a dialkylamino group, a carboxyl group, an alkoxycarbonyl group, a sulfo group, a nitro group, a cyano group, a substituted or unsubstituted alkyl group, a substituted or unsubstituted aryl group, a substituted or unsubstituted alkoxy group, a substituted or unsubstituted aryloxy group, a substituted or unsubstituted alkylamino group, a substituted or unsubstituted arylamino group, a substituted or unsubstituted alkylsulfonyl group, and a substituted or unsubstituted arylsulfonyl group. Particularly preferable are a hydrogen atom, a carboxyl group, an alkoxycarbonyl group, a substituted or unsubstituted alkyl group, and a substituted or unsubstituted aryl group.

When any of $R^4$ to $R^8$ is an alkyl group, the substituent which may be introduced thereto is the same as in the case of Formula (1). Y represents an oxygen or sulfur atom, or —N($R^{12}$)— wherein $R^{12}$ has the same definition as $R^{12}$ in Formula (1). Preferable examples of $R^{12}$ in Formula (2) are also the same as those in Formula (1).

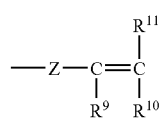

Formula (3)

In Formula (3), $R^9$ represents a hydrogen atom or a monovalent organic group, and preferably represents a hydrogen atom, or a substituted or unsubstituted alkyl group. In particular, $R^9$ preferably represents a hydrogen atom or a methyl group from the viewpoint of high radical reactivity. $R^{10}$ and $R^{11}$ each independently represent a hydrogen atom or a monovalent substituent, and preferably a hydrogen atom, a halogen atom, an amino group, a dialkylamino group, a carboxyl group, an alkoxycarbonyl group, a sulfo group, a nitro group, a cyano group, a substituted or unsubstituted alkyl group, a substituted or unsubstituted aryl group, a substituted or unsubstituted alkoxy group, a substituted or unsubstituted aryloxy group, a substituted or unsubstituted alkylamino group, a substituted or unsubstituted arylamino group, a substituted or unsubstituted alkylsulfonyl group, or a substituted or unsubstituted arylsulfonyl group. In particular, it is preferable that $R^{10}$ and $R^{11}$ each independently represent a hydrogen atom, a carboxyl group, an alkoxycarbonyl group, a substituted or unsubstituted alkyl group, or a substituted or unsubstituted aryl group from the viewpoint of high radical reactivity.

When any of $R^9$ to $R^{11}$ is an alkyl group, the substituent which may be introduced thereto is the same as in the case of Formula (1). Z represents an oxygen or sulfur atom, —N($R^{13}$)— wherein $R^{13}$ is selected from substituted or unsubstituted alkyl groups and the like, or a substituted or unsubstituted phenylene group. In particular, it is preferable that $R^{13}$ represents a methyl group, an ethyl group, or an isopropyl group from the viewpoint of high radical reactivity.

Of the above-mentioned binder polymers, more preferable are (meth)acrylic acid copolymer having, in a side chain thereof, a crosslinkable group, and polyurethane.

The binder polymer having crosslinking property may be cured as follows: for example, free radicals (polymerization initiating radicals or propagating radials in the polymerization step of the polymerizable compound) are added to the crosslinkable group of the binder polymer, and addition polymerization is attained, directly or through polymerization chains of the polymerizable compound, between molecules of the binder polymer, so that linkages are formed between the polymer molecules. Alternatively, the binder polymer may be cured as follows: atoms (for example, hydrogen atoms on the carbon atoms adjacent to the functional crosslinkable groups) in the polymer are abstracted by free radicals, so as to generate polymer radicals, and the polymer radicals are bonded to each other so that crosslinkages are formed between the polymer molecules.

The amount of the crosslinkable groups (i.e., the amount of radical-polymerizable unsaturated double bonds, which is determined by iodometric titration) in the binder polymer is preferably from 0.1 to 10.0 mmol, more preferably from 1.0 to 7.0 mmol, and most preferably from 2.0 to 5.5 mmol per one gram of the binder polymer.

Alkali-Soluble Binder Polymer

When development treatment for removing uncured regions is conducted with an alkaline developer, the binder polymer needs to dissolve in the alkaline developer; thus, an organic polymer soluble or swellable in alkaline water is preferably used. In the case of using, in particular, an alkaline developer having a pH of 10 or more, an alkali-soluble binder is preferably used. In the case of conducting development with water, a water-soluble polymer may be used.

For example, when a water-soluble straight-chain organic polymer is used as the alkali-soluble binder polymer, development with water is possible when an image is developed from the film formed by applying the curable composition. The polymer may be a linear organic polymer, examples of which include radical polymers having carboxylic acid groups in side chains thereof, such as radical polymers described in JP-A Nos. 59-44615, 54-92723, 59-53836, and 59-71048, Japanese Patent Application Publication (JP-B) Nos. 54-34327, 58-12577, and 54-25957, and the like. Specifically, examples of the radical polymers include resins each obtained by homopolymerizing or copolymerizing a monomer having a carboxyl group; resins each obtained by homopolymerizing or copolymerizing a monomer having an acid anhydride group, and then subjecting acid anhydride units of the resultant polymer to hydrolysis, half-esterification, or half-amidation; and epoxy acrylates each obtained by modifying an epoxy resin with an unsaturated monocarboxylic acid and an acid anhydride. Examples of the monomer having a carboxyl group include acrylic acid, methacrylic acid, itaconic acid, crotonic acid, maleic acid, fumaric acid, and 4-carboxylstyrene. Examples of the monomer having an acid anhydride group include maleic anhydride.

Another example of the alkali-soluble binder polymer is an acidic cellulose derivative having, in a side chain thereof, a carboxylic acid group. A further useful example thereof is a product wherein a cyclic acid anhydride is added to a polymer having a hydroxyl group.

When the alkali-soluble resin is a copolymer, the copolymer may be formed by copolymerization of monomers including one or more other monomers than the above-mentioned monomers. Examples of such other monomers include compounds described in the following items (1) to (12):

(1) acrylic esters and methacrylic acid esters having an aliphatic hydroxy group such as 2-hydroxyethyl acrylate, 2-hydroxypropyl acrylate, 3-hydroxypropyl acrylate, 4-hydroxybutyl acrylate, 2-hydroxyethyl methacrylate, 2-hydroxypropyl methacrylate, 3-hydroxypropyl methacrylate, and 4-hydroxybutyl methacrylate;

(2) alkyl acrylates such as methyl acrylate, ethyl acrylate, propyl acrylate, butyl acrylate, isobutyl acrylate, amyl acrylate, hexyl acrylate, 2-ethylhexyl acrylate, octyl acrylate, benzyl acrylate, 2-chloroethyl acrylate, glycidyl acrylate, 3,4-epoxycyclohexylmethyl acrylate, vinyl acrylate, 2-phenylvinyl acrylate, 1-propenyl acrylate, allyl acrylate, 2-allyloxyethyl acrylate, and propargyl acrylate;

(3) alkyl methacrylates such as methyl methacrylate, ethyl methacrylate, propyl methacrylate, butyl methacrylate, isobutyl methacrylate, amyl methacrylate, hexyl methacrylate, 2-ethylhexyl methacrylate, cyclohexyl methacrylate, benzyl methacrylate, 2-chloroethyl methacrylate, glycidyl methacrylate, 3,4-epoxycyclohexylmethyl methacrylate, vinyl methacrylate, 2-phenylvinyl methacrylate, 1-propenyl methacrylate, allyl methacrylate, 2-allyloxyethyl methacrylate, and propargyl methacrylate;

(4) acrylamides or methacrylamides such as acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide, N-ethyl-N-phenylacrylamide, vinylacrylamide, vinylmethacrylamide, N,N-diallylacrylamide, N,N-diallylmethacrylamide, allylacrylamide, and allylmethacrylamide;

(5) vinyl ethers such as ethyl vinyl ether, 2-chloroethyl vinyl ether, hydroxyethyl vinyl ether, propyl vinyl ether, butyl vinyl ether, octyl vinyl ether, and phenyl vinyl ether;

(6) vinyl esters such as vinyl acetate, vinyl chloroacetate, vinyl butylate, and vinyl benzoate;

(7) styrenes such as styrene, α-methylstyrene, methylstyrene, chloromethylstyrene, and p-acetoxystyrene;

(8) vinyl ketones such as methyl vinyl ketone, ethyl vinyl ketone, propyl vinyl ketone, and phenyl vinyl ketone;

(9) olefins such as ethylene, propylene, isobutylene, butadiene, and isoprene;

(10) N-vinylpyrrolidone, acrylonitrile, methacrylonitrile, and the like;

(11) unsaturated imides such as maleimide, N-acryloylacrylamide, N-acetylmethacrylamide, N-propionylmethacrylamide, and N-(p-chlorobenzoyl)methacrylamide; and

(12) methacrylic acid monomers having a heteroatom bonded to the α-position thereof (such as compounds described in JP-A Nos. 2002-309057 and 2002-311569).

Of these compounds, preferable are a (meth)acrylic resin having, in a side chain thereof, an allyl group or having, in a side chain thereof, a vinyl ester group and a carboxyl group; alkali-soluble resins having, in side chains thereof, double bonds, which are described JP-A Nos. 2000-187322 and 2002-62698; and alkali-soluble resins having, in side chains thereof, amide groups, which are described in JP-A No. 2001-242612 in view of their excellent balance between film strength, sensitivity and developability.

Acid-group-containing urethane binder polymers, which are described in JP-B Nos. 7-12004, 7-120041, 7-120042 and 8-12424, and JP-A Nos. 63-287944, 63-287947, 1-271741, and 11-116232, and other publications; and urethane binder polymers having, in side chains thereof, acid groups and double bonds, which are described in JP-A No. 2002-107918 are advantageous from the viewpoints of printing durability and suitability for exposure at a low exposure dose since they are extremely good in strength.

Preferable are also acetal-modified polyvinyl alcohol binder polymers having an acid group, which are described in EP993966 and EP1204000, JP-A No. 2001-318463, and other publications from the viewpoint of excellent balance between film strength and developability.

Besides, other examples of the water-soluble linear organic polymers include polyvinyl pyrrolidone and polyethylene oxide. In order to increase the strength of the cured film, alcohol-soluble nylon, or polyether made from 2,2-bis-(4-hydroxyphenyl)-propane and epichlorohydrin may also be used as the polymer.

The weight-average molecular weight of the binder polymer used in the invention is preferably 5,000 or more, more preferably from 10,000 to 300,000. The number-average molecular weight thereof is preferably 1,000 or more, more preferably from 2,000 to 250,000. The polydispersity index (i.e., weight-average molecular weight/number-average molecular weight) is preferably 1 or more, and more preferably from 1.1 to 10.

These polymers may each be any type of polymer, such as a random polymer, a block polymer, or a graft polymer.

The polymer used in the invention may be synthesized by a method known in the technical field. Examples of a solvent used in the synthesis include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, methyl lactate, ethyl lactate, dimethylsulfoxide, and water. One of these solvents may be used alone, or two or more thereof may be used in combination.

The radical polymerization initiator used for the synthesis of the polymer used in the invention may be a known compound such as an azo initiator or a peroxide initiator.

In order to prevent the composition from being damaged by a developer, it is preferable that the curable composition includes, as a binder thereof, a polymer having a repeating unit represented by the following Formula (4), which is described in JP-A No. 2003-318053, such as a 2-methacryloyloxyethyl succinate copolymer or a 2-methacryloyloxyethylhexahydrophthalate copolymer.

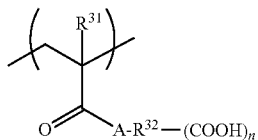

Formula (4)

In Formula (4), $R^{31}$ represents a hydrogen atom or a methyl group, and $R^{32}$ represents a linking group composed of two or more atoms selected from the group consisting of carbon, hydrogen, oxygen, nitrogen and sulfur atoms, the number of the atoms being from 2 to 82. "A" represents an oxygen atom or —$NR^{33}$— wherein $R^{33}$ represents a hydrogen atom or a monovalent hydrocarbon group having 1 to 10 carbon atoms, and n represents an integer of 1 to 5.

In Formula (4), the number of the atoms which constitute the main skeleton of the linking group represented by $R^{32}$ is preferably from 1 to 30. The linking group more preferably has an alkylene structure, or a structure wherein alkylene structures are linked to each other through an ester bond.

The repeating units each represented by Formula (4) will be described in detail hereinafter.

In Formula (4), $R^{31}$ represents a hydrogen atom or a methyl group, and preferably represents a methyl group.

In Formula (4), the linking group represented by $R^{32}$ is a linking group composed of two or more atoms selected from the group consisting of carbon, hydrogen, oxygen, nitrogen and sulfur atoms, the number of the atoms being from 2 to 82, preferably from 2 to 50, and more preferably from 2 to 30. When the linking group has a substituent, the number of atoms mentioned above indicates the number of atoms including also the atoms in the substituent.

More specifically, the number of the atoms which constitute the main skeleton of the linking group represented by $R^{32}$ is preferably from 1 to 30, more preferably from 3 to 25, even more preferably from 4 to 20, and most preferably from 5 to 10. In the invention, the phrase "main skeleton of the linking group" indicates one or more atoms or an atomic group used for linking A and the terminal COOH in Formula (4). In particular, when plural linking paths are present, the phrase "main skeleton of the linking group" indicates one or more atoms or an atomic group constituting a linking path that has the smallest number of atoms. Accordingly, when the linking group has therein a cyclic structure, the number of atoms to be calculated varies in accordance with the linking position (for example, o-, m-, or p-position) in the cyclic structure.

Hereinafter, the structures of examples of the specific binder polymer in the invention, and the number of atoms constituting the main skeleton of the linking group represented by $R^{32}$ in each of the structures and a way of calculating the number will be shown or described.

|   |   | Number of atoms forming the main skeleton of a linking group |
|---|---|---|
| (1) | [structure] | 6 |
| (2) | [structure] | 6 |

| | Number of atoms forming the main skeleton of a linking group |
|---|---|
| (3) [structure] | 6 |
| (4) [structure] | 8 |
| (5) [structure] | 6 |
| (6) [structure] | 6 |
| (7) [structure] | 7 |
| (8) [structure] | 6 |

More specific examples of the linking group represented by $R^{32}$ in Formula (4) include alkylenes, substituted alkylenes, arylenes, and substituted arylenes. The linking group may include two or more of these bivalent groups bonded to each other through an amide or ester bond.

Examples of the linking bond which has a chain structure include ethylene and propylene. Structures wherein two or more out of such alkylenes are linked to each other through one or more ester bonds are also preferable examples.

The linking group represented by $R^{32}$ in the formula (4) is preferably a (n+1)-valent hydrocarbon group having an aliphatic ring structure having 3 to 30 carbon atoms. More specifically, the linking group is a (n+1)-valent hydrocarbon group that is obtained by removing, from a compound having an aliphatic ring structure, (n+1) hydrogen atoms on any carbon atoms which constitute the compound. Examples of the compound having an aliphatic ring structure include cyclopropane, cyclopentane, cyclohexane, cycloheptane, cyclooctane, cyclodecane, dicyclohexane, tercyclohexane, and norbornane. The number of carbon atoms in $R^{32}$, which also include carbon atoms in its substituent, is preferably from 3 to 30.

Any carbon atom in the compound constituting an aliphatic ring structure may be substituted with a heteroatom selected from the group consisting of nitrogen, oxygen, and sulfur atoms. From the viewpoint of printing durability, $R^{32}$ is preferably a (n+1)-valent hydrocarbon group that has a substituted or unsubstituted aliphatic ring structure that includes two or more rings and that has 5 to 30 carbon atoms. Examples of the hydrocarbon group include groups derived from condensed polycyclic aliphatic hydrocarbons, aliphatic hydrocarbons having a bridged ring, spiro aliphatic hydrocarbons, and aliphatic hydrocarbon ring assemblies (i.e., plural rings linked to each other through one or more bonds or linking groups). In this case also, the number of carbon means the number of carbon atoms in $R^{32}$, which also include carbon atoms of the substituent(s) in $R^{32}$.

Furthermore, the linking group represented by $R^{32}$ is preferably a group having 5 to 10 atoms. The structure thereof is preferably a chain structure having an ester bond, or a cyclic structure as described above.

A substituent which can be introduced into the linking group represented by $R^{32}$ may be a monovalent non-metal atomic group (wherein the monovalent non-metal atomic group is not a hydrogen atom), and examples thereof include a halogen atom (—F, —Br, —Cl, —I), a hydroxyl group, an alkoxy group, an aryloxy group, a mercapto group, an alkyl thio group, an aryl thio group, an alkyl dithio group, an aryl dithio group, an amino group, a N-alkyl amino group, a N,N-dialkyl amino group, a N-aryl amino group, a N,N-diaryl amino group, a N-alkyl-N-aryl amino group, an acyloxy group, a carbamoyloxy group, a N-alkylcarbamoyloxy group, a N-aryl carbamoyloxy group, a N,N-dialkyl carbamoyloxy group, a N,N-diaryl carbamoyloxy group, a N-alkyl-N-aryl carbamoyloxy group, an alkyl sulfoxy group, an aryl sulfoxy group, an acyl thio group, an acyl amino group, a N-alkyl acyl amino group, a N-aryl acyl amino group, a ureido group, a N'-alkyl ureido group, a N',N'-dialkyl ureido group, a N'-aryl ureido group, a N',N'-diaryl ureido group, a N'-alkyl-N'-aryl ureido group, a N-alkyl ureido group, a N-aryl ureido group, a N'-alkyl-N-alkyl ureido group, a N'-alkyl-N-aryl ureido group, a N',N'-dialkyl-N-alkyl ureido group, a N',N'-dialkyl-N-aryl ureido group, a N'-aryl-N-alkyl ureido group, a N'-aryl-N-aryl ureido group, a N',N'-diaryl-N-alkyl ureido group, a N',N'-diaryl-N-aryl ureido group, a N'-alkyl-N'-aryl-N-alkyl ureido group, a N'-alkyl-N'-aryl-N-aryl ureido group, an alkoxy carbonyl amino group, an aryloxy carbonyl amino group, a N-alkyl-N-alkoxycarbonyl amino group, a N-alkyl-N-aryloxy carbonyl amino group, a N-aryl-N-alkoxycarbonyl amino group, a N-aryl-N-aryloxycarbonyl amino group, a formyl group, an acyl group, a carboxyl group and its conjugate base group, an alkoxy carbonyl group, an aryloxy carbonyl group, a carbamoyl group, a N-alkyl carbamoyl group, a N,N-dialkyl carbamoyl group, a N-aryl carbamoyl group, a N,N-diaryl carbamoyl group, a N-alkyl-N-aryl carbamoyl group, an alkyl sulfinyl group, an aryl sulfinyl group, an alkyl sulfonyl group, an aryl sulfonyl group, a sulfo group (—SO$_3$H) and its conjugate base group, an alkoxy sulfonyl group, an aryloxy sulfonyl group,
a sulfinamoyl group, a N-alkyl sulfinamoyl group, a N,N-dialkyl sulfinamoyl group, a N-aryl sulfinamoyl group, a N,N-diaryl sulfinamoyl group, a N-alkyl-N-aryl sulfinamoyl group, a sulfamoyl group, a N-alkyl sulfamoyl group, a N,N-dialkyl sulfamoyl group, a N-aryl sulfamoyl group, a N,N-diaryl sulfamoyl group, a N-alkyl-N-aryl sulfamoyl group,
a N-acyl sulfamoyl group and its conjugate base group, a N-alkyl sulfonyl sulfamoyl group (—SO$_2$NHSO$_2$ (alkyl)) and its conjugate base group, a N-aryl sulfonyl sulfamoyl group (—SO$_2$NHSO$_2$ (aryl)) and its conjugate base group, a N-alkyl sulfonyl carbamoyl group (—CONHSO$_2$ (alkyl)) and its conjugate base group, a N-aryl sulfonyl carbamoyl group (—CONHSO$_2$ (aryl)) and its conjugate base group, an alkoxy silyl group (—Si(O-alkyl)$_3$), an aryloxy silyl group (—Si(O-aryl)$_3$), a hydroxysilyl group (—Si(OH)$_3$) and its conjugate base group, a phosphono group (—PO$_3$H$_2$) and its conjugate base group, a dialkyl phosphono group (—PO$_3$(alkyl)$_2$), a diaryl phosphono group (—PO$_3$(aryl)$_2$), an alkyl aryl phosphono group (—PO$_3$(alkyl)(aryl)), a monoalkyl phosphono group (—PO$_3$H(alkyl)) and its conjugate base group, a monoaryl phosphono group (—PO$_3$H(aryl)) and its conjugate base group, a phosphonoxy group (—OPO$_3$H$_2$) and its conjugate base group, a dialkyl phosphonoxy group (—OPO$_3$(alkyl)$_2$), a diaryl phosphonoxy group (—OPO$_3$(aryl)$_2$), an alkyl aryl phosphonoxy group (—OPO$_3$(alkyl)(aryl)), a monoalkyl phosphonoxy group (—OPO$_3$H(alkyl)) and its conjugate base group, a monoaryl phosphonoxy group (—OPO$_3$H(aryl)) and its conjugate base group, a cyano group, a nitro group, a dialkyl boryl group (—B(alkyl)$_2$), a diaryl boryl group (—B(aryl)$_2$), an alkyl aryl boryl group (—B(alkyl)(aryl)), a dihydroxy boryl group (—B(OH)$_2$) and its conjugate base group, an alkyl hydroxy boryl group (—B(alkyl)(OH)) and its conjugate base group, an aryl hydroxy boryl group (—B(aryl)(OH)) and its conjugate base group, an aryl group, an alkenyl group and an alkynyl group.

Depending on the design of the recording layer, a substituent having a hydrogen atom capable of hydrogen bonding, particularly a substituent having acidity whose acid dissociation constant (pKa) is lower than that of carboxylic acid, may not be preferable because it tends to lower printing durability. On the other hand, a hydrophobic substituent such as a halogen atom, a hydrocarbon group (alkyl group, aryl group, alkenyl group, or alkynyl group), an alkoxy group and an aryloxy group is preferable because it tends to improve printing durability. In particular, when the cyclic structure is a six-membered or lower-membered monocyclic aliphatic hydrocarbon such as cyclopentane or cyclohexane, the hydrocarbon preferably has such a hydrophobic substituent. If possible, these substituents may be bound to one another or to a substituted hydrocarbon group to form a ring. The substituents may themselves be substituted.

In Formula (4), when A is NR$^{33}$—, R$^{33}$ represents a hydrogen atom or monovalent hydrocarbon group having 1 to 10 carbon atoms. Examples of the monovalent hydrocarbon group having 1 to 10 carbon atoms represented by R$^{33}$ include linear, branched, or cyclic alkyl groups having 1 to 10 carbon atoms such as an alkyl group, an aryl group, an alkenyl group, and an alkynyl group.

Specific examples of the alkyl group include a methyl group, an ethyl group, a propyl group, a butyl group, a pentyl group, a hexyl group, a heptyl group, an octyl group, a nonyl group, a decyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclopentyl group, a cyclohexyl group, a 1-adamantyl group, and a 2-norbornyl group.

Specific examples of the aryl group include aryl groups having 1 to 10 carbon atoms such as a phenyl group, a naphthyl group, and an indenyl group, heteroaryl groups having 1 to 10 carbon atoms and including a heteroatom selected from the group consisting of a nitrogen atom, an oxygen atom, and a sulfur atom, for example, a furyl group, a thienyl group, a pyrrolyl group, a pyridyl group, and a quinolyl group.

Specific examples of the alkenyl group include linear, branched, or cyclic alkenyl groups having 1 to 10 carbon atoms such as a vinyl group, a 1-propenyl group, a 1-butenyl group, a 1-methyl-1-propenyl group, a 1-cyclopentenyl group, or a 1-cyclohexenyl group.

Specific examples of the alkynyl group include alkynyl groups having 1 to 10 carbon atoms such as an ethynyl group, a 1-propynyl group, a 1-butynyl group, or a 1-octynyl group. Examples of the substituent which may be introduced into R$^{33}$ are the same as those listed as the substituent which may be introduced into R$^{32}$. However, R$^{33}$ has 1 to 10 carbon atoms including the carbon atoms in the substituent.

In Formula (4), A is preferably an oxygen atom or —NH— from the viewpoint of easiness of synthesis.

In Formula (4), n represents an integer of 1 to 5, and is preferably 1 from the viewpoint of printing durability.

Specific examples of the repeating unit represented by Formula (4) composing the binder polymer particularly suitable for the invention are listed below, but are not limited to them.

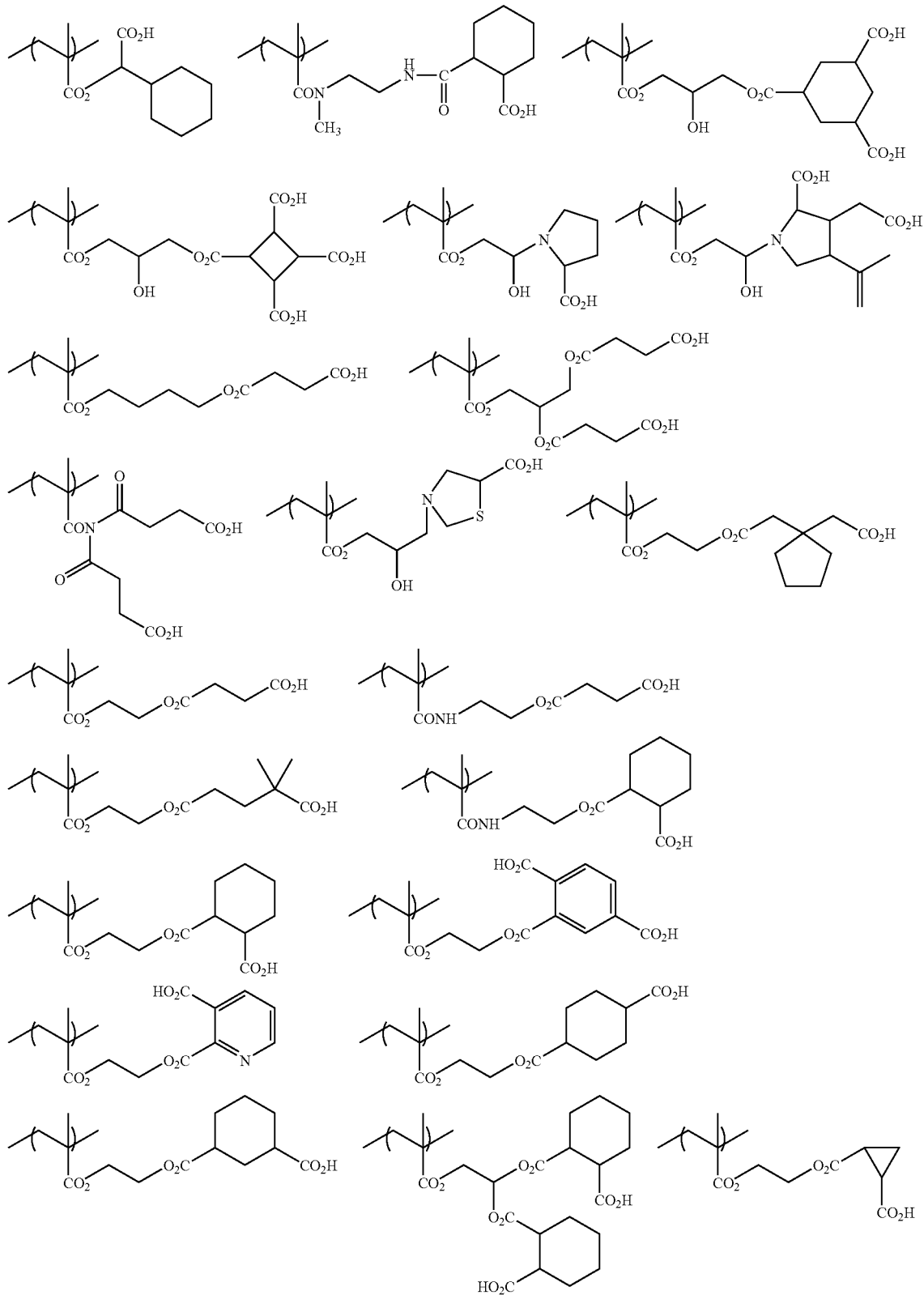

-continued
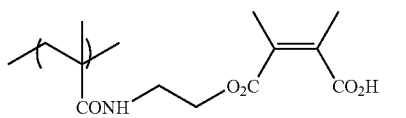
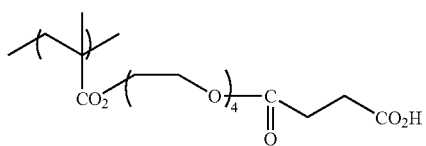
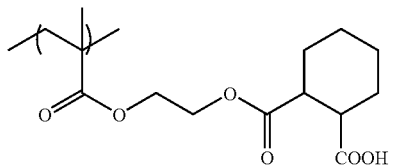
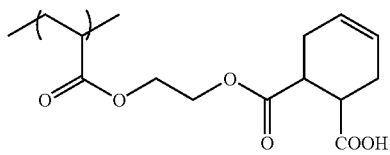
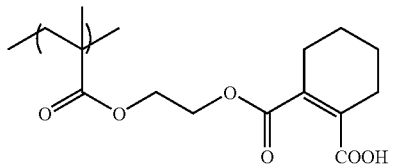
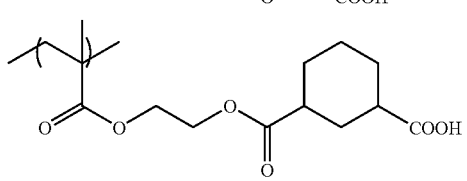
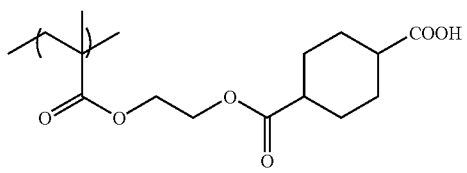
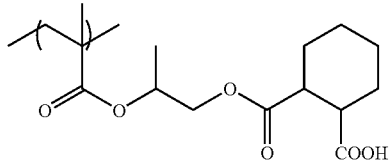
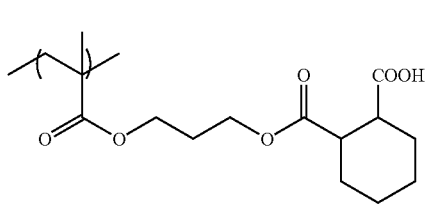
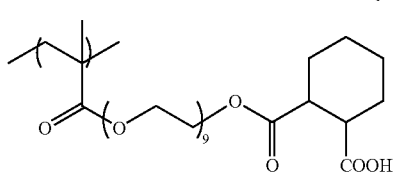
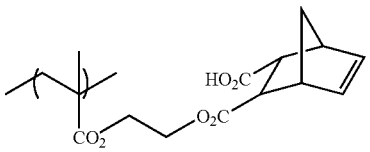
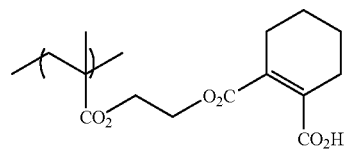
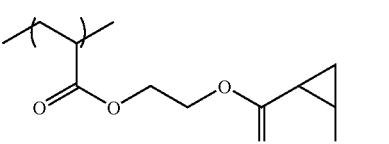
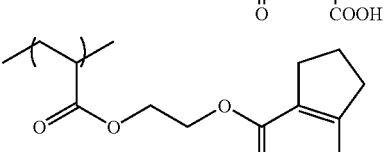
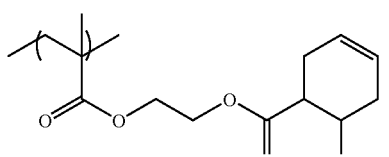
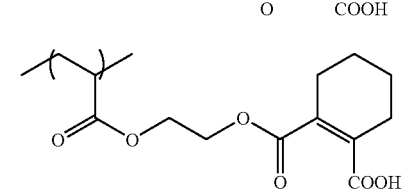
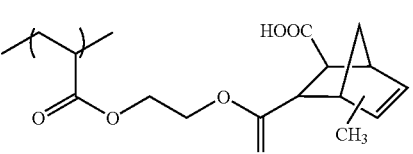
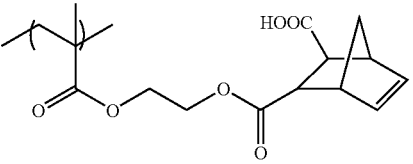
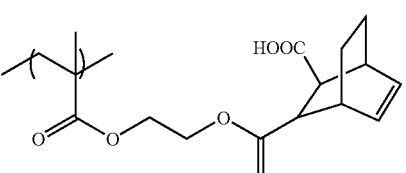
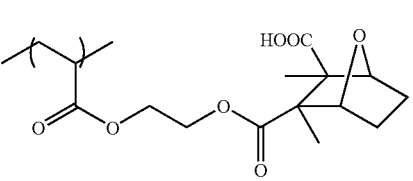

27
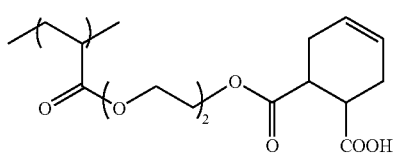
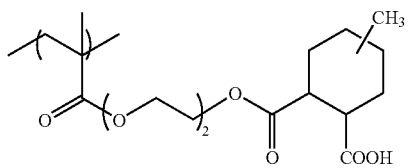
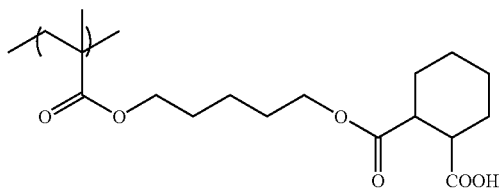
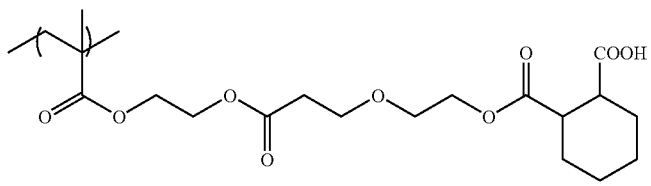
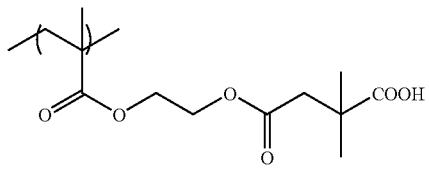
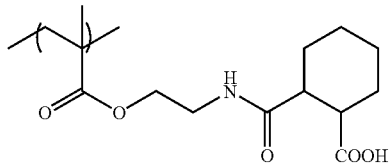
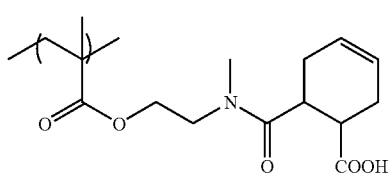
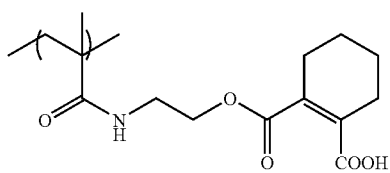
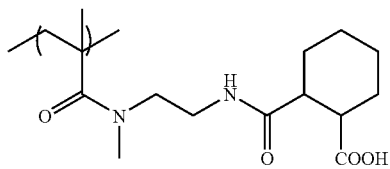
28
-continued
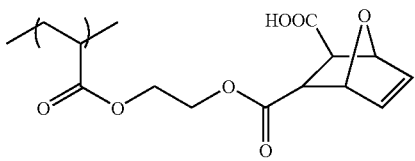
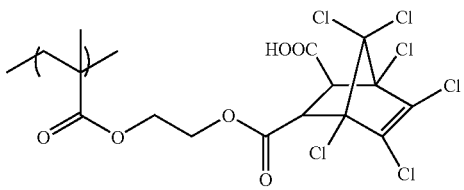
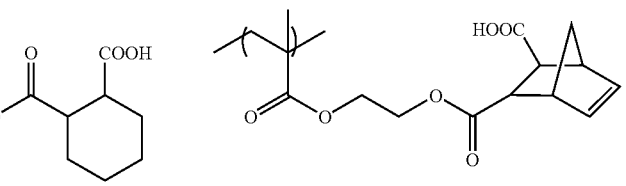
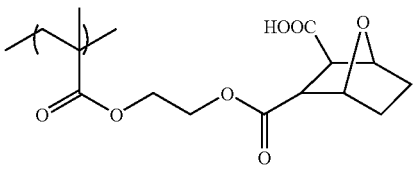
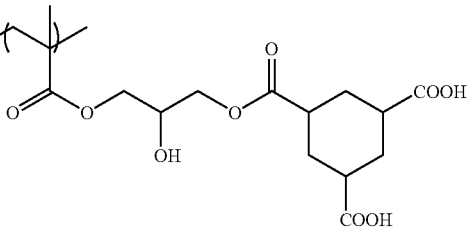
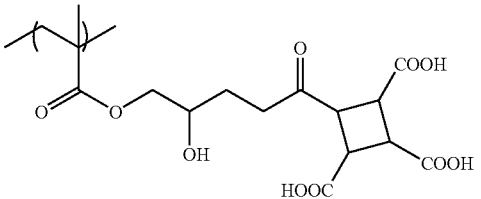
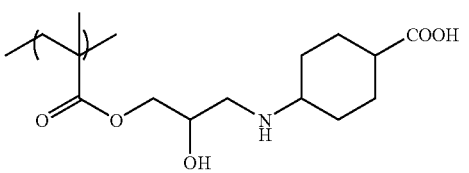
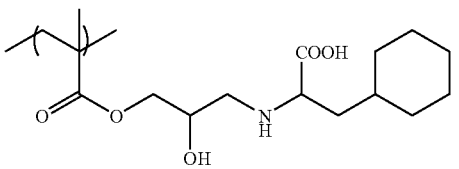

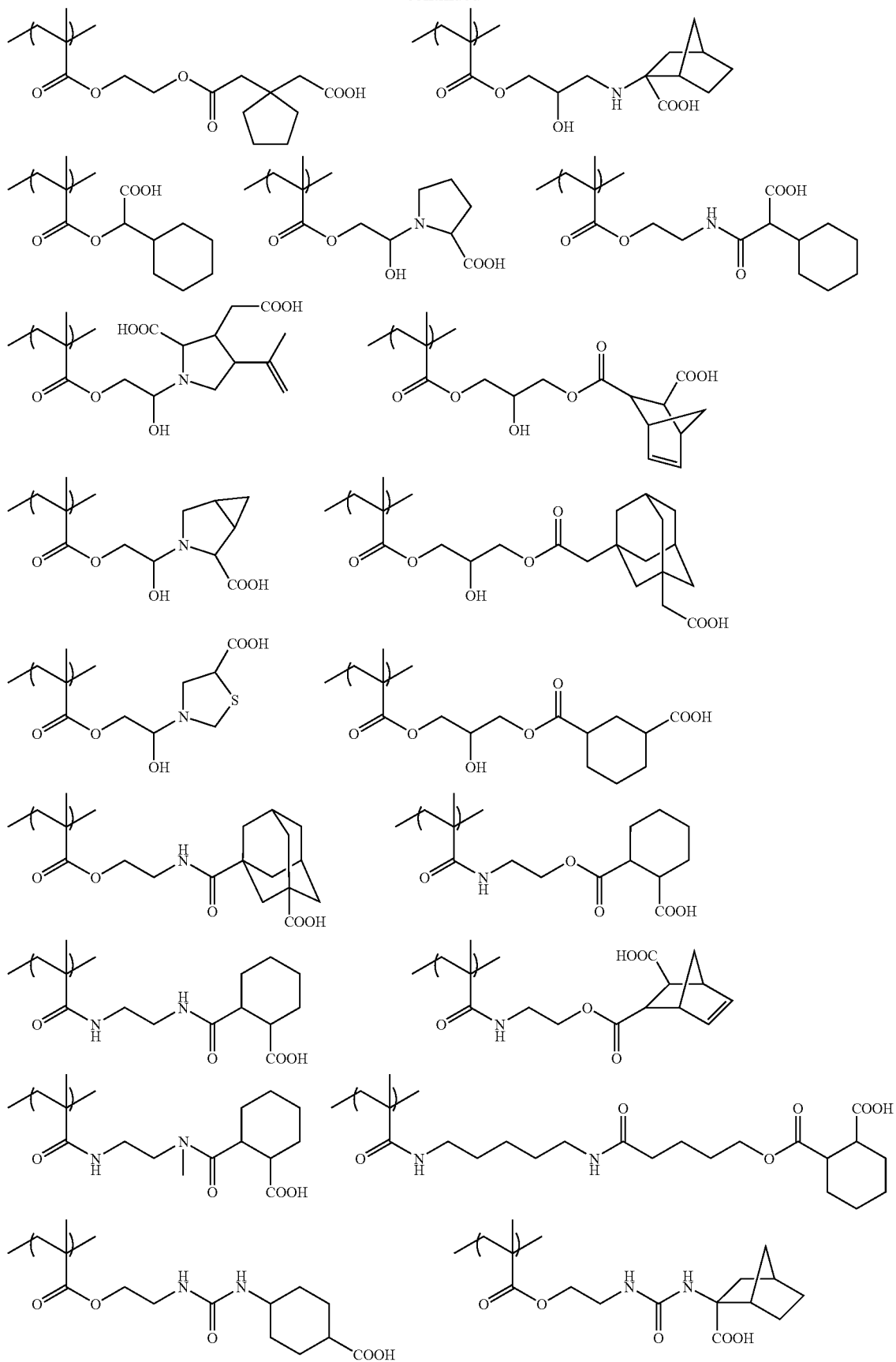

31 32
-continued
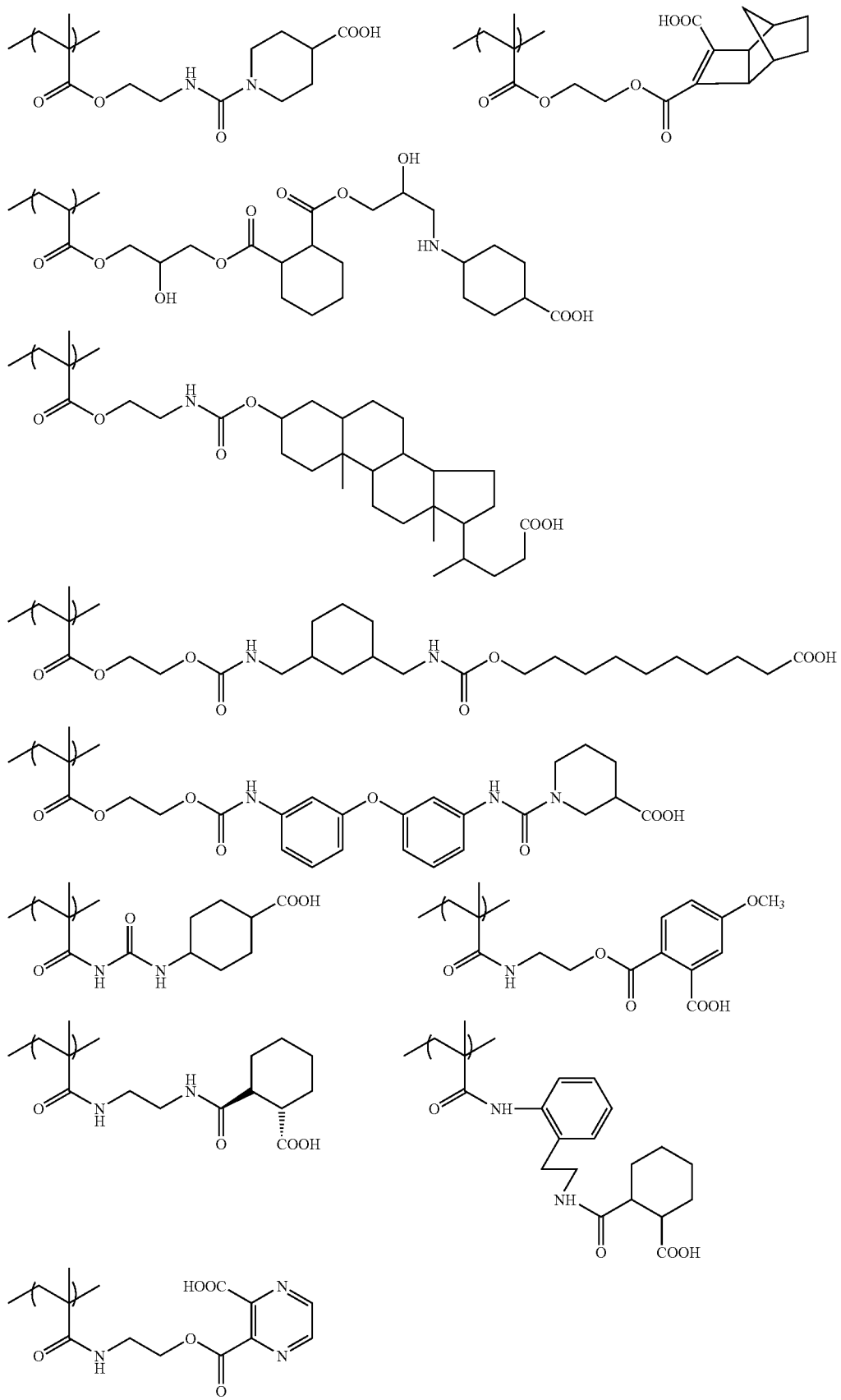

The binder polymer may have a single species of the repeating unit represented by Formula (4), or may have two or more species thereof. The binder polymer in the invention may be a polymer made only of the repeating units represented by Formula (4), alternatively, the binder polymer in the invention may be a copolymer wherein the repeating units represented by Formula (4) are combined with a further, different copolymerizable component. The total amount of the repeating units represented by Formula (4) in the copolymer, which may be appropriately determined in accordance with the structure thereof, the design of the polymerizable composition and the like, is preferably from 1 to 99 mole percent, more preferably from 5 to 40 mole percent, and even more preferably from 5 to 20 mole percent, with respect to the total amount by mole of the polymer components.

The copolymerizable components used for the copolymer may be any known monomer as far as the monomer is a radical-polymerizable monomer. Specific examples thereof include monomers described in "Polymer Data Handbook—Basic Version—(edited by the Society of Polymer Science, Japan, Baifukan Co., Ltd., 1986). One copolymerizable component may be used alone, or two or more of them may be used in combination.

Of the binder polymers, particularly preferable are copolymers made from allyl (meth)acrylate, (meth)acrylic acid, and optional other addition polymerizable monomers, polymers including an acrylic group, a methacrylic group or an allyl group, as described in JP-A Nos. 2000-131837, 2002-62648, 2000-187322 or 2004-318053, and the like since they provide excellent film strength, sensitivity and developability.

In particular, preferable are polymers having a repeating unit represented by Formula (4) and a radical polymerizable group (e.g., carbon-carbon double bond) having a structure represented by any one of Formulae (1) to (3). More preferable are polymers having a repeating unit represented by Formula (4) and a radical polymerizable group having a structure represented by Formula (1) or (2).

One of the binder polymers may be used alone, or two or more of them may be used in combination.

The molecular weight of the binder polymer (B) in the present invention is suitably determined from the viewpoint of image forming property or printing durability. In general, a preferable molecular weight thereof is in the range of from 2,000 to 1,000,000, more preferably in the range of from 5,000 to 500,000, and still more preferably in the range of from 10,000 to 200,000.

The binder polymer (B) used in the invention is preferably a polymer which is substantially insoluble in water, but is soluble in an aqueous alkali solution. The use of this polymer can allow avoidance of the use of an organic solvent, which is unfavorable for the environment, as a developer, or can restrict the amount thereof to be used to an extremely small amount.

The acid value (a value of the acid content per gram of a polymer, which is expressed in chemical equivalent number) and the molecular weight of the binder polymer (B) are suitably selected in view of the image strength and developability. Preferably, the acid value is in the range of from 0.4 to 3.0 meq/g, and the molecular weight is in the range of from 2,000 to 500,000. More preferably, the acid value is in the range of from 0.6 to 2.0 meq/g and the molecular weight is in the range of from 10,000 to 300,000.

The amount of the binder polymer (B) in the curable composition may be determined as appropriate, and is usually from 10 to 90% by mass, preferably from 20 to 80% by mass, and more preferably from 30 to 70% by mass, with respect to the total solid content of the curable composition.

Radical Polymerization Initiator (C)

The radical polymerization initiator used in the invention may be a compound which generates radicals upon heat and/or light energy to initiate and promote the polymerization of a compound having a polymerizable unsaturated group. Specific examples thereof include known radical generators. The radical generator used in the invention may be a known heat polymerization initiator, a compound with smaller dissociation energy, or a photopolymerization initiator. The radical-generating compound preferably used in the invention refers to a compound which generates radicals upon heat energy to initiate and promote the polymerization of a compound having a polymerizable unsaturated group.

The polymerization initiator which generates radicals upon energy deposition may be contained alone or in combination of two or more of them in the photosensitive layer.

Examples of the radical generator include organic halogenated compounds (a), carbonyl compounds (b), organic peroxide compounds (c), azo polymerization initiators (d), azido compounds (e), metallocene compounds (f), hexaarylbiimidazol compounds (g), organic boric acid compounds (h), disulfon compounds (i), oxime ester compounds (j), and onium salt compounds (k).

These compounds will be described below.

Specific examples of the organic halogenated compounds (a) include the compounds described in, for example, Wakabayashi et al. "Bull Chem. Soc Japan" 42, 2924 (1969), U.S. Pat. No. 3,905,815, Japanese Patent Application Publication (JP-B) No. 46-4605, JP-A No. 48-36281, JP-A No. 55-32070, JP-A No. 60-239736, JP-A No. 61-169835, JP-A No. 61-169837, JP-A No. 62-58241, JP-A No. 62-212401, JP-A No. 63-70243, and JP-A No. 63-298339, M. P. Hutt "Journal of Heterocyclic Chemistry" 1 (No. 3), (1970)", and particularly trihalomethyl group-substituted oxazole compounds and S-triazine compounds.

The organic halogenated compound is more preferably an s-triazine derivative wherein at least one mono-, di- or tri-halogen-substituted methyl group is bonded to an s-triazine ring, and specific examples thereof include 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-($\alpha,\alpha,\beta$-trichloroethyl)-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxyphenyl)-4,6-bis(trichloromethyl)-s-triazine, 2-(p-chlorophenyl)-4,6-bis(trichloromethyl)-s-triazine, 2-[1-(p-methoxyphenyl)-2,4-butadienyl]-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(p-i-propyloxystyryl)-4,6-bis(trichloromethyl)-s-triazine, 2-(p-tolyl)-4,6-bis(trichloromethyl)-s-triazine, 2-(4-naphthoxynaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine, and 2-methoxy-4,6-bis(tribromomethyl)-s-triazine.

Examples of the carbonyl compound (b) include benzophenone, benzophenone derivatives such as Michler's ketone, 2-methyl benzophenone, 3-methyl benzophenone, 4-methyl benzophenone, 2-chlorobenzophenone, 4-bromobenzophenone, and 2-carboxybenzophenone, acetophenone derivatives such as 2,2-dimethoxy-2-phenyl acetophenone, 2,2-diethoxy acetophenone, 1-hydroxycyclohexylphenyl ketone, $\alpha$-hydroxy-2-methyl phenyl propane, 1-hydroxy-1-methylethyl-(p-isopropylphenyl)ketone, 1-hydroxy-1-(p-dodecylphenyl)ketone, 2-methyl-(4'-(methylthio) phenyl)-2-morpholino-1-propanone, and 1,1,1-trichloromethyl-(p-butylphenyl)ketone, thioxanthone, thioxanthone derivatives such as 2-ethyl thioxanthone, 2-isopropyl thioxanthone, 2-chlorothioxanthone, 2,4-dimethyl thioxanthone, 2,4-diethyl thioxanthone, and 2,4-diisopropyl thioxanthone, and benzoate esters such as ethyl p-dimethylaminobenzoate or ethyl p-diethylaminobenzoate.

Examples of the organic peroxide compounds (c) include trimethylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy) butane, tert-butylhydroperoxide, cumenehydroperoxide, diisopropylbenzenehydroperoxide, 2,5-dimethylhexane-2,5-dihydroperoxide, 1,1,3,3-tetramethylbutylhydroperoxide, tert-butylcumylperoxide, dicumylperoxide, 2,5-dimethyl-2, 5-di(tert-butylperoxy)hexane, 2,5-oxanoylperoxide, succinic acid peroxide, benzoyl peroxide, 2,4-dichlorobenzoyl peroxide, diisopropylperoxy dicarbonate, di-2-ethylhexylperoxy dicarbonate, di-2-ethoxyethylperoxy dicarbonate, dimethoxyisopropylperoxy carbonate, di(3-methyl-3-methoxybutyl)peroxy dicarbonate, tert-butylperoxy acetate, tert-butylperoxy pivalate, tert-butylperoxyneodecanoate, tert-butylperoxy octanoate, tert-butylperoxy laurate, tertiary carbonate, 3,3',4,4'-tetra-(t-butylperoxycarbonyl)benzophenone, 3,3',4,4'-tetra-(t-hexylperoxycarbonyl)benzophenone, 3,3',4,4'-tetra-(p-isopropylcumylperoxycarbonyl)benzophenone, carbonyldi(t-butylperoxydihydrogen diphthalate), and carbonyldi(t-hexylperoxydihydrogen diphthalate).

Example of the azo polymerization initiators (d) include azo compounds described in JP-A No. 8-108621.

Examples of the azido compounds (e) include 2,6-bis(4-azidobenzylidene)-4-methylcyclohexanone.

Examples of the metallocene compounds (f) include various titanocene compounds described in JP-A No. 59-152396, JP-A No. 61-151197, JP-A No. 63-41484, JP-A No. 2-249, JP-A No. 2-4705, and JP-A No. 5-83588, such as di-cyclopentadienyl-Ti-bis-phenyl, di-cyclopentadienyl-Ti-bis-2,6-difluorophen-1-yl, di-cyclopentadienyl-Ti-bis-2,4-di-fluorophen-1-yl, di-cyclopentadienyl-Ti-bis-2,4,6-trifluorophen-1-yl, di-cyclopentadienyl-Ti-bis-2,3,5,6-tetrafluorophen-1-yl, di-cyclopentadienyl-Ti-bis-2,3,4,5,6-pentafluorophen-1-yl, di-methylcyclopentadienyl-Ti-bis-2,6-difluorophen-1-yl, di-methylcyclopentadienyl-Ti-bis-2,4,6-trifluorophen-1-yl, di-methylcyclopentadienyl-Ti-bis-2,3,5,6-tetrafluorophen-1-yl, di-methylcyclopentadienyl-Ti-bis-2,3,4,5,6-pentafluorophen-1-yl, and iron-allene complexes described in JP-A No. 1-304453 and JP-A No. 1-152109.

Examples of the hexaarylbiimidazole compounds (g) include various compounds described in JP-B No. 6-29285, U.S. Pat. No. 3,479,185, U.S. Pat. No. 4,311,783, and U.S. Pat. No. 4,622,286, such as 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methyl phenyl)-4,4',5,5'-tetraphenylbiimidazole, and 2,2'-bis (o-trifluorophenyl)-4,4',5,5'-tetraphenyl biimidazole.

Specific examples of the organic boric aid compounds (h) include organic borates described in, for example, JP-A No. 62-143044, JP-A No. 62-150242, JP-A No. 9-188685, JP-A No. 9-188686, JP-A No. 9-188710, JP-A No. 2000-131837, JP-A No. 2002-107916, Japanese Patent No. 2764769, JP-A No. 2002-116539, and Kunz, Martin 'Rad Tech' 98. Proceeding Apr. 19-22, 1998, Chicago", organic boron sulfonium complexes or organic boron oxosulfonium complexes described in JP-A No. 6-157623, JP-A No. 6-175564, and JP-A No. 6-175561, organic boron iodonium complexes described in JP-A No. 6-175554 and JP-A No. 6-175553, organic boron phosphonium complexes described in JP-A No. 9-188710, and organic boron transition metal coordination complexes described in JP-A No. 6-348011, JP-A No. 7-128785, JP-A No. 7-140589, JP-A No. 7-306527, and JP-A No. 7-292014.

Examples of the disulfone compounds (i) include compounds described in JP-A No. 61-166544, and JP-A No. 2002-328465.

Examples of the oxime ester compounds (j) include compounds described in J. C. S. Perkin II, pp. 1653-1660 (1979), J. C. S. Perkin II, pp. 156-162 (1979), Journal of Photopolymer Science and Technology, pp. 202-232 (1995) and JP-A No. 2000-66385, and compounds described in JP-A No. 2000-80068, and specific examples thereof include the following compounds.

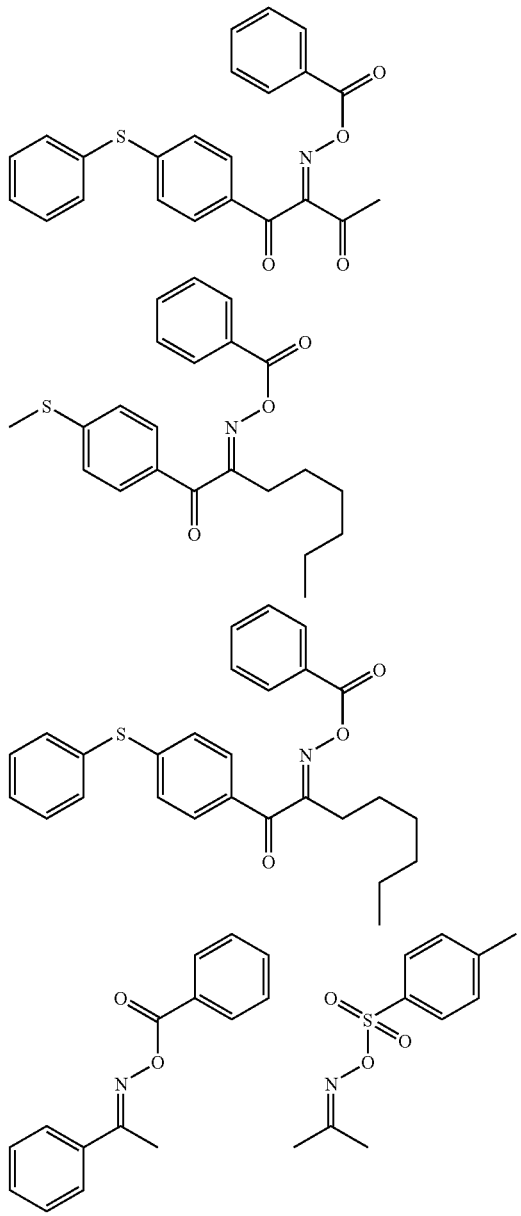

37
-continued
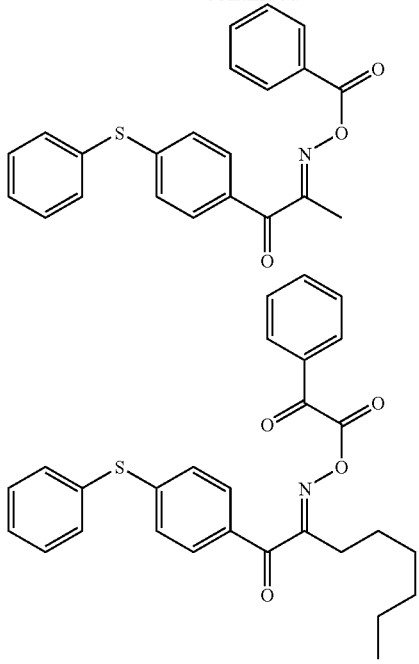
38
-continued
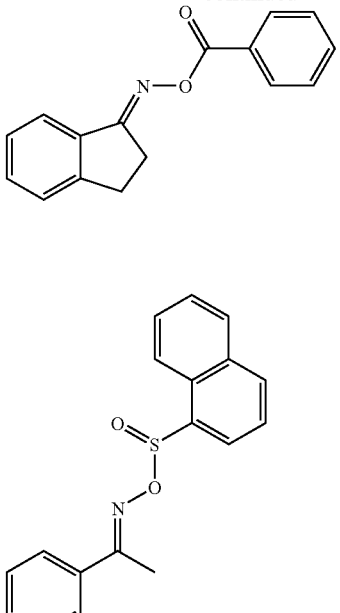
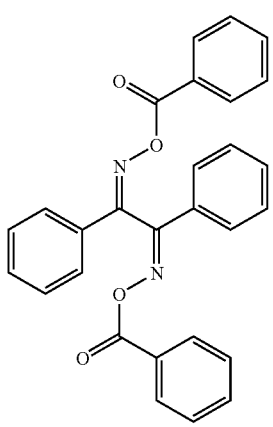
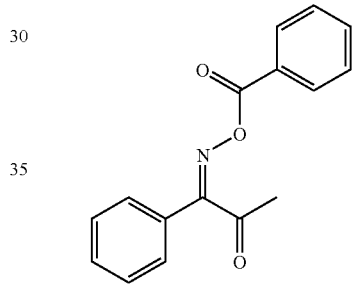 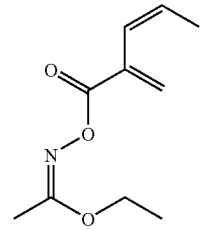
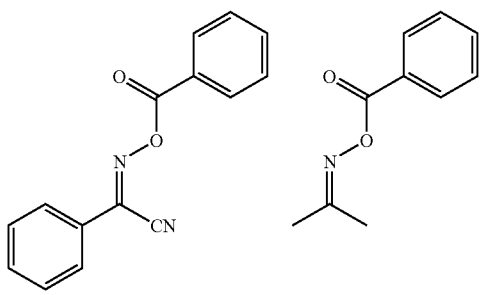
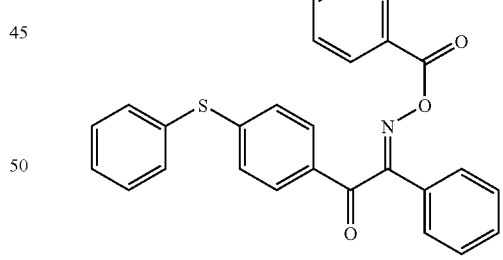
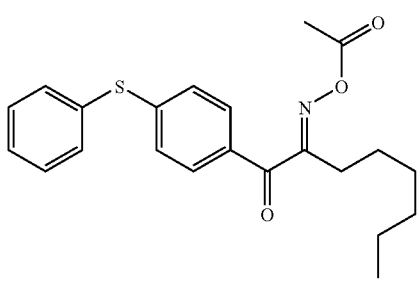
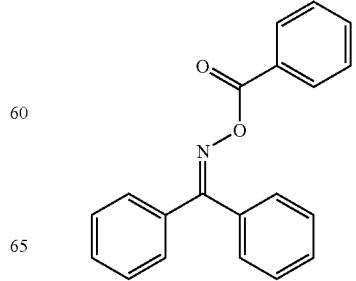

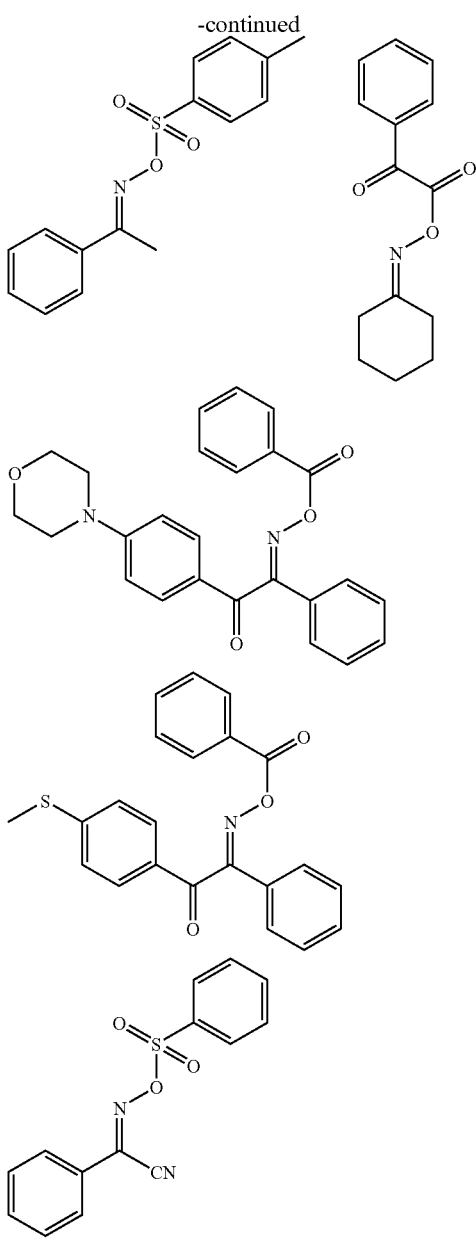

Examples of the onium salt compounds (k) include diazonium salts described in S. I. Schlesinger, Photogr, Sci, Eng., 18,387 (1974), T. S. Bal et al, Polymer, 21,423 (1980), ammonium salts described in U.S. Pat. No. 4,069,055 and JP-A No. 4-365049, phosphonium salts described in U.S. Pat. No. 4,069,055 and U.S. Pat. No. 4,069,056, iodonium salts described in European Patent Application No. 104,143, JP-A No. 2-150848 and JP-A No. 2-296514, sulfonium salts described in European Patent Application No. 370,693, European Patent Application No. 390,214, European Patent Application No. 233,567, European Patent Application No. 297, 443, European Patent Application No. 297,442, U.S. Pat. No. 4,933,377, U.S. Pat. No. 4,760,013, U.S. Pat. No. 4,734,444, U.S. Pat. No. 2,833,827, German Patent No. 2,904,626, German Patent No. 3,604,580, and German Patent No. 3,604,581, selenonium salts described in J. V. Crivello et al, Macromolecules, 10 (6), 1307 (1977), J. V. Crivello et al, J. Polymer Sci., Polymer Chem, Ed., 17, 1047 (1979), and arsonium salts described in C. S. Wen et al, Teh, Proc. Conf. Rad, Curing ASIA, p. 478, Tokyo, October (1988).

From the viewpoints of the reactivity and stability, the above-described oxime ester compounds and diazonium salts, iodonium salts, and sulfonium salts, which will be further described later, are particularly preferable examples of the polymerization initiator. In the invention, the onium salt functions not as an acid generator, but as an ionic radical polymerization initiator.

In the invention, the onium salts represented by the following Formulae (RI-I) to (RI-III) are preferable.

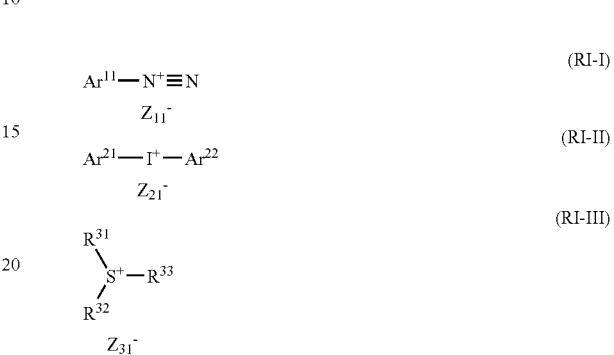

In Formula (RI-I), $Ar^{11}$ represents an aryl group having 20 or less carbon atoms, which may have 1 to 6 substituents, and the substituents are preferably selected from alkyl groups having 1 to 12 carbon atoms, alkenyl groups having 1 to 12 carbon atoms, alkynyl groups having 1 to 12 carbon atoms, aryl groups having 1 to 12 carbon atoms, alkoxy groups having 1 to 12 carbon atoms, aryloxy groups having 1 to 12 carbon atoms, halogen atoms, alkylamino groups having 1 to 12 carbon atoms, dialkylamino groups having 1 to 12 carbon atoms, alkyl amide groups having 1 to 12 carbon atoms, aryl amide groups having 1 to 12 carbon atoms, carbonyl groups, carboxyl groups, cyano groups, sulfonyl groups, thioalkyl groups having 1 to 12 carbon atoms, and thioaryl groups having 1 to 12 carbon atoms.

$Z_{11}^-$ represents a monovalent anion which may be selected from a halogen ion, a perchlorate ion, a hexafluorophosphate ion, a tetrafluoroborate ion, a sulfonate ion, a sulfinate ion, a thiosulfonate ion and a sulfate ion. $Z_{11}^-$ preferably represents a perchlorate ion, a hexafluorophosphate ion, a tetrafluoroborate ion, a sulfonate ion, a sulfinate ion, or a carboxylate ion from the viewpoint of stability and reactivity.

In Formula (RI-II), $Ar^{21}$ and $Ar^{22}$ each independently represent an aryl group which has 20 or less carbon atoms and may have 1 to 6 substituents, and the substituents are preferably selected from alkyl groups each having 1 to 12 carbon atoms, alkenyl groups each having 1 to 12 carbon atoms, alkynyl groups each having 1 to 12 carbon atoms, aryl groups each having 1 to 12 carbon atoms, alkoxy groups each having 1 to 12 carbon atoms, aryloxy groups each having 1 to 12 carbon atoms, halogen atoms, alkylamino groups each having 1 to 12 carbon atoms, dialkylamino groups each having 1 to 12 carbon atoms, alkyl amide groups each having 1 to 12 carbon atoms, aryl amide groups each having 1 to 12 carbon atoms, carbonyl groups, carboxyl groups, cyano groups, sulfonyl groups, thioalkyl groups each having 1 to 12 carbon atoms, and thioaryl groups each having 1 to 12 carbon atoms.

$Z_{21}^-$ represents a monovalent anion which may be selected from a halogen ion, a perchlorate ion, a hexafluorophosphate ion, a tetrafluoroborate ion, a sulfonate ion, a sulfinate ion, a thiosulfonate ion and a sulfate ion. $Z_{21}^-$ preferably represents a perchlorate ion, a hexafluorophosphate ion, a tetrafluoroborate ion, a sulfonate ion, a sulfinate ion, or a carboxylate ion from the viewpoints of stability and reactivity.

In Formula (RI-III), $Ar^{31}$, $Ar^{32}$, and $Ar^{33}$ each independently represent an aryl, alkyl, alkenyl, or alkynyl group which has 20 or less carbon atoms and may have 1 to 6 substituents, among which an aryl group being preferable from the viewpoints of reactivity and stability. The substituents are preferably selected from alkyl groups each having 1 to 12 carbon atoms, alkenyl groups each having 1 to 12 carbon atoms, alkynyl groups each having 1 to 12 carbon atoms, aryl groups each having 1 to 12 carbon atoms, alkoxy groups each having 1 to 12 carbon atoms, aryloxy groups each having 1 to 12 carbon atoms, halogen atoms, alkylamino groups each having 1 to 12 carbon atoms, dialkylamino groups each having 1 to 12 carbon atoms, alkyl amide groups each having 1 to 12 carbon atoms, aryl amide groups each having 1 to 12 carbon atoms, carbonyl groups, carboxyl groups, cyano groups, sulfonyl groups, thioalkyl groups each having 1 to 12 carbon atoms, and thioaryl groups each having 1 to 12 carbon atoms.

$Z_{31}^-$ represents a monovalent anion which may be selected from a halogen ion, a perchlorate ion, a hexafluorophosphate ion, a tetrafluoroborate ion, a sulfonate ion, a sulfinate ion, a thiosulfonate ion and a sulfate ion. $Z_{31}^-$ preferably represents a perchlorate ion, a hexafluorophosphate ion, a tetrafluoroborate ion, a sulfonate ion, a sulfinate ion, or a carboxylate ion from the viewpoints of stability and reactivity. In particular, a carboxylate ion described in JP-A No. 2001-343742 is preferable, and a carboxylate ion described in JP-A No. 2002-148790 is more preferable.

Specific examples of the onium salt compound, which is preferably used as the polymerization initiator in the invention, are shown below. However, the onium salt compound is not limited thereto.

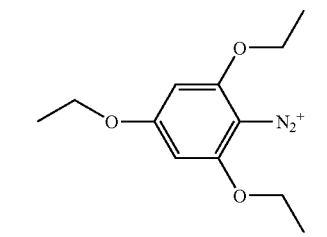

(N-1)    (N-2)

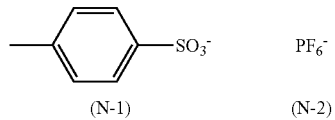

(N-3)    (N-4)

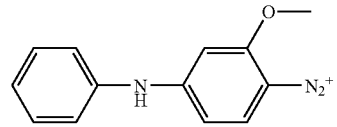

(N-5)    (N-6)

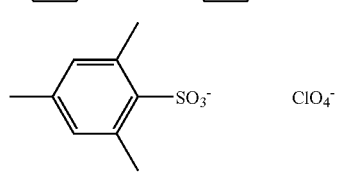

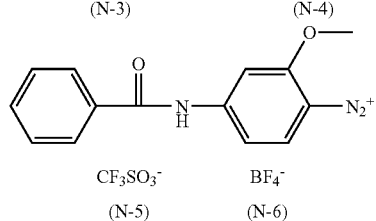

(N-7)    (N-8)

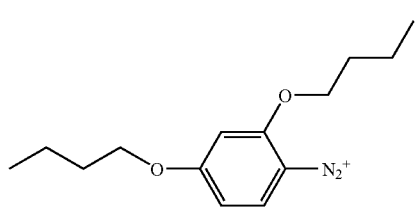

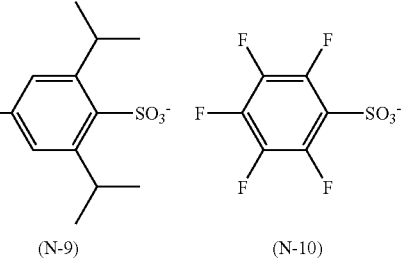

(N-9)    (N-10)    (N-11)

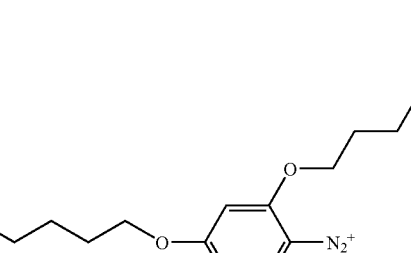

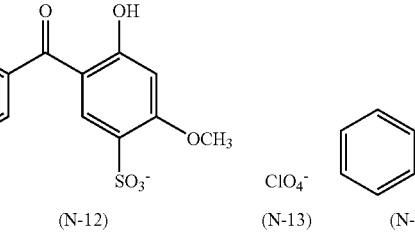

(N-12)    (N-13)    (N-14)

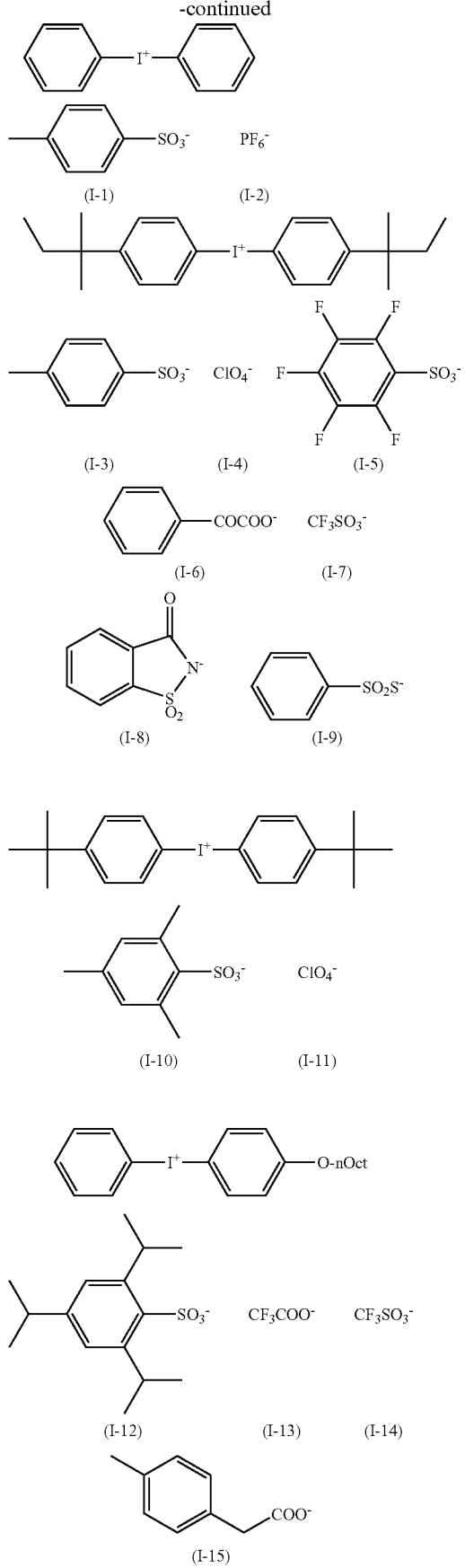
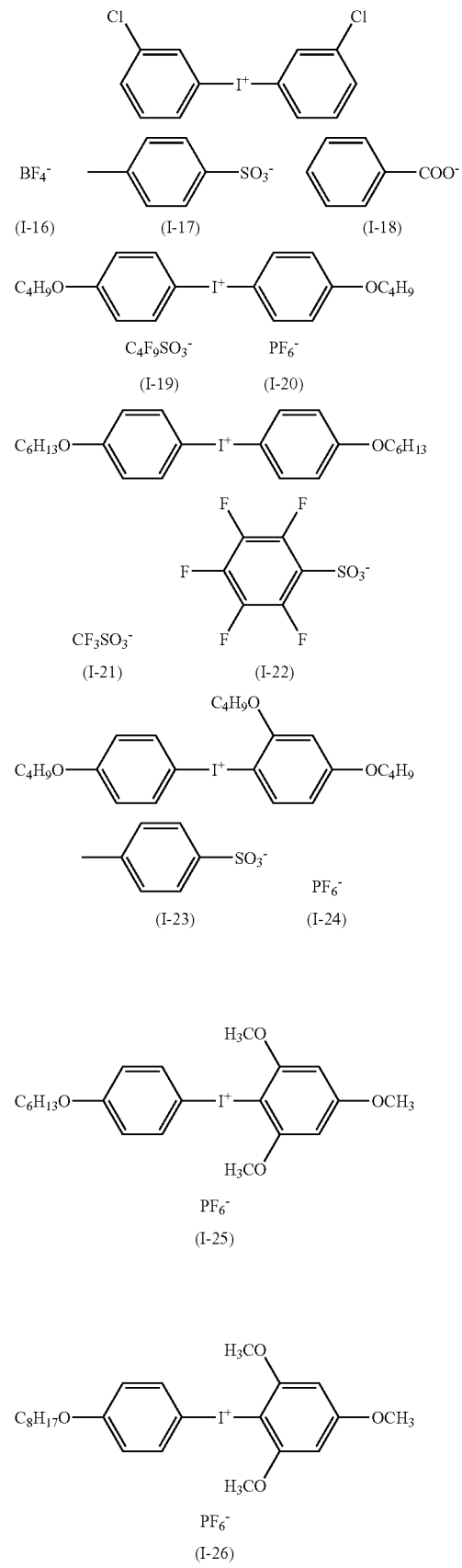

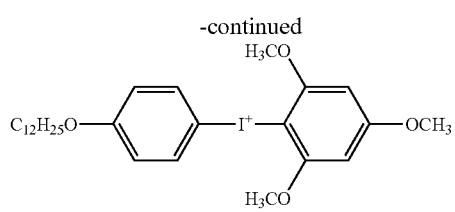

(I-27)

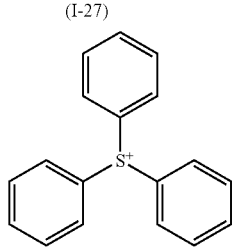

(S-1)  (S-2)  (S-3)

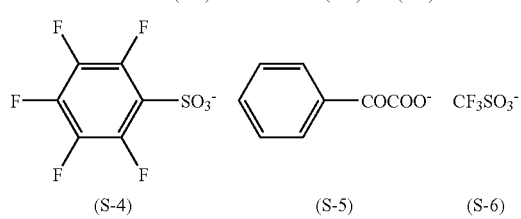

(S-4)  (S-5)  (S-6)

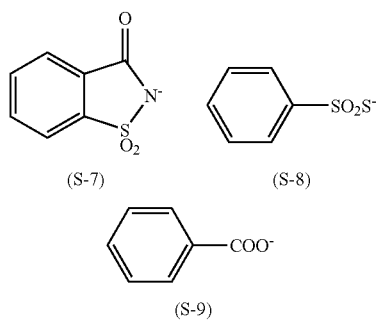

(S-7)  (S-8)

(S-9)

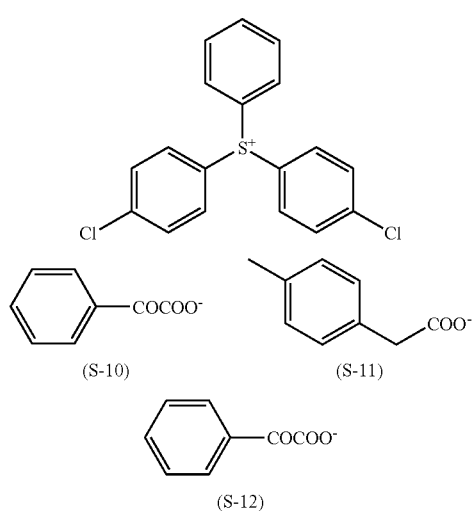

(S-10)  (S-11)

(S-12)

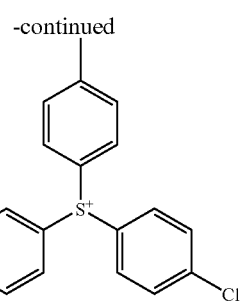

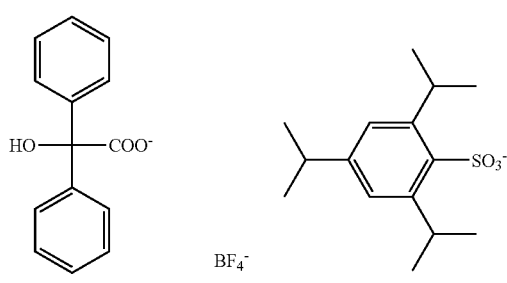

(S-13)  (S-14)  (S-15)

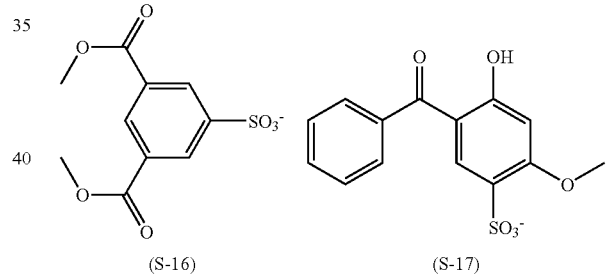

(S-16)  (S-17)

Among the above-described compounds, oxime ester compounds (j) and diazonium salts, iodonium salts, and sulfonium salts included in onium chlorides (k) are preferable as the polymerization initiator in the invention from the viewpoints of particularly the reactivity and stability. In the invention, the onium salt functions not as an acid generator, but an ionic radical polymerization initiator.

The polymerization initiator in the invention is particularly preferably an iodonium salt having an electron-donating group or sulfonium salt having an electron-withdrawing group from the viewpoint of the balance between the reactivity and stability, and in particular, an iodonium salt having two or more alkoxy groups or the like in its skeleton with a cation portion is preferable, and an iodonium salt having three or more alkoxy groups is most preferable.

One of the radical polymerization initiators (C) may be included alone, or two or more of them may be included in combination in the curable composition.

The amount of the radical polymerization initiator (C) to be added to the curable composition may be from 0.1 to 50% by mass, preferably from 0.5 to 30% by mass, most preferably from 1 to 20% by mass, with respect to the total solid content of the curable composition. When the amount falls within the above ranges, the composition can achieve curability with a high sensitivity, and when the composition is applied to a recording layer of a planographic printing plate precursor, excellent sensitivity is achieved, and stain resistance of a non-image portion at the time of printing may be satisfactory.

The radical polymerization initiator (C) may be added to the same layer together with other components, or may be added to an independently formed layer.

The curable composition of the invention may include the polymerizable compound (A), the binder polymer (B), the radical polymerization initiator (C), and the specific amine compound (D), and may further include other compounds in accordance with the purpose. In the following, such other ingredients which can be used in the curable composition of the invention will be described.

(E) Sensitizing Dye

A sensitizing dye may be used for the curable composition of the present invention for the purpose of improving sensitivity. In particular, when the radical polymerization initiator (C) is a photopolymerization initiator in the curable composition of the present invention, it is preferable that the curable composition of the present invention further includes a sensitizer which sensitizes the photopolymerization initiator, from the viewpoint of improving sensitivity.

The sensitizing dye may be preferably a sensitizing dye having an absorption maximum in the wavelength range of from 300 to 850 nm, more preferably from 300 to 600 nm, and particularly preferably from 300 to 450 nm.

The sensitizing dye preferably has a molar absorption coefficient (ε) (l/mol·cm) of from 10,000 to 100,000, more preferably from 15,000 to 100,000, and particularly preferably from 20,000 to 100,000.

Examples of such a sensitizing dye include spectral sensitizing dyes and the following dyes or pigments which absorb light of a light source to interact with a photopolymerization initiator.

Method of Determining Molar Absorption Coefficient (ε)

50 mg of a sample is weighed out and put into a 200-ml measuring graduated flask. Then, about 50 ml of special grade 1-methoxy-2-propanol (which may be hereinafter abbreviated to "MFG") is added thereto so as to dissolve the sample using an ultrasonic cleaner for about 10 minutes. Thereafter, additional MFG is added thereto so that the total volume of the mixture becomes 200 ml (A solution). 4 ml of the resultant solution (i.e. A solution) is put into a 100-ml graduated flask using a whole pipet. Additional MFG is added to the 100-ml graduated flask so that the total volume of the solution in the flask becomes 100 ml. The molar absorption coefficient of the resultant solution is determined using a spectrophotometer (trade name: Cary 5, manufactured by Varian Technologies Japan Limited) under the following conditions.

Conditions:

| Thickness of cell: | 10 mm |
| Ref. | MFG |
| Measurement wavelength | λmax |

Preferable examples of the spectral sensitizing dyes include polynuclear aromatics (e.g. pyrene, perylene, and triphenylene), xanthenes (e.g. fluorescein, eosin, erythrosine, rhodamine B, and rose bengal), cyanines (e.g. thiacarbocyanine, and oxacarbocyanine), melocyanines (e.g. melocyanine and carbomelocyanine), thiazines (e.g. thioene, methylene blue, and toluidine blue), acridines (e.g. acridine orange, chloroflavine, and acriflavine), phthalocyanines (e.g. phthalocyanine and metallophthalocyanine), porphyrins (e.g. tetraphenyl porphyrin, center metal substituted porphyrin), chlorophylls (e.g. chlorophyll, chlorophyllin, and center metal substituted chlorophyll), metal complexes, anthraquinones (e.g. anthraquinone), and squaryliums (e.g. squarylium).

More preferable examples of the spectral sensitizing dyes include styryl dyes described in JP-B No. 37-13034, cation dyes described in JP-A No. 62-143044, quinoxalinium salts described in JP-B No. 59-24147, novel methylene blue compounds described in JP-A No. 64-33104, anthraquinones described in JP-A No. 64-56767, benzoxanthene dyes described in JP-A No. 2-1714, acridines described in JP-A No. 2-226148 and JP-A No. 2-226149, pyrylium salts described in JP-B No. 40-28499, cyanines described in JP-B No. 46-42363, benzofuran dyes described in JP-A No. 2-63053, conjugate ketone dyes described in JP-A No. 2-85858 and JP-A No. 2-216154, dyes described in JP-A No. 57-10605, azocinnamylidene derivatives described in JP-B No. 2-30321, cyanine dyes described in JP-A No. 1-287105, xanthene dyes described in JP-A No. 62-31844, JP-A No. 62-31848, and JP-A No. 62-143043, aminostyryl ketones described in JP-B No. 59-28325, melocyanine dyes described in JP-B No. 61-9621, dyes described in JP-A No. 2-179643, melocyanine dyes described in JP-A No. 2-244050, melocyanine dyes described in JP-B No. 59-28326, melocyanine dyes described in JP-A No. 59-89803, melocyanine dyes described in JP-A No. 8-129257, and benzopyran dyes described in JP-A No. 8-334897.

The sensitizing dye used in the invention is more preferably represented by the following Formula (5).

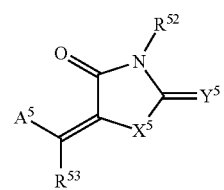

Formula (5)

In Formula (5), $A^5$ represents an optionally substituted aromatic ring or an optionally substituted heterocycle, $X^5$ represents an oxygen atom, a sulfur atom, or —$N(R^{51})$—, and $Y^5$ represents an oxygen atom or —$N(R^{51})$. $R^{51}$, $R^{52}$, and $R^{53}$ each independently represent a hydrogen atom or a monovalent group of nonmetal atoms. $A^5$ and any one of $R^{51}$, $R^{52}$, and $R^{53}$ may be combined with each other to form an aliphatic or aromatic ring.

When $R^{51}$, $R^{52}$, and $R^{53}$ each represents a monovalent group of nonmetal atoms, and preferably represents a substituted or unsubstituted alkyl group or aryl group.

Specific preferable examples of $R^{51}$, $R^{52}$, and $R^{53}$ are described below. Preferable examples of the alkyl group include linear, branched, and cyclic alkyl groups having 1 to 20 carbon atoms, and specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, a s-butyl group, a t-butyl group, an isopentyl group, a neopentyl group, a 1-methylbutyl group, an isohexyl group, a 2-ethylhexyl group, a 2-methylhexyl group, a cyclohexyl group, a cyclopentyl group, and a 2-norbornyl group. Among them, linear alkyl groups having 1 to 12 carbon atoms, branched alkyl groups having 3 to 12 carbon atoms, and cyclic alkyl groups having 5 to 10 carbon atoms are more preferable.

As the substituent of the substituted alkyl group, a monovalent group of nonmetal atoms is used wherein the monovalent group is not a hydrogen atom, and preferable examples thereof include a halogen atom (—F, —Br, —Cl, or —I), a hydroxyl group, an alkoxy group, an aryloxy group, a mercapto group, an alkylthio group, an arylthio group, an alkyldithio group, an aryldithio group, an amino group, a N-alkylamino group, a N,N-dialkylamino group, a N-arylamino group, a N,N-diarylamino group, a N-alkyl-N-arylamino group, an acyloxy group, a carbamoyloxy group, a N-alkylcarbamoyloxy group, a N-arylcarbamoyloxy group, a N,N-dialkylcarbamoyloxy group, a N,N-diarylcarbamoyloxy group, a N-alkyl-N-arylcarbamoyloxy group, an alkylsulfoxy group, an arylsulfoxy group, an acyloxy group, an acylthio group, an acylamino group, a N-alkylacylamino group, a N-arylacylamino group, a ureido group, a N'-alkylureido group, a N',N'-dialkylureido group, a N'-arylureido group, a N',N'-diarylureido group, a N'-alkyl-N'-arylureido group, a N-alkylureido group, a N-arylureido group, a N'-alkyl-N-alkylureido group, a N'-alkyl-N-arylureido group, a N',N'-dialkyl-N-alkylureido group, a N',N'-dialkyl-N-arylureido group, a N'-aryl-N-alkylureido group, a N'-aryl-N-arylureido group, a N',N'-diaryl-N-alkylureido group, a N',N'-diaryl-N-arylureido group, a N'-alkyl-N'-aryl-N-alkylureido group, a N'-alkyl-N'-aryl-N-arylureido group, an alkoxycarbonylamino group, an aryloxycarbonylamino group, a N-alkyl-N-alkoxycarbonylamino group, a N-alkyl-N-aryloxycarbonylamino group, a N-aryl-N-alkoxycarbonylamino group, a N-aryl-N-aryloxycarbonylamino group, a formyl group, an acyl group, a carboxyl group, an alkoxycarbonyl group, an aryloxycarbonyl group, a carbamoyl group, a N-alkylcarbamoyl group, a N,N-dialkylcarbamoyl group, a N-arylcarbamoyl group, a N,N-diarylcarbamoyl group, a N-alkyl-N-arylcarbamoyl group, an alkylsulfinyl group, an arylsulfinyl group, an alkylsulfonyl group, an arylsulfonyl group, a sulfo group (—SO$_3$H) and conjugate base groups thereof (hereinafter, referred to as a sulfonate group), an alkoxysulfonyl group, an aryloxysulfonyl group, a sulfinamoyl group, a N-alkylsulfinamoyl group, a N,N-dialkylsulfinamoyl group, a N-arylsulfinamoyl group, a N,N-diarylsulfinamoyl group, a N-alkyl-N-arylsulfinamoyl group, a sulfamoyl group, a N-alkylsulfamoyl group, a N,N-dialkylsulfamoyl group, a N-arylsulfamoyl group, a N,N-diarylsulfamoyl group, a N-alkyl-N-arylsulfamoyl group, a phosphono group (—PO$_3$H$_2$) and conjugate base groups thereof (hereinafter, referred to as a phosphonate group), a dialkylphosphono group (—PO$_3$(alkyl)$_2$), diarylphosphono group (—PO$_3$(aryl)$_2$), an alkylarylphosphono group(—PO$_3$(alkyl)(aryl)), a monoalkylphosphono group (—PO$_3$H(alkyl)) and conjugate base groups thereof (hereinafter, referred to as an alkylphosphonate group), a monoarylphosphono group (—PO$_3$H(aryl)) and conjugate base groups thereof (hereinafter, referred to as an arylphosphonate group), phosphonooxy group (—OPO$_3$H$_2$) and conjugate base groups thereof (hereinafter, referred to as a phosphonateoxy group), a dialkyl phosphonooxy group (—OPO$_3$(alkyl)$_2$), diarylphosphonooxy group (—OPO$_3$(aryl)$_2$), alkylarylphosphonooxy group (—OPO$_3$(alkyl)(aryl)), monoalkylphosphonooxy group (—OPO$_3$H(alkyl)) and conjugate base groups thereof (hereinafter, referred to as an alkylphosphonateoxy group), monoarylphosphonooxy group (—OPO$_3$H(aryl)) and conjugate base groups thereof (hereinafter, referred to as an arylphosphonateoxy group), a cyano group, a nitro group, an aryl group, a heteroaryl group, an alkenyl group, an alkynyl group, and a silyl group.

Specific examples of the alkyl group in these substituents include the above-described alkyl groups, which may be further substituted.

Specific examples of the aryl group include a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxyphenylcarbonyl group, a phenoxycarbonylphenyl group, a N-phenylcarbamoylphenyl group, a phenyl group, a cyanophenyl group, a sulfophenyl group, a sulfonatephenyl group, a phosphonophenyl group, and a phosphonatephenyl group.

The heteroaryl group is a group derived from a monocyclic or polycyclic aromatic ring including at least one of a nitrogen atom, an oxygen atom, and a sulfur atom. Particularly preferable examples of the heteroaryl ring in the heteroaryl group include thiophene, thiathrene, furan, pyran, isobenzofuran, chromene, xanthene, phenoxazine, pyrrole, pyrazole, isothiazole, isoxazole, pyrazine, pyrimidine, pyridazine, indolysine, isoindolysine, indoyl, indazole, purine, quinolizine, isoquinoline, phthalazine, naphthyridine, quinazoline, cinnoline, pteridine, carbazole, carboline, phenanthroline, acridine, perimidine, phenanthroline, phthalazine, phenarsazine, phenoxazine, and furazan, which may be further condensed with a benzene ring, or may be substituted.

Examples of the alkenyl group include a vinyl group, a 1-propenyl group, a 1-butenyl group, a cinnamyl group, and a 2-chloro-1-ethenyl group, and examples of the alkynyl group include an ethynyl group, a 1-propynyl group, a 1-butynyl group, and a trimethylsilylethynyl group. Examples of G$^1$ in the acyl group (G$^1$CO—) include a hydrogen atom, and the above-described alkyl groups and aryl groups. Among these substituents, more preferable examples include a halogen atom (—F, —Br, —Cl, and —I), an alkoxy group, an aryloxy group, an alkylthio group, an arylthio group, a N-alkylamino group, a N,N-dialkylamino group, an acyloxy group, a N-alkylcarbamoyloxy group, a N-arylcarbamoyloxy group, an acylamino group, a formyl group, an acyl group, a carboxyl group, an alkoxycarbonyl group, an aryloxycarbonyl group, a carbamoyl group, a N-alkylcarbamoyl group, a N,N-dialkylcarbamoyl group, a N-arylcarbamoyl group, a N-alkyl-N-arylcarbamoyl group, a sulfo group, a sulfonate group, a sulfamoyl group, a N-alkylsulfamoyl group, a N,N-dialkylsulfamoyl group, a N-arylsulfamoyl group, a N-alkyl-N-arylsulfanoyl group, a phosphono group, a phosphonate group, a dialkylphosphono group, a diarylphosphono group, a monoalkylphosphono group, an alkylphosphonate group, a monoarylphosphono group, an arylphosphonate group, a phosphonooxy group, a phosphonateoxy group, an aryl group, an alkenyl group, and an alkylidene group (e.g. methylene group).

Examples of the alkylene group in the substituted alkyl group include a divalent organic residue obtained by removing any one of the hydrogen atoms on the above-described alkyl group having 1 to 20 carbon atoms, and preferable examples thereof include a linear alkylene group having 1 to 12 carbon atoms, a branched alkylene group having 3 to 12 carbon atoms, and a cyclic alkylene group having 5 to 10 carbon atoms.

Specific examples of the substituted alkyl group which is obtained by combining the above-described substituent with an alkylene group and is preferable as $R^{51}$, $R^{52}$, or $R^{53}$ include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, a N-cyclohexylcarbamoyloxyethyl group, a N-phenylcarbamoyloxyethyl group, an acetylaminoethyl group, a N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, a N-methylcarbamoylethyl group, a N,N-dipropylcarbamoylmethyl group, a N-(methoxyphenyl)carbamoylethyl group, a N-methyl-N-(sulfophenyl)carbamoylmethyl group, a sulfobutyl group, a sulfonatepropyl group, a sulfonatebutyl group, a sulfamoylbutyl group, a N-ethylsulfamoylmethyl group, a N,N-dipropylsulfamoylpropyl group, a N-tolylsulfamoylpropyl group, a N-methyl-N-(phosphonophenyl)sulfamoyloctyl group, a phosphonobutyl group, a phosphonatehexyl group, a diethylphosphonobutyl group, a diphenylphosphonopropyl group, a methylphosphonobutyl group, a methylphosphonatebutyl group, a tolylphosphonohexyl group, a tolylphosphonatehexyl group, a phosphonooxypropyl group, a phosphonateoxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group, and a 3-butynyl group.

Specific examples of the aryl group preferable as $R^{51}$, $R^{52}$, or $R^{53}$ include a condensed ring formed by 1 to 3 benzene rings, and a condensed ring formed by a benzene ring and a 5-membered unsaturated ring, and specific examples thereof include a phenyl group, a naphthyl group, an anthryl group, a phenanthryl group, an indenyl group, an acenaphthenyl group, and a fluorenyl group. Among these groups, a phenyl group, and a naphthyl group are more preferable.

Specific examples of the substituted aryl group preferable as $R^{51}$, $R^{52}$, or $R^{53}$ include the above-described aryl group having a monovalent group of nonmetal atoms (wherein the monovalent group is not a hydrogen atom) as a substituent on the carbon atom forming the ring. Preferable examples of the substituent include the above-described alkyl groups, substituted alkyl groups, and examples of the substituents in the alkyl groups. Specific preferable examples of the substituted aryl group include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, an ethylaminophenyl group, a diethylaminophenyl group, a morpholinophenyl group, an acetyloxyphenyl group, a benzoyloxyphenyl group, a N-cyclohexylcarbamoyloxyphenyl group, a N-phenylcarbamoyloxyphenyl group, an acetylaminophenyl group, a N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, a N-methylcarbamoylphenyl group, a N,N-dipropylcarbamoylphenyl group, a N-(methoxyphenyl)carbamoylphenyl group, a N-methyl-N-(sulfophenyl)carbamoylphenyl group, a sulfophenyl group, a sulfonatephenyl group, a sulfamoylphenyl group, a N-ethylsulfamoylphenyl group, a N,N-dipropylsulfamoylphenyl group, a N-tolylsulfamoylphenyl group, a N-methyl-N-(phosphonophenyl)sulfamoylphenyl group, a phosphonophenyl group, a phosphonatephenyl group, a diethylphosphonophenyl group, a diphenylphosphonophenyl group, a methylphosphonophenyl group, a methylphosphonatephenyl group, a tolylphosphonophenyl group, a tolylphosphonatephenyl group, an allylphenyl group, a 1-propenylmethylphenyl group, a 2-butenylphenyl group, a 2-methylallylphenyl group, a 2-methylpropenylphenyl group, a 2-propynylphenyl group, a 2-butynylphenyl group, and 3-butynylphenyl group.

Particularly preferable examples of $R^{52}$ and $R^{53}$ include a substituted or unsubstituted alkyl group. More preferable examples of $R^{51}$ include a substituted or unsubstituted aryl group. The reason for this is not evident, but is considered that these substituents particularly strengthen the interaction between electrons excited upon light absorption and the initiator compound, which improves the efficiency of the initiator compound to generate a radical, acid, or base.

Next, $A^5$ in Formula (5) will be described. $A^5$ represents an aromatic ring which may have a substituent or a heterocycle which may have a substituent. Specific examples of the aromatic ring which may have a substituent or the heterocycle which may have a substituent are the same as those exemplified in the explanation of $R^{51}$, $R^{52}$, or $R^{53}$ in Formula (5). Especially, preferable examples of $A^5$ include an aryl group having an alkoxy group, a thioalkyl group, or an amino group. Particularly preferable examples of $A^5$ include an aryl group having an amino group.

Next, $Y^5$ in Formula (5) will be described. $Y^5$ represents a group of nonmetal atoms which forms a heterocycle together with $A^5$ and any carbon atom adjacent to $Y^5$. The heterocycle is preferably a 5-, 6- or 7-membered (preferably, 5- or 6-membered), nitrogen- or sulfur-containing heterocycle which may have a condensed ring.

Examples of the nitrogen-containing heterocycle include those known as a component of basic nuclei in melocyanine dyes described in L. G. Brooker et al., J. Am, Chem. Soc., vol. 73 (1951), pp. 5326-5358 and reference documents cited therein.

Specific examples thereof include thiazoles (such as thiazole, 4-methylthiazole, 4-phenylthiazole, 5-methylthiazole, 5-phenylthiazole, 4,5-dimethylthiazole, 4,5-diphenylthiazole, 4,5-di(p-methoxyphenylthiazole), 4-(2-thienyl)thiazole, and 4,5-di(2-furyl)thiazole), benzothiazoles (such as benzothiazole, 4-chlorobenzothiazole, 5-chlorobenzothiazole, 6-chlorobenzothiazole, 7-chlorobenzothiazole, 4-methylbenzothiazole, 5-methylbenzothiazole, 6-methylbenzothiazole, 5-bromobenzothiazole, 4-phenylbenzothiazole, 5-phenylbenzothiazole, 4-methoxybenzothiazole, 5-methoxybenzothiazole, 6-methoxybenzothiazole, 5-iodobenzothiazole, 6-iodobenzothiazole, 4-ethoxybenzothiazole, 5-ethoxybenzothiazole, tetrahydrobenzothiazole, 5,6-dimethoxybenzothiazole, 5,6-dioxymethylene benzothiazole, 5-hydroxybenzothiazole, 6-hydroxybenzothiazole, 6-dimethylaminobenzothiazole, and 5-ethoxycarbonylbenzothiazole), naphthothiazoles (such as naphtho[1,2]thiazole, naphtho[2,1]thiazole, 5-methoxynaphtho[2,1]thiazole, 5-ethoxynaphtho[2,1]thiazole, 8-methoxynaphtho[1,2]thiazole and 7-methoxynaphtho[1,2]thiazole), thianaphtheno-7',6',4,5- thiazoles (such as 4'-methoxythianaphtheno-7',6',4,5-thiazole), oxazoles (such as 4-methyloxazole, 5-methyloxazole, 4-phenyloxazole, 4,5-diphenyloxazole, 4-ethyloxazole, 4,5-dimethyloxazole, and 5-phenyloxazole), benzoxazoles (such as benzoxazole, 5-chlorobenzoxazole, 5-methyl benzoxazole, 5-phenylbenzoxazole, 6-methylbenzoxazole, 5,6-dimethylbenzoxazole, 4,6-dimethylbenzoxazole, 6-methoxybenzoxazole, 5-methoxybenzoxazole, 4-ethoxybenzoxazole, 5-chlorobenzoxazole, 6-methoxybenzoxazole, 5-hydroxybenzoxazole, and 6-hydroxybenzoxazole), naphthooxazoles (such as naphtho[1,2]oxazole and naphtho[2,1]oxazole), selenazoles(such as 4-methylselenazole and 4-phenylselenazole), benzoselenazoles (such as benzoselenazole, 5-chlorobenzoselenazole, 5-methoxybenzoselenazole, 5-hydroxybenzoselenazole, and tetrahydrobenzoselenazole), naphthoselenazoles (such as naphtho[1,2]selenazole, and naphtho[2,1]selenazole), thiazolines (such as thiazoline, 4-methylthiazoline, 4,5-dimethylthiazoline, 4-phenylthiazoline, 4,5-di(2-furyl)thiazoline, 4,5-diphenylthiazoline, and 4,5-di(p-methoxyphenyl)thiazoline), 2-quinolines (such as quinoline, 3-methylquinoline, 5-methylquinoline, 7-methylquinoline, 8-methylquinoline, 6-chloroquinoline, 8-chloroquinoline, 6-methoxyquinoline, 6-ethoxyquinoline, 6-hydroxyquinoline, and 8-hydroxyquinoline), 4-quinolines (e.g. quinoline, 6-methoxyquinoline, 7-methylquinoline, and 8-methylquinoline), 1-isoquinolines (such as isoquinoline and 3,4-dihydroisoquinoline), 3-isoquinolines (such as isoquinoline), benzimidazoles (such as 1,3-dimethylbenzimidazole, 1,3-diethylbenzimidazole, and 1-ethyl-3-phenylbenzimidazole), 3,3-dialkylindolenines (such as 3,3-dimethylindolenine, 3,3,5-trimethylindolenine, and 3,3,7-trimethylindolenine), 2-pyridines (such as pyridine and 5-methyl pyridine), and 4-pyridine (such as pyridine). These ring substituents may be combined with each other to form a ring.

Examples of the sulfur-containing heterocycle include dithiol partial structures in dyes described in JP-A No. 3-296759.

Specific examples thereof include benzodithiols (such as benzodithiol, 5-t-butylbenzodithiol, and 5-methylbenzodithiol), naphthodithiols (such as naphtho[1,2]dithiol, and naphtho[2,1]dithiol), dithiols (such as 4,5-dimethyldithiols, 4-phenyldithiols, 4-methoxycarbonyldithiols, 4,5-dimethoxycarbonyldithiols, 4,5-diethoxycarbonyldithiols, 4,5-ditrifluoromethyldithiol, 4,5-dicyanodithiol, 4-methoxycarbonylmethyldithiol, and 4-carboxymethyldithiol).

Of the examples of the nitrogen- or sulfur-containing heterocycle that is formed by $Y^5$ together with $A^5$ and the carbon atoms adjacent to $Y^5$ in Formula (5), a dye having a structure represented by the following partial structural Formula (6) is particularly preferable since the dye has a high sensitizing capability and provides a photosensitive composition having extremely excellent storage stability.

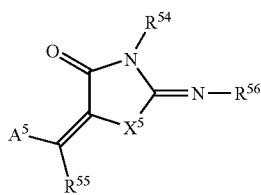

Formula (6)

In Formula (6), $A^5$ represents a substituted or unsubstituted aromatic ring or a substituted or unsubstituted heterocycle; $X^5$ represents an oxygen atom, a sulfur atom, or —N($R^{51}$)—; $R^{51}$, $R^{54}$, $R^{55}$, and $R^{56}$ each independently represent a hydrogen atom or a monovalent group of nonmetal atoms; and $A^5$, and $R^{51}$, $R^{54}$, $R^{55}$ or $R^{56}$ may be bonded to each other to form an aliphatic or aromatic ring.

In Formula (6), $A^5$ and $R^{51}$ have the same meanings as $A^5$ and $R^{51}$ in Formula (5), respectively. $R^{54}$, $R^{55}$ and $R^{56}$ have the same meanings as $R^{52}$, $R^{53}$ and $R^{51}$ in Formula (5), respectively.

The compound represented by Formula (5) is more preferably a compound represented by the following Formula (7).

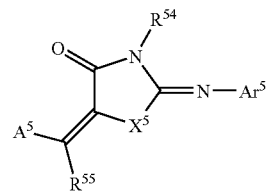

Formula (7)

In Formula (7), $A^5$ represents a substituted or unsubstituted aromatic ring or a substituted or unsubstituted heterocycle; $X^5$ represents an oxygen atom, a sulfur atom, or —N($R^{51}$)—; $R^{51}$, $R^{54}$, and $R^{55}$ each independently represent a hydrogen atom or a monovalent group of nonmetal atoms; $A^5$ and any one of $R^{51}$, $R^{54}$ and $R^{55}$ may be bonded to each other to form an aliphatic or aromatic ring; and $Ar^5$ represents a substituted aromatic ring or a substituted heterocycle, provided that the total number of the Hammett value(s) of the substituent(s) present on the skeleton of $Ar^5$ is larger than zero. The phrase "the total number of the Hammett values is larger than zero" indicates that when $Ar^5$ has one substituent, the Hammett value of the substituent is larger than zero, and when $Ar^5$ has plural substituents, the total number of the Hammett values of the substituents is larger than zero.

In Formula (7), $A^5$ and $R^{51}$ have the same meanings as $A^5$ and $R^{51}$ in Formula (5), respectively; $R^{54}$ has the same meaning as $R^{52}$ in Formula (5); and $R^{55}$ has the same meaning as $R^{53}$ in Formula (5). $Ar^5$ represents a substituted aromatic ring or a substituted heterocycle, and specific examples thereof include the specific examples of the substituted aromatic ring or substituted heterocycle, described with respect to $A^5$ in Formula (5), provided that the total of the Hammett value(s) of the substituent(s) that may be introduced onto the skeleton of $Ar^5$ in Formula (7) is larger than zero. Examples of the substituent(s) that may be introduced onto the skeleton of $Ar^5$ include halogen atoms, trifluoromethyl, carbonyl, ester, nitro, cyano, sulfoxide, amide, and carboxyl groups. The Hammett values of these substituents are as follows: trifluoromethyl groups (—$CF_3$, m: 0.43, p: 0.54), carbonyl groups (e.g., —COH, m: 0.36, p: 0.43), ester groups (e.g., —$COOCH_3$, m: 0.37, p: 0.45), halogen atoms (e.g., Cl, m: 0.37, p: 0.23), cyano groups (—CN, m: 0.56, p: 0.66), sulfoxide groups (e.g., —$SOCH_3$, m: 0.52, p: 0.45), amide groups (e.g., —NHCOCH_3, m: 0.21, p: 0.00), and carboxyl groups (—COOH, m: 0.37, p: 0.45). In each of the above parentheses, the position(s) on the aryl skeleton, into which the corresponding substituent is introduced, and the Hammett value of the substituent are indicated. For example, "(m: 0.50)" indicates that when the corresponding substituent is introduced into a meta position on an aryl skeleton, the substituent has a Hammett value of 0.50. A preferable example of $Ar^5$ is a substituted phenyl group, and preferable examples of the substituent on the skeleton of Ar⁵ include ester and cyano groups. The position of the substituent on the skeleton of Ar⁵ is preferably an ortho position.

Hereinafter, specific preferable examples (i.e. Exemplary Compounds D1 to D57) of the sensitizing dye represented by Formula (5) will be shown, but the present invention is not limited thereto. It should be noted that, among the compounds shown below, Exemplary Compounds D2, D6, D10, D18, D21, D28, D31, D33, D35, D38, D41, and D45 to D57 are within the scope of Formula (6).

(D17)
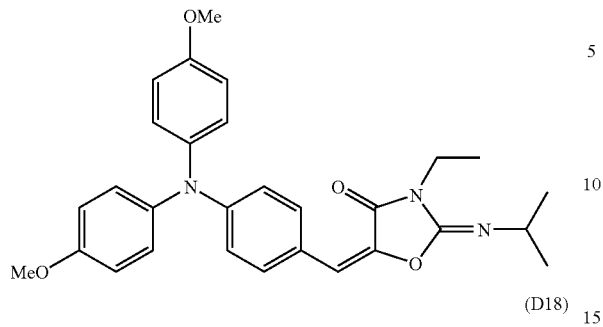
(D18)
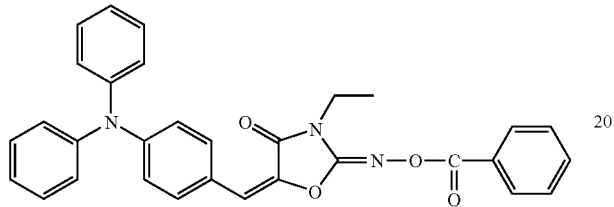
(D19)
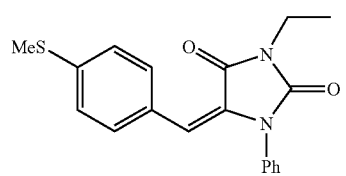
(D20)
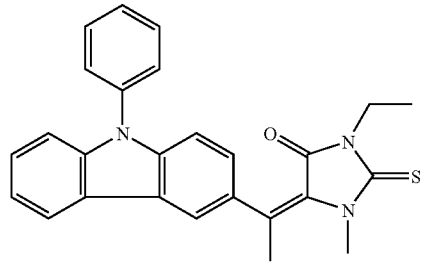
(D21)
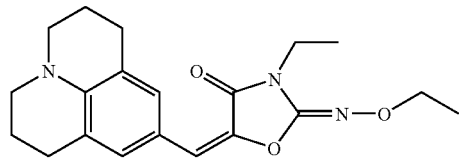
(D22)
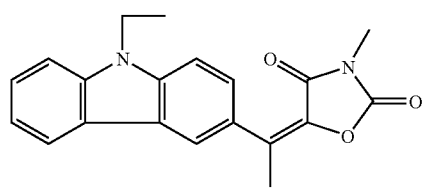
(D23)
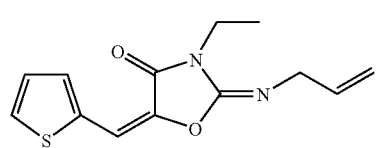
(D24)
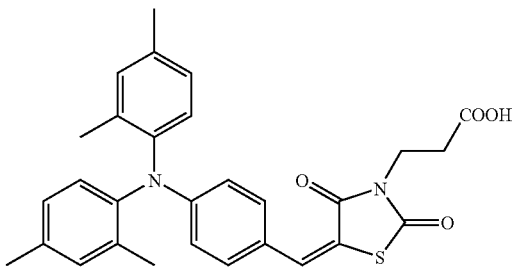
(D25)
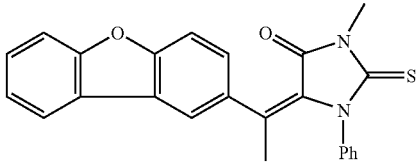
(D26)
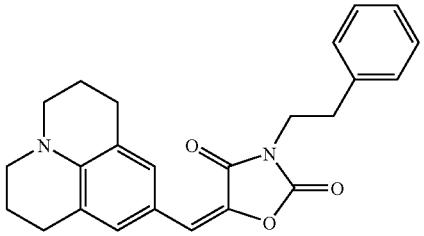
(D27)
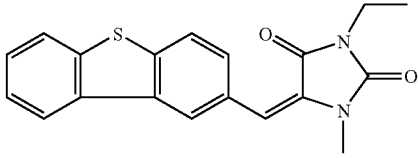
(D28)
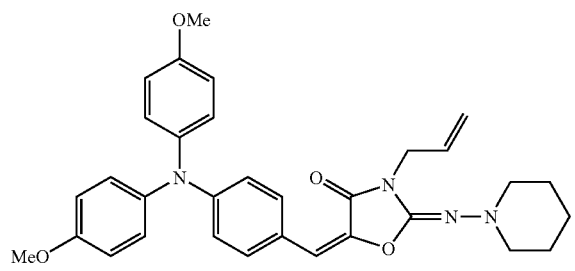
(D29)
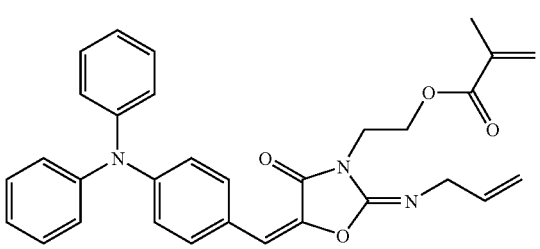
(D30)
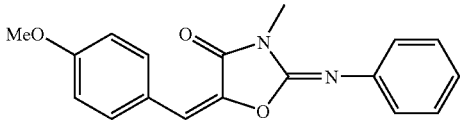

-continued
(D31)
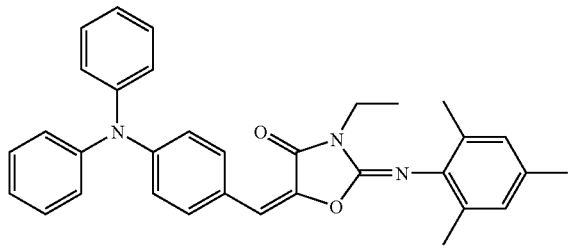
(D32)
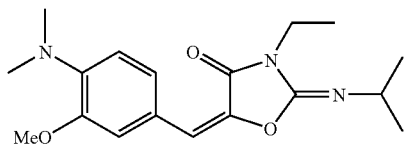
(D33)
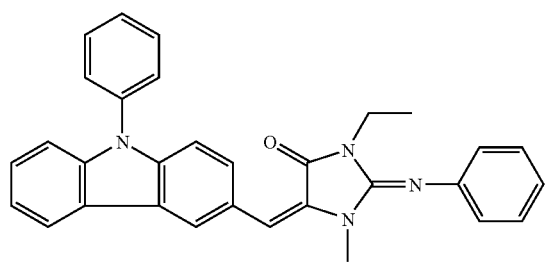
(D34)
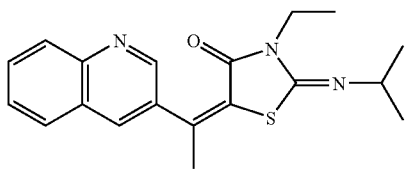
(D35)
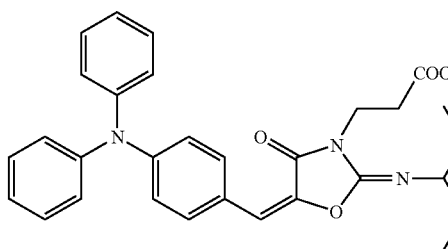
(D36)
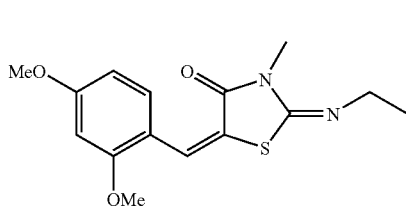
(D37)
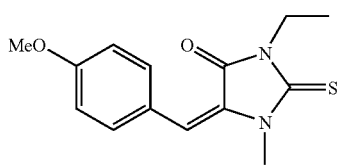
-continued
(D38)
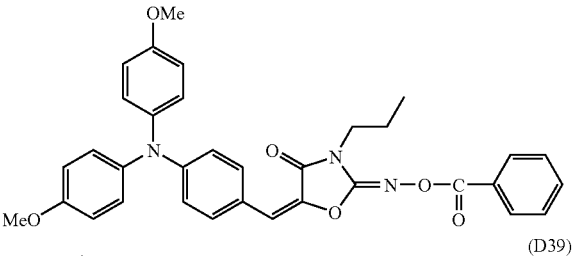
(D39)
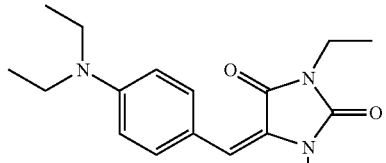
(D40)
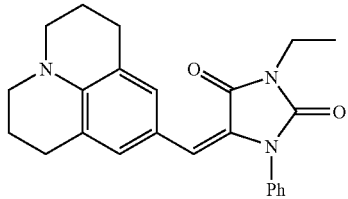
(D41)
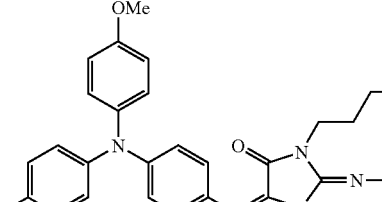
(D42)
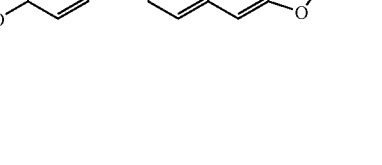
(D43)
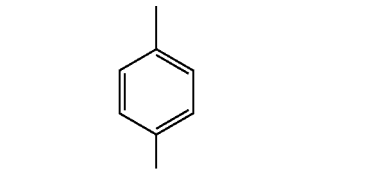

-continued
(D44)
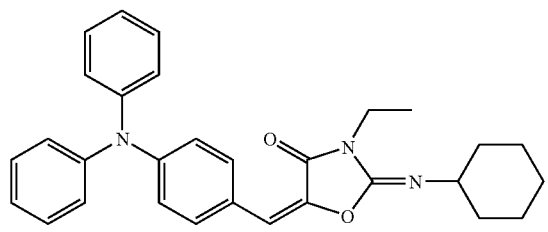
(D45)
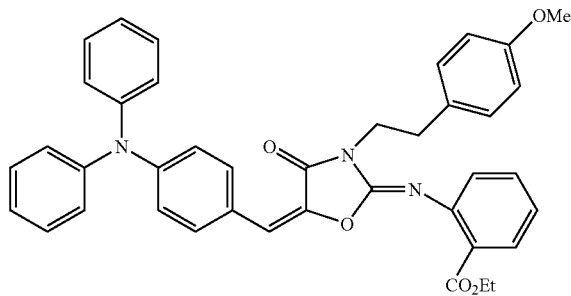
(D46)
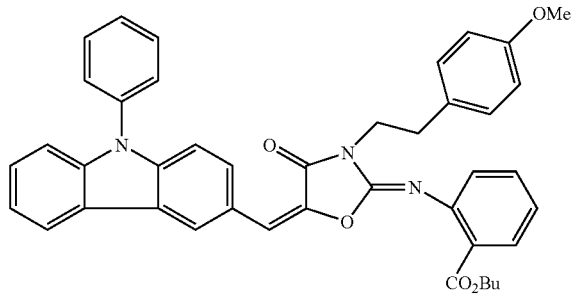
(D47)
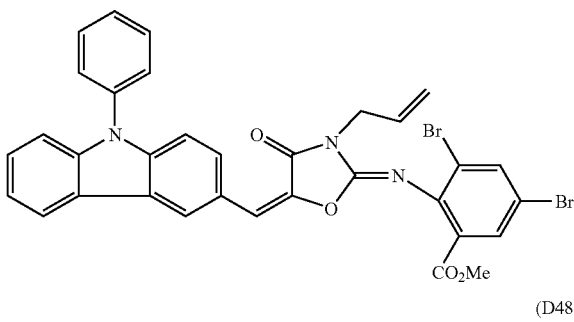
(D48)
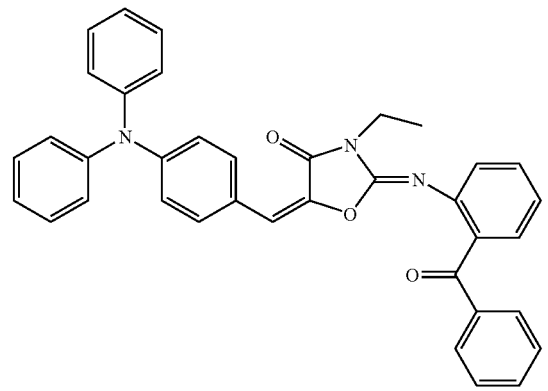
-continued
(D49)
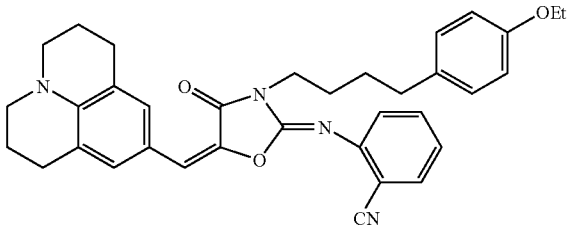
(D50)
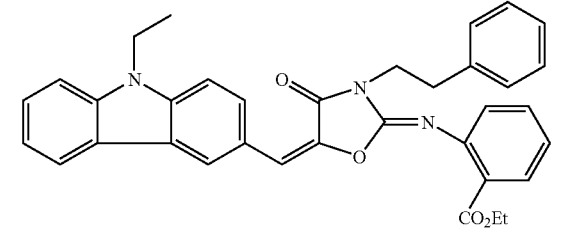
(D51)
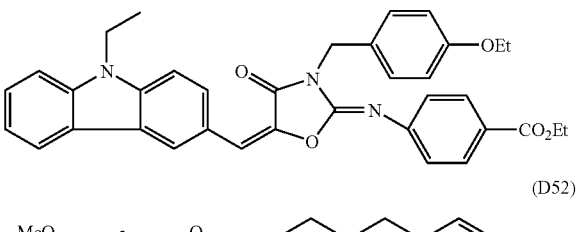
(D52)
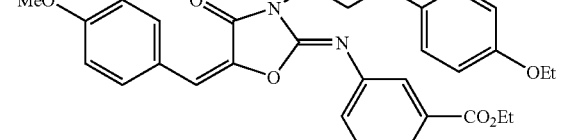
(D53)
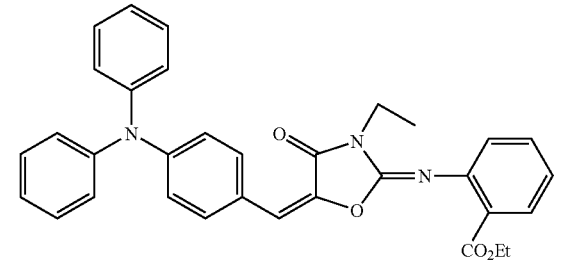
(D54)

(D55)

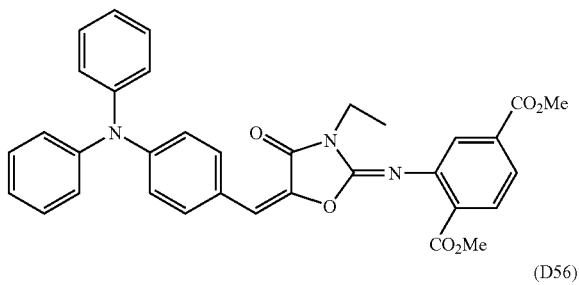

(D56)

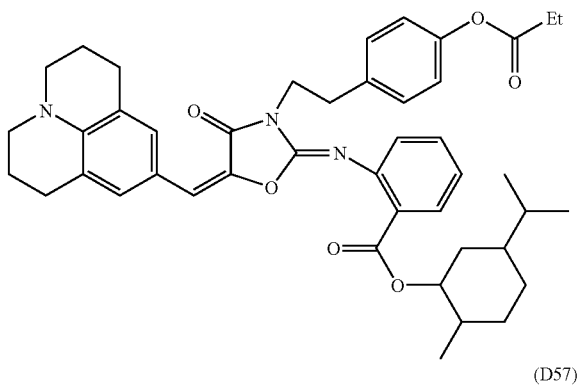

(D57)

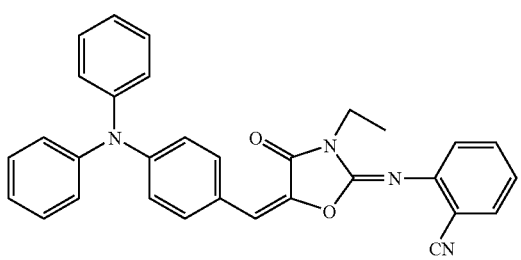

The synthesis of the compound represented by Formula (5) will be described.

The compound represented by Formula (5) is usually prepared by condensation reaction between an acidic nucleus having an active methylene group and a substituted or unsubstituted aromatic ring or heterocycle, which can be synthesized in accordance with JP-B No. 59-28329. Examples of the reaction method include condensation reaction between an acidic nuclear compound and a basic nuclear material having an aldehyde group or a carbonyl group on the heterocycle, as shown in the following Reaction Formula (1). The condensation reaction is conducted, as necessary, in the presence of a base. The base may be freely selected from generally used bases such as amines, pyridines (e.g. trialkylamine, dimethylamino pyridine, and diazabicycloundecene DBU), metal amides (e.g. lithium diisopropylamide), metal alkoxides (e.g. sodium methoxide and potassium-t-butoxide), and metal hydrides (e.g. sodium hydride and potassium hydride).

Reaction Formula (1)

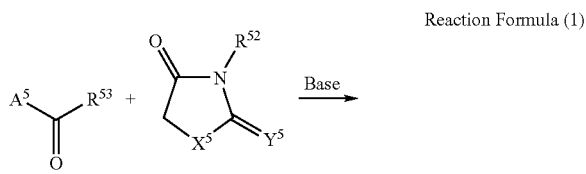

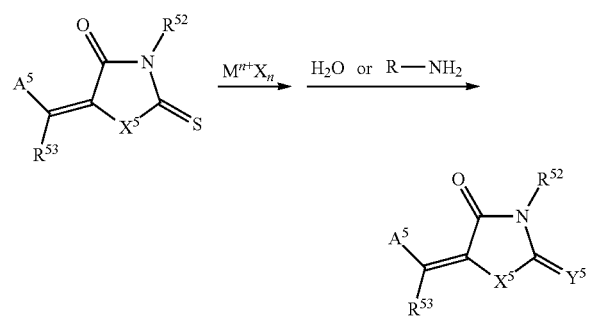

Alternatively, the synthesis method may be a method according to the following Reaction Formula (2). Specifically, an acidic nuclear compound wherein $Y^5$ is a sulfur atom as the acidic nuclear compound in Reaction Formula (1) is used as a starting material. The same procedures as in Reaction Formula (1) are conducted from start of the reaction up to the procedure of synthesizing a dye precursor by condensation reaction between the compound as the starting material and a basic nuclear material having an aldehyde or carbonyl group on a heterocycle. Thereafter, the dye precursor is further reacted with a metal salt capable of chemically interacting with a sulfur atom to form a metal sulfide, and water or a primary amine compound (R—$NH_2$ wherein R represents a monovalent group of nonmetal atoms).

Of these methods, the method according to the reaction represented by Reaction Formula (2) is particularly preferable from the viewpoint of synthesis efficiency because the yield of the product obtained by the reaction is high. The reaction represented by Reaction Formula (2) is particularly useful for synthesizing the compound represented by Formula (6).

Reaction Formula (2)

In Reaction Formula (2), $M^{n+}X_n$ represents a metal salt which chemically interacts with a sulfur atom in the thiocarbonyl group to form a metal sulfide. Specific examples of the compound include AgBr, AgI, AgF, AgO, AgCl, $Ag_2O$, $Ag(NO_3)$, $AgSO_4$, $AgNO_2$, $Ag_2CrO_4$, $Ag_3PO_4$, $Hg_2(NO_3)_2$, $HgBr_2$, $Hg_2Br_2$, HgO, $HgI_2$, $Hg(NO_3)_2$, $Hg(NO_2)_2$, $HgBr_2$, $HgSO_4$, $Hg_2I_2$, $Hg_2SO_4$, $Hg(CH_3CO_2)_2$, AuBr, $AuBr_3$, AuI, $AuI_3$, $AuF_3$, $Au_2O_3$, AuCl, $AuCl_3$, CuCl, CuI, $CuI_2$, $CuF_2$, CuO, $CuO_2$, $Cu(NO_3)_2$, $CuSO_4$, and $Cu_3(PO_4)_2$, in which M is Al, Au, Ag, Hg, Cu, Zn, Fe, Cd, Cr, Co, Ce, Bi, Mn, Mo, Ga, Ni, Pd, Pt, Ru, Rh, Sc, Sb, Sr, Mg, Ti, or the like, and X is F, Cl, Br, I, $NO_3$, $SO_4$, $NO_2$, $PO_4$, $CH_3CO_2$, or the like. Among them, a silver salt is a most preferable metal salt because it readily interacts with a sulfur atom.

The sensitizing dye represented by Formula (5) used in the invention can be subjected to various chemical modification to improve the property of the recording layer. For example, the sensitizing dye may be combined with an addition polymerizable compound structure (e.g. an acryloyl group or a methacryloyl group) through a covalent bond, an ionic bond, a hydrogen bond, or the like to increase the strength of the light-exposed film and suppress the unnecessary deposition of dyes from the light-exposed film.

Further, photosensitivity can be remarkably enhanced under particularly low concentration of an optical initiation system, by bonding the sensitizing dye with the above-described radical generating partial structure in the initiator compound (e.g. reduction decomposable sites such as alkyl halide, onium, peroxide, and biimidazole, and oxidation disintegrating sites such as borate, amine, trimethylsilylmethyl, carboxymethyl, carbonyl, and imine).

Further, in the case where the image recording material of the invention is used as a planographic printing plate precursor having a negative-working recording layer, which is a preferable aspect of the invention, it is effective to introduce a hydrophilic site (acid groups or polar groups such as a carboxyl group and esters thereof, a sulfonic group and esters thereof, and an ethylene oxide group). Particularly, an ester type hydrophilic group exhibits excellent compatibility in the recording layer due to its relatively hydrophobic structure, and generates an acid group upon hydrolysis to increase its hydrophilicity in a developer.

Additionally, for example, a substituent may be introduced as appropriate to improve compatibility in the recording layer and to suppress crystal deposition. For example, in a certain kind of photosensitive system, an unsaturated bond such as an aryl group or an allyl group may be considerably effective at improving the compatibility. Besides, crystal deposition is remarkably suppressed by introducing steric hindrance between the $\pi$ planes of the dye through introduction of a branched alkyl structure or other method. Further, adhesiveness of a metal, metal oxide and the like to an inorganic substance is improved by introducing a phosphonate group, an epoxy group, a trialkoxysilyl group, or the like. Alternatively, polymerization of the sensitizing dye or other methods may be used according to the intended use.

It is preferable to use, as the sensitizing dye used in the invention, at least one sensitizing dye represented by Formula (5). As far as the dye represented by Formula (5) is used, the particular manner of use thereof may be selected as appropriate in accordance with the intended function and/or performance of a finally-obtained photosensitive material. For example, it is possible to select, as appropriate, which particular structure of the dye is used, with reference to the above-described dye modifications, whether a single dye is used or a combination of two or more different dyes are used, and the amount of dye added. As an example, by using a combination of two or more sensitizing dyes, the compatibility of the dye with the recording layer can be increased.

An important factor for the selection of the sensitizing dye is the molar absorption coefficient thereof at the wavelength of light emitted from a light source utilized, in addition to the photosensitivity. It is economically advantageous to use a dye having a large molar absorption coefficient because the addition amount of the dye can be relatively small. The use of such a dye is also advantageous from viewpoint of the film-related properties of the photosensitive layer.

In addition to the sensitizing dye represented by Formula (5), a different, conventional sensitizing dye may be used in the invention as far as the advantageous effects of the invention are not impaired.

Because the photosensitivity and resolution of the recording layer and the film properties of the recording layer are greatly influenced by the absorbance at the light source wavelength, the amount of a sensitizing dye is appropriately determined from the viewpoint of these factors.

For example, in a region where the absorbance is as low as 0.1 or less, the sensitivity lowers and the resolution is reduced due to the influence of halation. For example, for curing a film as thick as 5 μm or more, however, the degree of curing may be increased rather at such a low absorbance. In a region where the absorbance is as high as 3 or more, most of the light is absorbed at the surface of the recording layer and, as a result, curing in the internal portion is inhibited. Therefore, when the curable composition of the invention is used as a planographic printing plate precursor, the film strength and the adhesiveness to the support may become insufficient.

When the curable composition of the invention is used for, for example, a planographic printing plate precursor having a recording layer having a relatively thin layer thickness, the addition amount of the sensitizing dye is such that the absorbance of the recording layer is preferably within the range of from 0.1 to 1.5, and more preferably from 0.25 to 1. Since the absorbance is determined in accordance with the addition amount of the sensitizing dye and the thickness of the recording layer, a desired absorbance may be obtained by controlling the addition amount and the thickness. The absorbance of the recording layer may be measured by a conventional method. Examples of the measurement method include a method including forming, onto a transparent or white support, a recording layer to an appropriately determined thickness, such that the coating amount of a coating solution for the recording layer (or recording layer coating solution) after drying is within the range necessary for a planographic printing plate precursor, and then measuring the absorbance with a transmission optical densitometer, and a method including forming a recording layer onto a reflective support made of aluminum or the like, and then measuring the reflection density thereof.

When a recording layer used in the invention is used as a recording layer of a planographic printing plate precursor, the addition amount of the sensitizing dye is usually from 0.05 to 30 parts by mass, preferably from 0.1 to 20 parts by mass, and more preferably from 0.2 to 10 parts by mass, with respect to 100 parts by mass of the total solid content of the recording layer.

Infrared Absorbing Agent

When the composition of the invention is exposed to an infrared ray having a wavelength of 760 to 1200 nm from a laser, as a light source, that emits such infrared rays, the composition may also include, as a sensitizing dye, an infrared absorbing agent having an absorption maximum in this wavelength range. The infrared absorbing agent can convert an infrared ray that is absorbed therein into heat. By the heat generated at this time, the radical generator (i.e. polymerization initiator) is thermally decomposed to generate a radical. The infrared absorbing agent used in the invention may be a dye or pigment having an absorption maximum in a wavelength range from 750 to 850 nm.

The dye may be a commercially available dye or a known dye described in, for example, "Senryo Binran" (Dye Handbook) (edited by the Society of Synthetic Organic Chemistry, Japan, and published in 1970). Examples thereof include azo dyes, metal complex salt azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium salts, and metal thiolate complexes.

Specific examples thereof include cyanine dyes described in JP-A Nos. 58-125246, 59-84356, 59-202829, and 60-78787, methine dyes described in JP-A Nos. 58-173696, 58-181690, and 58-194595, naphthoquinone dyes described in 58-112793, 58-224793, 59-48187, 59-73996, 60-52940, and 60-63744, squarylium dyes described in JP-A No. 58-112792, and cyanine dyes described in GB Patent No. 434,875.

Other examples of the dye include near infrared absorbing sensitizers described in U.S. Pat. No. 5,156,938, substituted arylbenzo(thio)pyrylium salts described in U.S. Pat. No. 3,881,924, trimethinethiapyrylium salts described in JP-A No. 57-142645 (U.S. Pat. No. 4,327,169), pyrylium compounds described in JP-A Nos. 58-181051, 58-220143, 59-41363, 59-84248, 59-84249, 59-146063, and 59-146061, cyanine dyes described in JP-A No. 59-216146, pentamethinethiopyrylium salts described in U.S. Pat. No. 4,283,475, and pyrylium compounds described in JP-B Nos. 5-13514, and 5-19702. Additional examples of the dye include near infrared absorbing dyes represented by the formulae (I) and (II) described in the specification of U.S. Pat. No. 4,756,993.

Further, preferred examples of the infrared absorbing dye to be used in the invention include the following specific indolenine cyanine dyes described in JP-A No. 2002-278057.

In Formula (a), $X^1$ represents a hydrogen atom, a halogen atom, $-NAr^x{}_2$, $X^2\text{-}L^1$ or the group represented by the formula shown below. $Ar^x$ represents an aromatic hydrocarbon group having 6 to 14 carbon atoms, and the aromatic hydrocarbon group may have one or more substituents selected from the group consisting of halogen atoms, alkyl groups, allyl groups, alkenyl groups, alkynyl groups, cyano groups, carboxy groups, nitro groups, amide groups, ester groups, alkoxy groups, amino groups and heterocyclic groups, and these substituents may themselves be substituted by such a substituent as those described above. $X^2$ represents an oxygen atom, a sulfur atom or $-N(R^x)-$ wherein $R^x$ represents a hydrogen atom or a hydrocarbon group having 1 to 10 carbon atoms. $L^1$ represents a hydrocarbon group having 1 to 12 carbon atoms, an aromatic ring having a heteroatom, or a

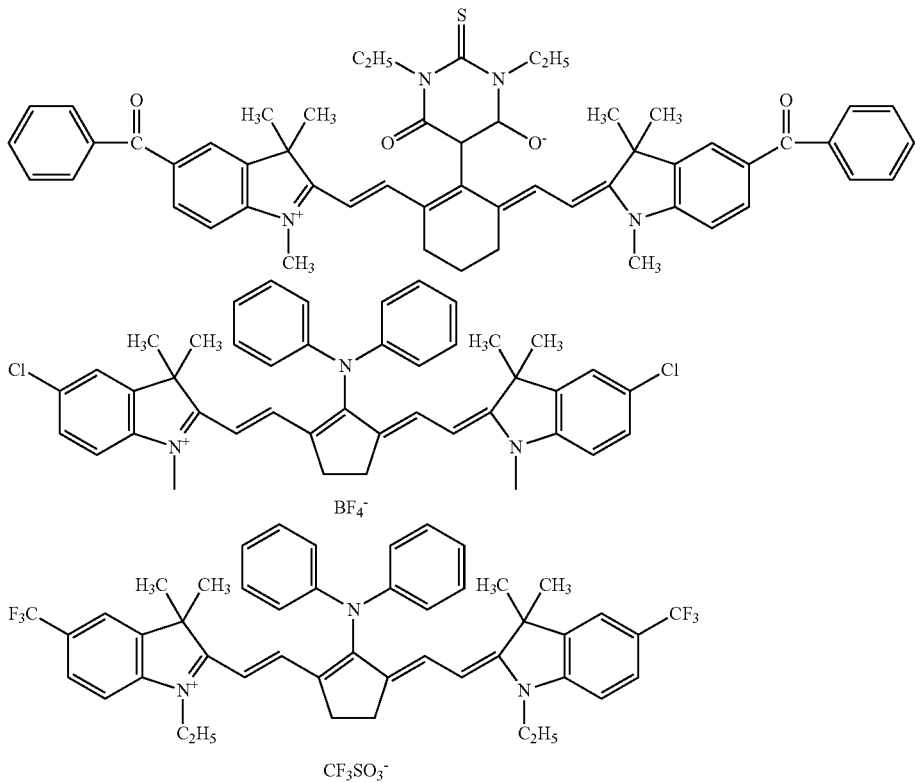

Of these dyes, preferable are cyanine dyes, squarylium dyes, pyrylium dyes, nickel thiolate complexes, and indolenine cyanine dyes. More preferable are cyanine dyes and indolenine cyanine dyes. Even more preferable are dyes represented by the following Formulae (a) to (e) from the viewpoint of sensitivity, and particularly preferable is the cyanine dye represented by the following Formula (a) since the dye provides a high polymerization activity and is excellent in stability and economical efficiency when the dye is used in the recording layer in the invention.

hydrocarbon group having 1 to 12 carbon atoms and including a heteroatom. The term "heteroatom" used herein refers to an atom selected from N, S, O, a halogen atom or Se.

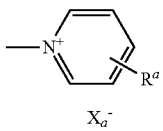

In the formula, $X_a^-$ has the same meaning as $Z_a^-$, which will be described later, and $R^a$ represents a substituent selected from the group consisting of a hydrogen atom, an alkyl group, an aryl group, a substituted or unsubstituted amino group, and a halogen atom.

$R^1$ and $R^2$ each independently represent a hydrocarbon group having 1 to 12 carbon atoms. From the viewpoint of the storage stability of a recording layer coating solution, $R^1$ and Formula (a)

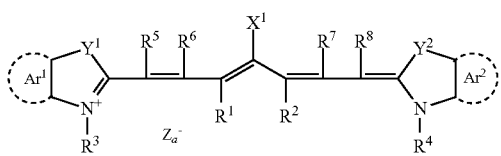

R[2] each preferably represent a hydrocarbon group having 2 or more carbon atoms, and more preferably, R[1] and R[2] are bonded to each other to form a 5-membered or 6-membered ring.

Ar[1] and Ar[2] may be the same as or different from each other, and each independently represent an aromatic hydrocarbon group which may have a substituent. The aromatic hydrocarbon group is preferably a benzene ring or a naphthalene ring. Examples of the substituent include a hydrocarbon group having 12 or less carbon atoms, a halogen atom and an alkoxy group having 12 or less carbon atoms. Y[1] and Y[2] may be the same as or different from each other, and each independently represent a sulfur atom or a dialkyl methylene group having 12 or less carbon atoms. R[3] and R[4] may be the same as or different from each other, and each independently represent a hydrocarbon group which has 20 or less carbon atoms and which may have a substituent. Examples of the substituent include an alkoxy group having 12 or less carbon atoms, a carboxyl group and a sulfo group. R[5], R[6], R[7] and R[8] may be the same as or different from each other, and each independently represent a hydrogen atom or a hydrocarbon group having 12 or less carbon atoms. Each of R[5], R[6], R[7] and R[8] is preferably a hydrogen atom because the starting material is easily available. $Z_a^-$ represents a counter anion. However, when the cyanine dye represented by Formula (a) has an anionic substituent in its structure and does not necessitate neutralization of the charge, $Z_a^-$ may not be present. From the viewpoint of the storage stability of the recording layer coating solution, $Z_a^-$ may be a halogen ion, a perchlorate ion, a tetrafluoroborate ion, a hexafluorophosphate ion or a sulfonate ion, particularly preferably a perchlorate ion, a hexafluorophosphate ion or an aryl sulfonate ion.

Examples of the cyanine dye that is represented by Formula (a) and can be preferably used in the invention include dyes described in JP-A No. 2001-133969, paragraphs [0017] to [0019], JP-A No. 2002-40638, paragraphs [0012] to [0038], and JP-A No. 2002-23360, paragraphs [0012] to [0023], and compounds shown below.

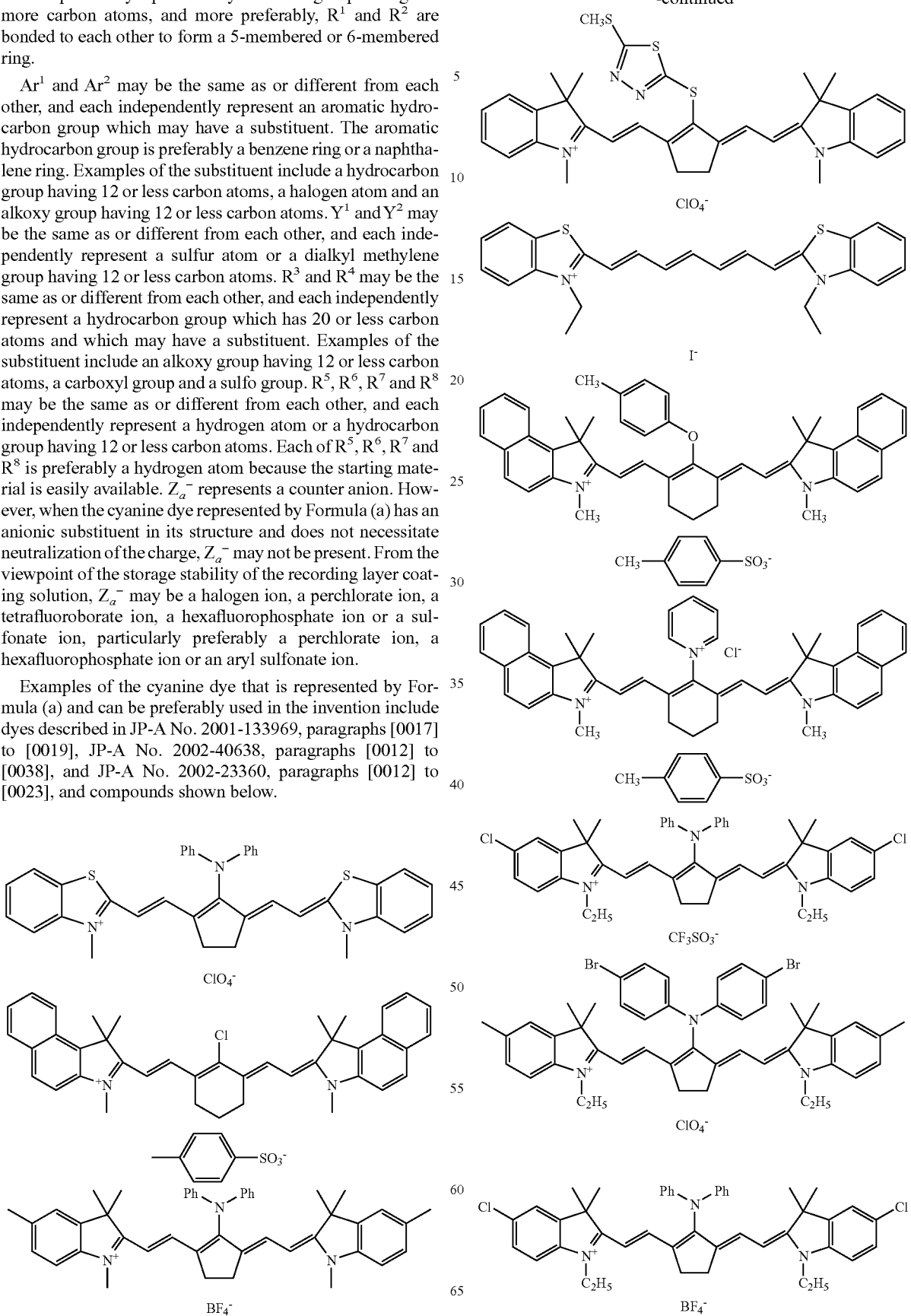

-continued

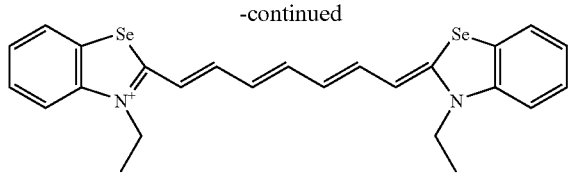

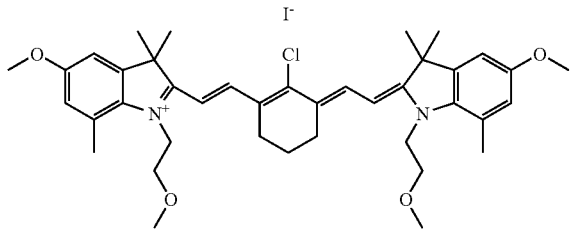

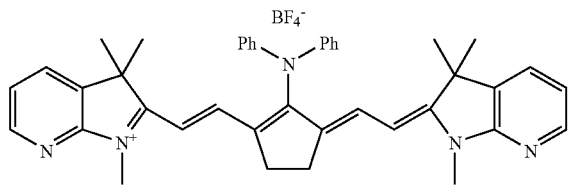

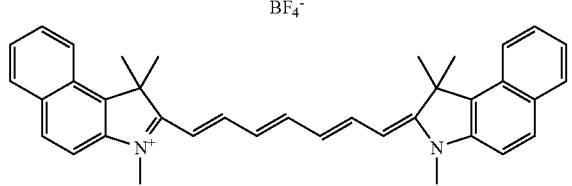

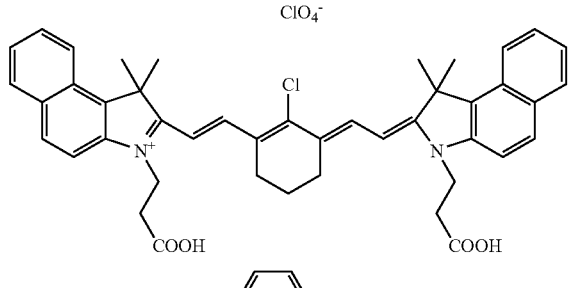

Formula (b)

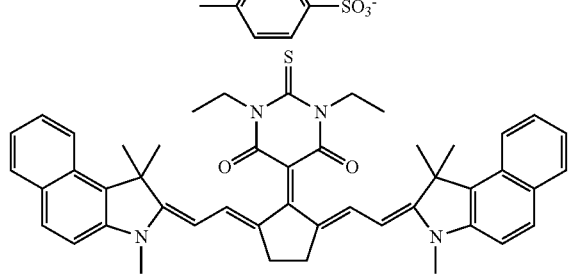

$Z_b^+$

In Formula (b), L represents a methine chain which has 7 or more conjugated carbon atoms and may have one or more substituents, and two or more of the substituents may be bonded to each other to form a cyclic structure, and $Z_b^+$ represents a counter cation. Examples of the counter cation include ammonium, iodonium, sulfonium, phosphonium and pyridinium cations, and alkali metal cations ($Na^+$, $K^+$, and $Li^+$). $R^9$ to $R^{14}$, and $R^{15}$ to $R^{20}$ each independently represent a substituent selected from the group consisting of hydrogen and halogen atoms, and cyano, alkyl, aryl, alkenyl, alkynyl, carbonyl, thio, sulfonyl, sulfinyl, oxy and amino groups, or represents a substituent obtained by combining two or three of these substituents. Two or more of these substituents may be bonded to each other to form a cyclic structure. Of the compounds represented by Formula (b), preferred is a compound in which L represents a methine chain having 7 conjugated carbon atoms and $R^9$ to $R^{14}$ and $R^{15}$ to $R^{20}$ each represent a hydrogen atom, from the viewpoints of availability of the compound and effects of the compound.

Specific examples of the dye represented by Formula (b), which can be preferably used in the invention, are shown below.

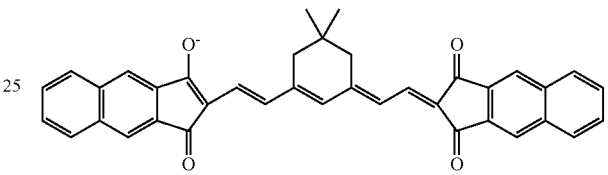

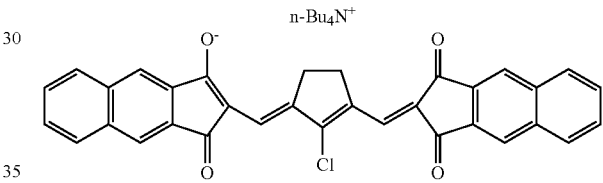

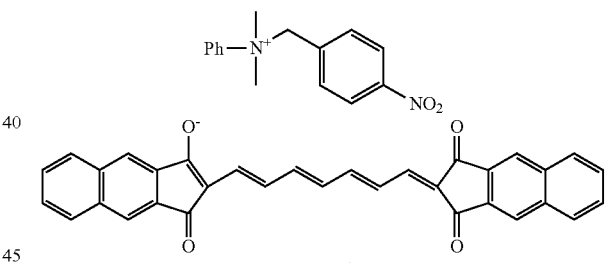

Formula (c)

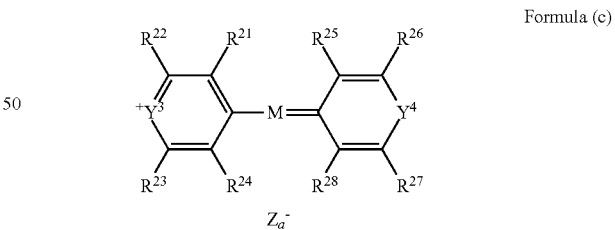

$Z_a^-$

In Formula (c), $Y^3$ and $Y^4$ each independently represent an oxygen, sulfur, selenium or tellurium atom; M represents a methine chain having 5 or more conjugated carbon atoms; and $R^{21}$ to $R^{24}$ and $R^{25}$ to $R^{28}$, which may be the same or different, each represent a hydrogen or halogen atom, or a cyano, alkyl, aryl, alkenyl, alkynyl, carbonyl, thio, sulfonyl, sulfinyl, oxy or amino group; and $Z_a^-$ represents a counter anion and has the same meaning as $Z_a^-$ in Formula (a).

Specific examples of the dye represented by Formula (c), which can be preferably used in the invention, are shown below.

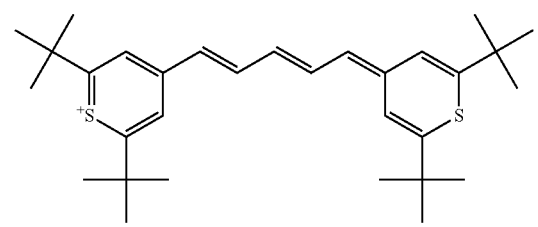

BF$_4^-$

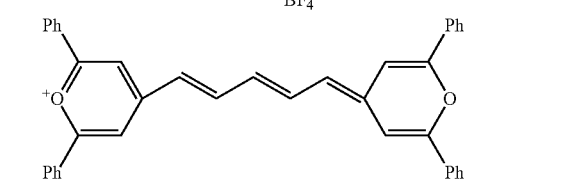

ClO$_4^-$

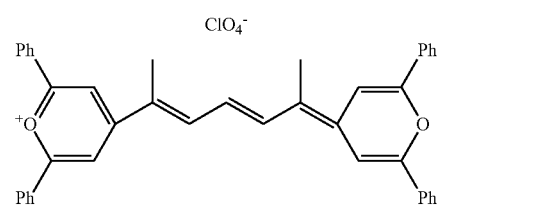

PF$_6^-$

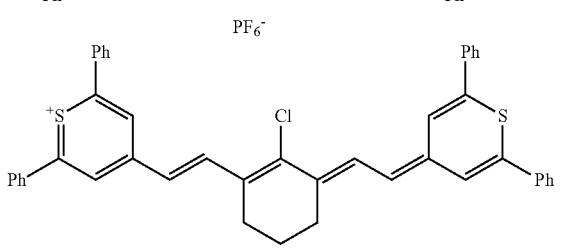

BF$_4^-$

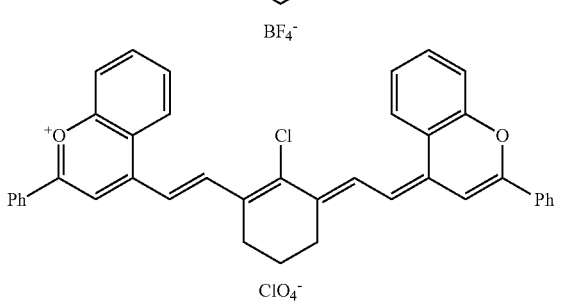

ClO$_4^-$

Formula (d)

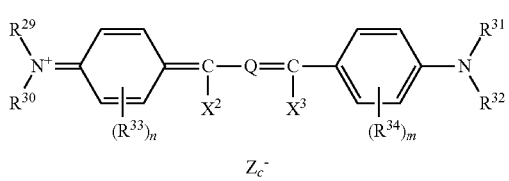

$Z_c^-$

In Formula (d), $R^{29}$ to $R^{32}$ each independently represent a hydrogen atom, or an alkyl or aryl group; $R^{33}$ and $R^{34}$ each independently represent an alkyl or substituted oxy group, or a halogen atom; and n and m each independently represent an integer of 0 to 4. $R^{29}$ and $R^{30}$ may be bonded to each other to form a ring. $R^{31}$ and $R^{32}$ may be bonded to each other to form a ring. At least one of $R^{29}$ and $R^{30}$, and $R^{33}$ may be bonded to each other to form a ring. At least one of $R^{31}$ and $R^{32}$, and $R^{34}$ may be bonded to each other to form a ring. When plural $R^{33}$s are present, plural $R^{33}$s may be bonded to each other to form a ring. When plural $R^{34}$s are present, plural $R^{34}$s may be bonded to each other to form a ring. $X^2$ and $X^3$ each independently represent a hydrogen atom, or an alkyl or aryl group provided that at least one of $X^2$ and $X^3$ represents a hydrogen atom or an alkyl group. Q represents a substituted or unsubstituted trimethine or pentamethine group, and may be combined with a bivalent organic group to form a cyclic structure. $Z_c^-$ represents a counter anion, and has the same meaning as $Z_a^-$ in Formula (a).

Specific examples of the dye represented by Formula (d), which can be preferably used in the invention, are shown below.

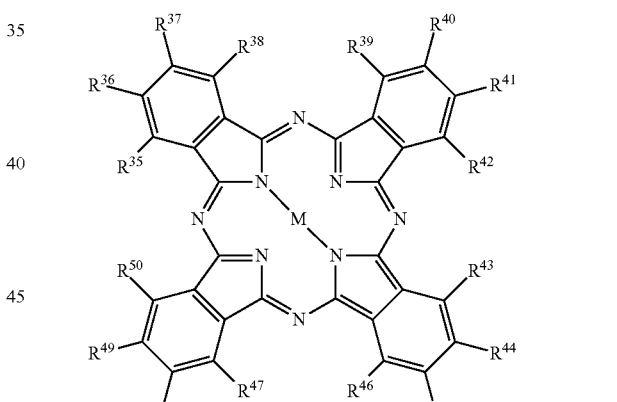

Formula (e)

In Formula (e), $R^{35}$ to $R^{50}$ each independently represent a hydrogen or halogen atom, a cyano, alkyl, aryl, alkenyl, alkynyl, hydroxyl, carbonyl, thio, sulfonyl, sulfinyl, oxy or amino group, or an onium salt structure, which may have a substituent, and M represents two hydrogen atoms, a metal atom, a halogenated metal group, or an oxy metal group. Examples of the metal atom include atoms in the group IA, the group IIA, the group IIIB, and the group IVB in the periodic table; transition metals in the first, second, third periods in the periodic table; and lanthanoid elements. In particular, preferable are copper, magnesium, iron, zinc, cobalt, aluminum, titanium, and vanadium.

Specific examples of the dye represented by Formula (e), which can be preferably used in the invention, are shown below.

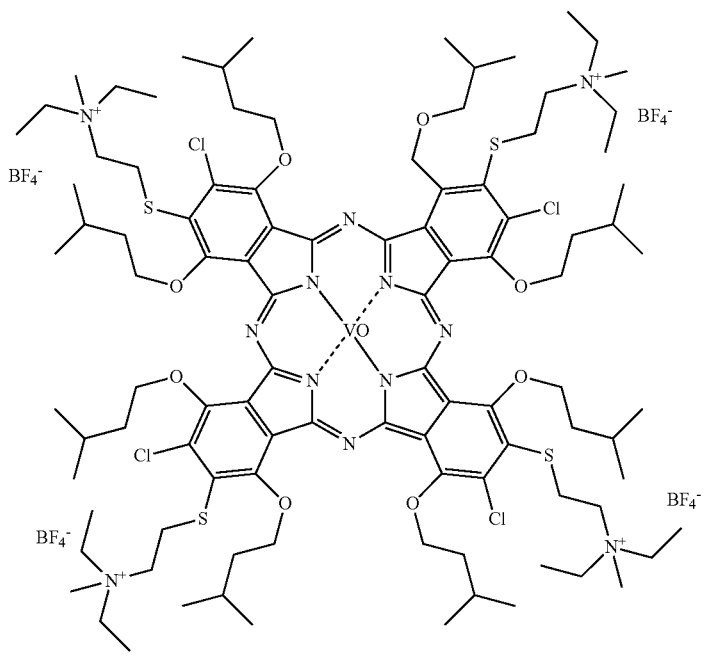

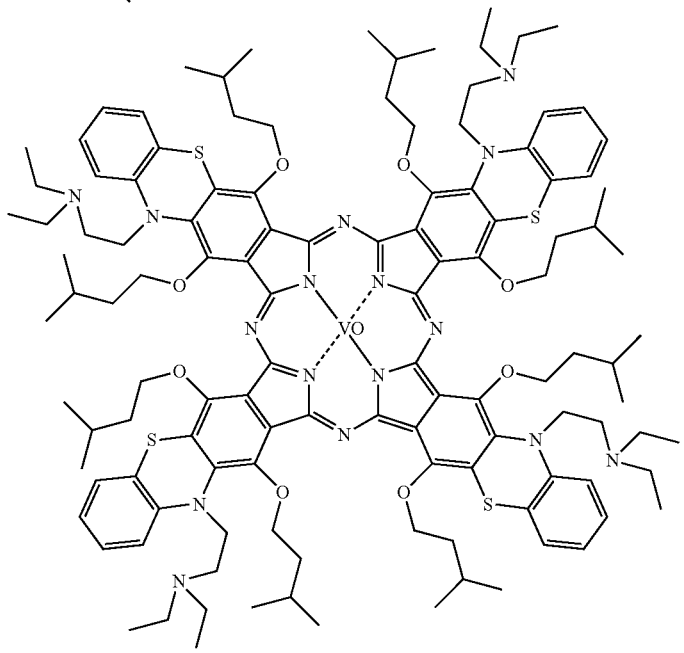

Examples of the pigment used in the invention include commercial pigments and those described in Color Index (C. I.) Handbook, "Saishin Ganryo Binran" (Newest Dye Handbook) (published in 1977 and compiled by Japanese Society of Pigment Technology), "Saishin Ganryo Oyo Gijyutsu" (Newest Pigment Applied Technology) (published in 1986 by CMC), and "Insatsu Inki Gijyutsu" (Printing Ink Technology) (published in 1984 by CMC).

As to the type of the pigment, examples of usable pigments include black pigments, yellow pigments, orange pigments, brown pigments, red pigments, violet pigments, blue pigments, green pigments, fluorescent pigments, metallic powder pigments, and other pigments such as polymer-binding colorants. Specific examples thereof include insoluble azo pigments, azo lake pigments, condensed azo pigments, chelate azo pigments, phthalocyanine pigments, anthraquinone pigments, perylene pigments, perinone pigments, thioindigo pigments, quinacridone pigments, dioxazine pigments, isoindolinone pigments, quinophthalone pigments, dyed lake pigments, azine pigments, nitroso pigments, nitro pigments, natural pigments, fluorescent pigments, inorganic pigments, and carbon black. A preferable pigment among those described above is carbon black.

Such pigments may be used with or without being subjected to surface treatment. Examples of the method of surface treatment include a method of coating the surface with a resin or a wax, a method of allowing a surfactant to adhere to the surface, and a method of bonding a reactive substance (e.g., a silane coupling agent, an epoxy compound, a polyisocyanate etc.) onto the surface of the pigment. These methods of surface treatment are described in "Kinzoku Sekken No Seishitsu To Oyo" (Properties and Application of Metallic Soap) (Sachi Shobo), "Insatsu Inki Gijyutsu" (Printing Ink Technology) (published in 1984 by CMC Shuppan) and "Saishin Ganryo Oyo Gijyutsu" (Newest Pigment Applied Technology) (published in 1986 by CMC Shuppan).

The particle diameter of the pigment is preferably in a range of from 0.01 to 10 µm, more preferably from 0.05 to 1 µm, and still more preferably from 0.1 to 1 µm. A pigment particle diameter of less than 0.01 µm is not preferable in respect of the stability of a pigment dispersion in the recording layer coating liquid, whereas a particle diameter of more than 10 µm is not preferable in respect of the uniformity of the recording layer.

As the method of dispersing the pigments, any known dispersion techniques used in production of inks or toners can be used. Examples of the dispersing machine include a supersonic dispersing device, a sand mill, an attritor, a pearl mill, a super mill, a ball mill, an impeller, a disperser, a KD mill, a colloid mill, a dynatron, a triple roll mill, and a press kneader. Details thereof are described in "Saishin Ganryo Oyo Gijyutsu" (Newest Pigment Applied Technology) (published in 1986 by CMC Shuppan).

In the invention, one of the sensitizing agents (E), of which examples include the infrared absorbing agents, may be used, or a combination of two or more sensitizing agents may be used.

The sensitizing agent (E) to be used in the invention is preferably a cyanine dye.

From the viewpoint of sensitivity, the sensitizing agent is more preferably a cyanine dye represented by Formula (a). Among dyes represented by Formula (a), cyanine dyes in which $X^1$ is a diarylamino group or $X^2$-$L^1$ are preferable, and those having a diaryl amino group are more preferable.

A cyanine dye having an electron-withdrawing group or a heavy atom-containing substituent at each of indolenine sites at both terminals is also preferable, and for example, a dye described in JP-A No. 2002-278057 is preferably used. A cyanine dye which has an electron-withdrawing group at each of indolenine sites at both terminals, and which has a diarylamino group as $X^1$ is most preferable.

In the case where the curable composition of the invention is used for a negative-working planographic printing plate precursor, the sensitizing dye (E) such as the above-described infrared absorbing agent, which is added to promote curing of the polymerizable compositions, may be added to the recording layer, or an independently provided other layer, for example, a topcoat layer or an undercoat layer. In particular, when the curable composition of the invention is used for a recording layer of a negative-working photosensitive planographic printing plate, the sensitizing dye (E) preferably has an optical density of from 0.1 to 3.0 in the recording layer at the absorption maximum in a wavelength range of from 760 nm to 1200 nm from the viewpoint of sensitivity. The optical density is determined according to the addition amount of the infrared absorbing agent and the thickness of the recording layer, hence the predetermined optical density is achieved by controlling these factors.

The optical density of the recording layer can be measured by an ordinary method. Examples of the measurement method include a method of forming a recording layer on a transparent or white support in an appropriately determined thickness such that the coating amount after drying is within the range necessary for a planographic printing plate precursor, and measuring the absorbance with a transmission optical densitometer, and a method of forming a recording layer on a reflective support such as an aluminum support, and measuring the reflection density.

The addition amount of the sensitizing dye to the recording layer is preferably from 0.5 to 20% by mass with respect to the total solid content in the curable composition. Within the range, property changes are highly sensitive to light exposure, thereby high sensitivity is achieved with no deleterious influences on the uniformity and strength of the film.

When an image is formed by curing the curable composition of the present invention by exposure to light, and removing a light-unexposed portion by alkaline development treatment, the curable composition of the present invention is applicable to various fields, such as a planographic printing plate precursor, resist, and coating.

Image Forming Material

The image forming material of the invention includes a support, and, on the support, a curable composition layer including the curable composition. The curable composition layer may, for example, be made photosensitive, and by subjecting the curable composition layer to exposure to light and development, images may be formed from the curable composition layer on the support.

The image forming material of the invention may further include, in addition to the curable composition layer, an oxygen blocking layer, whereby images may be formed with higher sensitivity.

The support will be described in the section regarding the planographic printing plate precursor.

Hereinafter, the image forming material of the invention will be described with reference to an exemplary configuration in which the image forming material of the invention is applied to a planographic printing plate precursor as a preferable exemplary embodiment. However, the application of the image forming material of the present invention is not limited thereto.

Planographic Printing Plate Precursor

Layer Structure of Planographic Printing Plate Precursor

Hereinafter, the layer structure when the curable composition of the present invention is used for a recording layer of a planographic printing plate precursor will be described.

The planographic printing plate precursor has, on a support, a recording layer including at least the above-mentioned components (A) to (D), and preferably further including the component (E). As required, other layers, such as an intermediate layer, an undercoat layer, or a backcoat layer, may be provided on the support.

Recording Layer

A recording layer having an image formation function in the planographic printing plate precursor of the present invention will be described. The recording layer of the planographic printing plate precursor in the present invention includes the above-mentioned components (A) to (D), and preferably further includes a sensitizing dye (E) from the viewpoint of improving sensitivity.

The component (C) in the recording layer of the planographic printing plate precursor functions as a polymerization initiator which initiates and/or promotes the polymerization of a polymerizable compound which is the component (A).

As the polymerizable compound (A) for use in the recording layer of the planographic printing plate precursor, the above-mentioned compounds may be used. The compound to be used is selected as appropriate in consideration of, in addition to the above-mentioned requirements, the support (described in detail later), adjacent layers, and the like. For example, a compound having a specific structure may be selected and used in order to improve the adhesiveness to the support, or the like.

Further, with regard to the manner of use of the polymerizable compound, an appropriate structure thereof, an appropriate combination thereof, and the addition amount thereof, may be selected arbitrarily in view of obtaining desired properties with respect to polymerization inhibition due to oxygen, resolution, fog resistance, change in the refractive index, the surface tackiness of the photosensitive layer, and the like. In exemplary embodiments, such a layer or coating configuration, as undercoating or overcoating may be adopted.

Other Components (F)

When the curable composition of the invention is used for a planographic printing plate precursor, the composition that constitutes the recording layer may include other components (additives) that are suitable for the usage, production process, or the like. Examples of the additives will be described hereinafter.

(F-1) Co-Sensitizer

When a specific additive or compound is used in the composition for forming the recording layer, the sensitivity can be further improved. This compound will be referred to as a co-sensitizer hereinafter. The operation mechanism of the co-sensitizer is unclear, but is considered to be based, in many cases, on a chemical process as follows: the co-sensitizer reacts with various intermediate active species (such as radicals and cations) generated in the process of photoreaction initiated by a photopolymerization initiator and subsequent addition polymerization reaction, to generate new active radicals. Co-sensitizers can be roughly classified into (i) a compound which is reduced to generate an active radical, (ii) a compound which is oxidized to generate an active radical, and (iii) a compound which reacts with a radical having a low activity to convert it to a highly active radical, or which acts as a chain transfer agent. However, there are many cases in which a common view has not been formed as to which class each compound belongs to.

Compound (i) which can be Reduced to Generate an Active Radical

Some examples of the compound (i) include compounds as described below.

Compounds having a carbon-halogen bond: an active radical is considered to be generated by the reductive cleavage of the carbon-halogen bond. Specific examples thereof include trihalomethyl-s-triazines and trihalomethyloxadiazoles.

Compounds having a nitrogen-nitrogen bond: an active radical is considered to be generated by the reductive cleavage of the nitrogen-nitrogen bond. Specific examples thereof include hexaarylbisimidazoles.

Compounds having an oxygen-oxygen bond: an active radical is considered to be generated by the reductive cleavage of the oxygen-oxygen bond. Specific examples thereof include organic peroxides.

Onium compounds: an active radical is considered to be generated by the reductive cleavage of a carbon-heteroatom bond or oxygen-nitrogen bond thereof Specific examples thereof include diaryliodonium salts, triarylsulfonium salts, and N-alkoxypyridinium (azinium) salts.

Ferrocene, and iron arene complexes: an active radical can be generated by reduction.

Compound (ii) which is Oxidized to Generate an Active Radical

Examples of the compound (ii) are compounds as described below.

Alkyl-ate complexes: an active radical is considered to be generated by oxidative cleavage of a carbon-heteroatom bond thereof. Specific preferable examples thereof include triarylalkylborates.

Alkylamine compounds: an active radical is considered to be generated by oxidative cleavage of a C-X bond on the carbon atom adjacent to a nitrogen atom, in which X is preferably, for example, a hydrogen atom, or a carboxyl, trimethylsilyl or benzyl group. Specific examples of the compound include ethanolamines, N-phenylglycines, N-phenyliminodiacetic acid and derivatives thereof, and N-trimethylsilylmethylanilines.

Sulfur-containing compounds and tin-containing compounds: a compound in which the nitrogen atom of the above-mentioned amine compound is substituted with a sulfur or tin atom is considered to generate an active radical in a similar manner. Moreover, a compound having an S—S bond is also known to have a sensitization effect by the cleavage of the S—S bond.

α-substituted methylcarbonyl compounds: an active radical can be generated by the oxidative cleavage of α-carbon bond. Moreover, a compound in which the carbonyl is converted into an oxime ether also shows a similar function. Specific examples thereof include 2-alkyl-1-[4-(alkylthio)phenyl]-2-morpholinopropan-1-one, and oxime ethers each obtained by a reaction of the 2-alkyl-1-[4-(alkylthio)phenyl]-2-morpholinopropan-1-one with a hydroxylamine and subsequent etherification of the N—OH.

Sulfinic acid salts: an active radical can be generated by reduction. Specific examples thereof include sodium arylsulfinate.

Compound (iii) which reacts with a radical having low activity to convert it to a highly active radical, or acts as a chain transfer agent Examples of the compound (iii) include a group of compounds having, in their molecule, SH, PH, SiH or GeH. The compound donates hydrogen to a low active radical species to generate a radical, or is oxidized and then subjected to deprotonation to generate a radical. Specific examples thereof include 2-mercaptobenzimidazoles.

In an exemplary embodiment, a polycarboxylic acid compound including an aromatic ring or heterocyclic aromatic ring structure to which at least two carboxyl groups are bonded directly or via a divalent linking group is included for the purpose of improving sensitivity and/or developability. Specific examples of the polycarboxylic acid compound include (p-acetamidophenylimido)diacetic acid, 3-(bis(carboxymethyl)amino)benzoic acid, 4-(bis(carboxymethyl)amino)benzoic acid, 2-[(carboxymethyl)phenylamino]benzoic acid, 2-[(carboxymethyl)phenylamino]-5-methoxybenzoic acid, 3-[bis(carboxymethyl)amino]-2-naphthalene carboxylic acid, N-(4-aminophenyl)-N-(carboxymethyl)glycine, N,N'-1,3-phenylene-bis-glycine, N,N'-1,3-phenylenebis[N-(carboxymethyl)]glycine, N,N'-1,2-phenylenebis[N-(carboxymethyl)]glycine, N-(carboxymethyl)-N-(4-methoxyphenyl)glycine, N-(carboxymethyl)-N-(3-methoxyphenyl)glycine, N-(carboxymethyl)-N-(3-hydroxyphenyl)glycine, N-(carboxymethyl)-N-(3-chlorophenyl)glycine, N-(carboxymethyl)-N-(4-bromophenyl)glycine, N-(carboxymethyl)-N-(4-chlorophenyl)glycine, N-(carboxymethyl)-N-(2-chlorophenyl)glycine, N-(carboxymethyl)-N-(4-ethylphenyl)glycine, N-(carboxymethyl)-N-(2,3-dimethylphenyl)glycine, N-(carboxymethyl)-N-(3,4-dimethylphenyl)glycine, N-(carboxymethyl)-N-(3,5-dimethylphenyl)glycine, N-(carboxymethyl)-N-(2,4-dimethylphenyl)glycine, N-(carboxymethyl)-N-(2,6- dimethylphenyl)glycine, N-(carboxymethyl)-N-(4-formylphenyl)glycine, N-(carboxymethyl)-N-ethylanthranilic acid, N-(carboxymethyl)-N-propylanthranilic acid, 5-bromo-N-(carboxymethyl) anthranilic acid, N-(2-carboxyphenyl)glycine, o-dianisidine-N,N,N',N'-tetraacetic acid, N,N'-[1,2-ethanediylbis(oxy-2,1-phenylene)]bis[N-(carboxymethyl)glycine], 4-carboxyphenoxy acetic acid, cathecol-O,O'-diacetic acid, 4-methylcatechol-O,O'-diacetic acid, resorcinol-O,O'-diacetic acid, hydroquinone-O,O'-diacetic acid, α-carboxy-o-anisic acid, 4,4'-isopropylidene diphenoxy acetic acid, 2,2'-(dibenzofuran-2,8-diyldioxy)diacetic acid, 2-(carboxymethylthio)benzoic acid, 5-amino-2-(carboxymethylthio)benzoic acid, and 3-[(carboxymethyl)thio]-2-naphthalene carboxylic acid.

In particular, N-arylpolycarboxylic acids represented by the following Formula (V) or compounds represented by the following Formula (VI) are preferable.

(V)

In Formula (V), Ar represents a mono-substituted aryl, poly-substituted aryl or unsubstituted aryl group, and m represents an integer of 1 to 5.

Examples of the substituent which may be introduced into the aryl group include alkyl groups having 1 to 3 carbon atoms, alkoxy groups having 1 to 3 carbon atoms, thioalkyl groups having 1 to 3 carbon atoms, and halogen atoms. The aryl group is preferably an aryl group having one substituent, or two or three substituents which may be the same as or different from each other. The symbol m is preferably 1, and Ar is preferably a phenyl group.

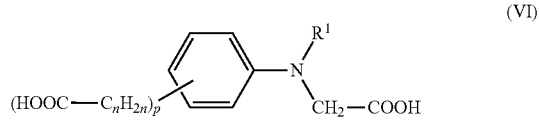

(VI)

In Formula (VI), $R^1$ represents a hydrogen atom or an alkyl group having 1 to 6 carbon atoms, and n and p each represent an integer of 1 to 5.

The symbol n is preferably 1, and $R^1$ is preferably a hydrogen atom. The most preferable example of the polycarboxylic acid is anilinodiacetic acid.

In addition, examples of the compound which is preferably used to improve the sensitivity and/or the developability include compounds having two or more functional groups each of which is selected from a carboxylic acid group and a sulfonic acid group. Specific examples thereof include 5-aminoisophthalic acid, 5-nitroisophthalic acid, 4-methylphthalic acid, terephthalic acid, 2-bromoterephthalic acid, 2,3-naphthalenedicarboxylic acid, diphenic acid, 1,4,5,8-naphthalenetetracarboxylic acid, N-benzyliminodiacetic acid, N-(2-carboxyphenyl)glycine, N-phenyliminodiacetic acid, 1,3,5-benzenetricarboxylic acid, 1,2,4,5-benzenetetracarboxylic acid, 5-sulfosalicylic acid, 2-sulfobenzoic acid, 1,5-naphthalenedisulfonic acid, and 4-sulfophthalic acid. These compounds may each be substituted by a halogen atom, or an alkyl, alkenyl, alkynyl, cyano, hydroxyl, carboxyl, carbonyl, alkoxy, amino, amide, thiol, thioalkyl, thioalkoxy, or sulfonyl group.

Of these compounds, most preferable is the compound represented by Formula (V) or (VI).

The addition amount of such a poly(carboxylic acid/sulfonic acid) compound is preferably from 0.5 to 15% by mass, more preferably from 1 to 10% by mass, and even more preferably from 3 to 8% by mass, with respect to the total solid content of the polymerizable composition.

A large number of more specific examples of the co-sensitizer are described as additives that improves sensitivity in, for example, JP-A No. 9-236913, and these may be used in the invention.

One of the co-sensitizers may be used alone, or two or more of them may be used in combination. The use amount thereof is preferably from 0.05 to 100 parts by mass, more preferably from 1 to 80 parts by mass, and even more preferably from 3 to 50 parts by mass, with respect to 100 part by mass of the polymerizable compound (A).

(F-2) Polymerization Inhibitor

In addition to the above-mentioned components, a small amount of a thermal polymerization inhibitor may be added to the composition that is used in the recording layer in order to inhibit undesired thermal polymerization of the polymerizable compound when the composition is produced or stored. Examples of the thermal polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and a cerium (III) salt of N-nitrosophenylhydroxyamine. The addition amount of the thermal polymerization inhibitor is preferably from about 0.01% to 5% by mass with respect to the total mass of the composition. When a higher aliphatic acid or a derivatives thereof, such as behenic acid or behenic amide, or the like is added to the composition to prevent polymerization-inhibition due to oxygen and then the composition is used to produce a planographic printing plate precursor, the higher aliphatic acid or the like may be optionally distributed unevenly on the surface of the recording layer in the step of applying a coating solution of the composition onto a support or the like, and then drying the solution. The addition amount of the higher aliphatic acid or the derivative thereof is preferably from about 0.5 to 10% by mass with respect to the entire composition.

(F-3) Colorant or the Like

Furthermore, in the planographic printing plate precursor of the invention, a dye or pigment may be added to a recording layer to color the recording layer. In this manner, the so-called plate-detectabilities of a printing plate made from the precursor, such as the visual of the plate and the suitability of the plate for an image-density-measuring device, can be improved. Many of dyes decrease the sensitivity of a photopolymerizable recording layer; thus, the colorant is preferably a pigment. Specific examples of the colorant include pigments such as phthalocyanine pigments, azo pigments, carbon black, and titanium oxide; and dyes such as ethyl violet, crystal violet, azo dyes, anthraquinone dyes, and cyanine dyes. The addition amount of the dye or the pigment is preferably from about 0.5 to 5% by mass with respect to the entire composition.

(F-4) Other Additives

Furthermore, the planographic printing plate precursor of the invention may include a known additive such as an inorganic filler that is used for improving physical properties of a cured film, a plasticizer, or a lipophylizing agent that can provide the surface of a recording layer with an improved affinity for ink.

Examples of the plasticizer include dioctyl phthalate, didodecyl phthalate, triethylene glycol dicaprylate, dimethyl glycol phthalate, tricresyl phosphate, dioctyl adipate, dibutyl cebacate, and triacetyl glycerin. When a binder is used, the plasticizer may be added in an amount of 10% or less by mass with respect to the total mass of the polymerizable compound, which has an ethylenically unsaturated bond, and the binder.

In addition, a UV initiator, a thermal crosslinking agent or the like may be added for enhancing the effect of post-development heating or light-exposure, in order to improve the film strength (printing durability) of the recording layer.

Besides, an additive may be additionally added to the recording layer or an intermediate layer may be provided, for improving the adhesiveness between the recording layer and the support or promoting the development-removability of the unexposed recording layer. For example, the adhesiveness is improved by the addition or undercoating of a compound exhibiting a relatively strong interaction with the support, such as a compound having a diazonium structure or a phosphonic compound, resulting in improvement of the printing durability. In the meantime, the developability of a non-image region of the recording layer can be improved by the addition or undercoating of a hydrophilic polymer such as polyacrylic acid or polysulfonic acid, resulting in improvement of the stain resistance.

The planographic printing plate precursor may be produced by applying, onto an appropriate support, a coating solution for a recording layer or a solution obtained by dissolving components for a coating solution for a desired layer, such as a protective layer or the like, in a solvent.

Examples of the organic solvents include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethylsulfoxide, γ-butyrolactone, methyl lactate, and ethyl lactate. One of the solvents may be used alone, or two or more thereof may be used in combination. The concentration of the solid content(s) in the photosensitive layer coating solution is suitably from 2 to 50% by mass.

It is preferable that the coating amount of the recording layer on the support be selected as appropriate according to the intended use in consideration of the sensitivity and developability of the recording layer, strength of the light-exposed film, printing durability, and other influences. When the coating amount is too small, the printing durability is insufficient, and when excessive, the sensitivity decreases, which results in prolongation of the time necessary for light exposure and developing treatment. The coating amount on the planographic printing plate precursor of the invention is preferably in a range of from about 0.1 to about 10 $g/m^2$, and more preferably from 0.5 to 5 $g/m^2$ at a mass after drying.

Resin Intermediate Layer

In the planographic printing plate precursor according to the invention, a resin intermediate layer including an alkali-soluble polymer may be arranged as necessary between the recording layer and the support.

When the recording layer that is an infrared light-sensitive layer whose solubility in an alkali developer is decreased upon exposure to light is disposed as a light exposure surface or in the vicinity thereof, the sensitivity to an infrared laser light is improved. Further, the resin intermediate layer between the support and the infrared light-sensitive recording layer functions as a heat insulating layer, thereby preventing heat generated upon exposure to infrared laser light from diffusing in the support. Therefore, the heat is used effectively, and the sensitivity can be increased.

It is estimated that in a light-exposed portion, the photosensitive layer (recording layer) made impermeable to an alkali developer functions as a protective layer for the resin intermediate layer, thus improving development stability, forming an image excellent in discrimination and securing stability with time, while in a light-unexposed portion, an uncured binder component is rapidly dissolved and dispersed in a developer. Since the resin intermediate layer provided adjacent to the support is made of an alkali-soluble polymer, the resin intermediate layer is excellent in solubility in a developer, and is rapidly dissolved to attain excellent developability without generating a remaining layer even if, for example, a developer having lowered activity is used.

Substrate (Support)

The support used in the invention may be paper, a polyester film or an aluminum plate, among which an aluminum plate is particularly preferable because it is excellent in dimensional stability, is relatively inexpensive, can provide a surface excellent in hydrophilicity and strength by performing surface treatment as necessary. A composite sheet having an aluminum sheet bonded to a polyethylene terephthalate film, as described in JP-B No. 48-18327, is also preferable.

An example of the aluminum plate as the most preferable support in the invention is a metal plate made mainly of aluminum, which is dimensionally stable. Specific examples thereof include a pure aluminum plate, an alloy plate including aluminum as a main component and a trace amount of an extraneous element, and a plastic film or paper piece on which aluminum (or aluminum alloy) is laminated or deposited. Hereinafter, supports including aluminum or an aluminum alloy are generally called aluminum supports. Examples of the extraneous element included in the aluminum alloy include silicon, iron, manganese, copper, magnesium, chromium, zinc, bismuth, nickel, and titanium. The amount of the extraneous element(s) in the alloy is 10% or less by mass. In an exemplary embodiment of the invention, a pure aluminum plate is preferable. However, it is difficult to produce absolutely pure aluminum from the viewpoint of refining technique. Thus, an aluminum plate may include a slight amount of the extraneous element(s). As described above, the composition of the aluminum plate to be used in the invention is not limited, and the material of the aluminum plate may be appropriately selected from materials known or used in the technical field, such as JIS A 1050, JIS A 1100, JIS A 3103, and JIS A 3005 materials.

The thickness of the aluminum support used in the invention is from about 0.1 to about 0.6 mm. The thickness may be appropriately changed in accordance with the size of the printing machine, the size of the printing plate, and user's request.

The aluminum support may be subjected to a surface treatment described below, so as to be made hydrophilic.

Surface-roughening Treatment

The surface-roughening treatment may be a mechanical treatment as disclosed in JP-A No. 56-28893, chemical etching, electrolytic graining, or the like. The surface-roughening treatment may also be an electrochemical surface-roughening method of roughening the support surface electrochemically in a hydrochloric acid or nitric acid electrolyte, or a mechanical surface-roughening method such as a wire brush graining method of brushing the surface of aluminum with a metallic wire, a ball graining method of polishing the surface of aluminum with polishing beads and a polishing agent or a brush graining method of roughening the surface with a nylon brush and a polishing agent. One of these surface-roughening methods may be used alone, or two or more of them may be used in combination. Of these methods, a method useful for the surface-roughening is the electrochemical surface-roughening method of roughening the support surface electrochemically in a hydrochloric acid or nitric acid electrolyte. The electric quantity suitable for the method is from 50 to 400 $C/dm^2$, when the support serves as an anode. More specifically, alternate and/or direct current electrolysis is preferably carried out in an electrolyte having hydrochloric acid or nitric acid content of 0.1 to 50% by mass at a temperature of from 20 to 80° C. and an electric current density of 100 to 400 $C/dm^2$ for 1 second to 30 minutes.

The aluminum support thus surface-roughened may be chemically etched in an acid or alkaline solution. Preferable examples of the etching agent include sodium hydroxide, sodium carbonate, sodium aluminate, sodium metasilicate, sodium phosphate, potassium hydroxide, and lithium hydroxide. The concentration of the etching agent is preferably from 1 to 50% by mass, and the temperature of the etching agent is preferably from 20 to 100° C. In order to remove stains (smuts) that remain on the etched surface, the substrate may be washed with acid. Typical examples of the acid to be used include nitric acid, sulfuric acid, phosphoric acid, chromic acid, hydrofluoric acid, and fluoroboric acid. A method for removing smuts on an electrochemically roughened surface is preferably a method described in JP-A No. 53-12739 in which a surface is brought into contact with 15 to 65% by mass of sulfuric acid at a temperature in the range of from 50 to 90° C., or a method described in JP-B 48-28123 in which a surface is etched with alkali. The method and conditions are not particularly limited, as long as the surface roughness Ra of the roughened surface is about 0.2 µm to 0.5 µm after the treatment.

Anodizing Treatment

The aluminum support thus treated, on which an oxide layer is formed, may be subjected to an anodizing treatment.

In the anodizing treatment, an aqueous solution of any one of sulfuric acid, phosphoric acid, oxalic acid, boric acid, and sodium borate may be used alone as a major component in an electrolytic bath, or an aqueous solution of a combination of two or more of such substances may be used. In this case, the electrolytic solution may, of course, include at least components normally included in the Al alloy plate, the electrodes, tap water and underground water. A second component, or second and third components may also be included. Examples of the second component or second and third components described above include: cations of metals such as Na, K, Mg, Li, Ca, Ti, Al, V, Cr, Mn, Fe, Co, Ni, Cu or Zn, and ammonium ions; and anions such as a nitrate ion, a carbonate ion, a chlorine ion, a phosphate ion, a fluorine ion, a sulfite ion, a titanate ion, a silicate ion or a borate ion. The concentration of the cation or the anion in the electrolytic solution may be from about 0 to 10000 ppm. Although the conditions for the anodizing treatment are not particularly limited, the plate is preferably treated at a temperature of from 10 to 70° C. by direct current or alternating current electrolysis in a range of an electric current density of from 0.1 to 40 $A/m^2$.

The thickness of the anodized layer thus formed may be in the range of from 0.5 µm to 1.5 µm, preferably in the range of from 0.5 µm to 1.0 µm. Conditions for the anodizing treatment are preferably selected so that the resultant support has a pore diameter of micropores present in the anodized layer thereof of from 5 to 10 nm and a pore density thereof of from $8 \times 10^{15}$ to $2 \times 10^{16}$ per square meter.

The treatment for imparting hydrophilicity to the surface of the support may be selected from various known methods. The treatment is particularly preferably hydrophilicity-imparting treatment with a silicate, polyvinylphosphonic acid, or the like. The resultant layer may have a Si or P element content of from 2 to 40 $mg/m^2$, preferably from 4 to 30 $mg/m^2$. The coating amount can be measured by fluorescence X ray analysis.

In the hydrophilicity-imparting treatment, the aluminum support having an anodized layer formed thereon is dipped in an aqueous solution at pH 10 to 13 (determined at 25° C.) including an alkali metal silicate or polyvinylphosphonic acid in an amount of from 1 to 30% by mass, and more preferably from 2 to 15% by mass, for example at from 15 to 80° C. for from 0.5 to 120 seconds.

Examples of the alkali metal silicate used in the hydrophilicity-imparting treatment include sodium silicate, potassium silicate, and lithium silicate. Examples of a hydroxide used to increase the pH of the aqueous solution of the alkali metal silicate include sodium hydroxide, potassium hydroxide, and lithium hydroxide. An alkaline earth metal salt or a salt of a metal in the group IVB may be incorporated into the treating solution. Examples of the alkaline earth metal salt include nitrates such as calcium nitrate, strontium nitrate, magnesium nitrate, and barium nitrate, sulfates, hydrochlorides, phosphates, acetates, oxalates, borates, and other water-soluble salts. Examples of the salt of a metal in the group IVB include titanium tetrachloride, titanium trichloride, titanium potassium fluoride, titanium potassium oxalate, titanium sulfate, titanium tetraiodide, zirconium chlorooxide, zirconium dioxide, zirconium oxychloride, and zirconium tetrachloride.

One of the alkaline earth metal salts or the salts of a metal in the group IVB may be used alone, or two or more thereof may be used in combination. The amount of the metal salt(s) in the treating solution is preferably from 0.01 to 10% by mass, more preferably from 0.05 to 5.0% by mass. Also, it is effective to use silicate electrodeposition as described in U.S. Pat. No. 3,658,662. Furthermore, it is preferable to subject a support which has been subjected to electrolytic graining, as disclosed in JP-B No. 46-27481, and JP-A Nos. 52-58602 and 52-30503, to a surface treatment that is a combination of the anodizing treatment with the hydrophilicity-imparting treatment.

Production of Planographic Printing Plate Precursor

The planographic printing plate precursor of the invention has at least the recording layer on a support, and may optionally have an intermediate layer (or undercoating layer) or the like. The planographic printing plate precursor may be produced by successively applying one or more coating solutions including the above-mentioned respective components onto the support.

When a recording layer is formed by coating, the components for the recording layer are dissolved in an organic solvent to prepare a coating solution for a recording layer, and then the coating solution for a recording layer is applied onto the support or an undercoat layer. The organic solvent may be selected from various organic solvents.

Examples of the organic solvents include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethylsulfoxide, γ-butyrolactone, methyl lactate, and ethyl lactate. One of the solvents may be used alone, or two or more thereof may be used in combination. The concentration of the solid content of the photosensitive layer coating solution is suitably from 2 to 50% by mass.

The coating amount of the recording layer coating solution may affect mainly the sensitivity, the film strength and the developability of the recording layer, and the printing durability of the printing plate to be obtained, and is desirably selected in accordance with the application of the photosensitive layer. When the application is a planographic printing plate precursor for scanning-exposure, the coating amount of the recording layer coating solution is preferably from about 0.1 to 10 g/m$^2$, and more preferably from 0.5 to 5 g/m$^2$, in terms of mass (per unit area) of the coating solution after the solution is dried.

Intermediate Layer (Undercoat Layer)

The planographic printing plate precursor may be provided with an intermediate layer (or an undercoat layer) in order to improve the adhesiveness between the recording layer and the support, and to provide stain resistance.

When the recording layer is an infrared light sensitive layer whose solubility in an alkali developer decreases upon exposure to light, if it is disposed on a light exposed surface or in the vicinity thereof, the sensitivity to an infrared laser light is improved. Further, since the undercoat layer exists between the support and the infrared light-sensitive recording layer, it can function as a heat insulating layer, whereby heat generated upon exposure to infrared laser light is prevented from diffusing to the support. Therefore, heat is used efficiently, and sensitivity can be increased.

It is thought that, in a light-exposed portion, the photosensitive layer (recording layer), which has become impermeable to an alkali developer, functions as a protective layer for the undercoat layer, thus improving development stability, allowing formation of an image excellent in discrimination, and ensuring stability over time, while in a light-unexposed portion, an uncured binder component rapidly dissolves and disperses in a developer. Since the undercoat layer provided adjacent to the support is made of an alkali-soluble polymer, the undercoat layer is excellent in solubility in a developer, and rapidly dissolves to attain excellent developability without generating a residual layer, even if, for example, a developer having low activity is used.

Support

The support to be used in the invention may be a support that has been subjected to hydrophilicity-imparting treatment as will be described later. Examples of the support include paper, a polyester film, and an aluminum plate. Of these, an aluminum plate is preferable since the plate has excellent dimensional stability, is relatively inexpensive, and can be provided with excellent surface hydrophilicity and strength by an optional surface treatment. A composite sheet in which an aluminum sheet is bonded onto a polyethylene terephthalate film as described in JP-B No. 48-18327 may also be used as the support.

In the present invention, an example of an aluminum plate as the most preferable support is a metal plate made mainly of aluminum, which is dimensionally stable. The aluminum plate in the present invention is selected from a pure aluminum plate, an alloy plate including aluminum as a major component and a trace amount of extraneous elements, and a plastic film or paper piece having aluminum (or an aluminum alloy) laminated or vapor-deposited thereon. Hereinafter, supports including aluminum or aluminum alloys are generally called aluminum supports. Examples of the extraneous element included in the aluminum alloy include silicon, iron, manganese, copper, magnesium, chromium, zinc, bismuth, nickel, and titanium. The amount of the extraneous element(s) in the alloy is/are 10% by mass or lower. In an exemplary embodiment of the invention, a pure aluminum plate is preferable. However, since the production of absolutely pure aluminum is difficult from the viewpoint of refining technique, an aluminum plate may include a slight amount of extraneous element(s). As described above, the composition of the aluminum plate to be used is not limited, and the material of the aluminum plates may be appropriately selected from materials conventionally known or used in the technical field, such as JIS A 1050, JIS A 1100, JIS A 3103, and JIS A 3005 materials.

The thickness of the aluminum support for use in the invention is about 0.1 mm to about 0.6 mm. The thickness may be suitably changed according to the size of printing machine, the dimension of printing plate, and needs by users.

The surface of the aluminum support used in the invention may be subjected to treatment described hereinafter and be hydrophilized, if necessary.

Surface-roughening Treatment

The surface-roughening treatment may be a mechanical treatment as disclosed in JP-A No. 56-28893, chemical etching, electrolytic graining, or the like. The surface-roughening treatment may also be an electrochemical surface-roughening method of roughening the support surface electrochemically in a hydrochloric acid or nitric acid electrolyte, or a mechanical surface-roughening method such as a wire brush graining method of brushing the surface of aluminum with a metallic wire, a ball graining method of polishing the surface of aluminum with polishing beads and a polishing agent or a brush graining method of roughening the surface with a nylon brush and a polishing agent. One of these surface-roughening methods may be used alone, or two or more of them may be used in combination. Of these methods, a method useful for the surface-roughening is the electrochemical surface-roughening method of roughening the support surface electrochemically in a hydrochloric acid or nitric acid electrolyte. The electric quantity suitable for the method is from 50 to 400 C/dm$^2$, when the support serves as an anode. More specifically, alternate and/or direct current electrolysis is preferably carried out in an electrolyte having hydrochloric acid or nitric acid content of 0.1 to 50% by mass at a temperature of from 20 to 80° C. and an electric current density of 100 to 400 C/dm$^2$ for 1 second to 30 minutes.

The aluminum support which has been subjected to surface roughening treatment as described above may be chemically etched with acid or alkali. Preferable examples of the etching agent include sodium hydroxide, sodium carbonate, sodium aluminate, sodium metasilicate, sodium phosphate, potassium hydroxide, and lithium hydroxide. The concentration of the etching agent is preferably from 1 to 50%, and the temperature of the etching agent is preferably from 20 to 100° C. In order to remove the stains (smut) remaining on the etched surface, the support may be washed with acid. Examples of the acid to be used include nitric acid, sulfuric acid, phosphoric acid, chromic acid, hydrofluoric acid, and fluoroboric acid. A method for removing smuts on an electrochemically roughened surface is preferably a method described in JP-A No. 53-12739 in which a surface is brought into contact with 15 to 65 mass % sulfuric acid at a temperature of from 50 to 90° C., or a method involving alkali etching described in JP-B No. 48-28123. The method and conditions are not particularly limited, as long as the surface roughness Ra of the roughened surface is in the range of about from 0.2 to 0.5 μm after the treatment.

Anodizing Treatment

The aluminum support thus treated, on which an oxide layer has been formed, may then be subjected to an anodizing treatment.

In the anodizing treatment, an aqueous solution of any one of sulfuric acid, phosphoric acid, oxalic acid, boric acid, and sodium borate may be used alone as a major component in an electrolytic bath, or an aqueous solution of a combination of two or more of such substances thereof may be used. In this case, the electrolytic solution may, of course, include at least components normally included in the Al alloy plate, the electrodes, tap water, and ground water. Furthermore, a second component, or second and third components may also be included. Examples of the second component or second and third components described above include: cations of metals such as Na, K, Mg, Li, Ca, Ti, Al, V, Cr, Mn, Fe, Co, Ni, Cu, or Zn, and ammonium ions; and anions such as a nitrate ion, a carbonate ion, a chlorine ion, a phosphoric acid ion, a fluorine ion, a sulfite ion, a titanate ion, a silicate ion, or a borate ion. The concentration of the cation or the anion in the electrolytic solution may be from about 0 to 10000 ppm. Although the conditions for the anodizing treatment are not particularly limited, the plate is preferably treated at a temperature of from 10 to 70° C. by direct current or alternating current electrolysis in a range of an electric current density of from 0.1 to 40 A/m$^2$. The thickness of the anodized layer thus formed is in the range of 0.5 to 1.5 μm. Preferably, the thickness thereof is in the range of 0.5 to 1.0 μm. With respect to the support produced by the treatment described above, it is preferable to select treatment conditions in such a manner that the pore diameter of a micro pore which exists in an anodic oxide film is in the range of 5 to 10 nm and the pore density is in the range of $8 \times 10^{15}$ to $2 \times 10^{16}$ m$^2$.

The treatment for imparting hydrophilicity to the surface of the support may be selected from various known methods. The treatment is particularly preferably hydrophilicity-imparting treatment with a silicate, polyvinylphosphonic acid, or the like. The resultant layer may have a Si or P element content of from 2 to 40 mg/m$^2$, preferably from 4 to 30 mg/m$^2$. The coating amount can be measured by fluorescence X ray analysis.

In the hydrophilicity-imparting treatment, for example, the aluminum support having the anodized layer formed thereon is immersed, at from 15 to 80° C. for from 0.5 to 120 seconds, in an aqueous solution which includes alkali metal silicate or polyvinyl phosphonic acid in an amount of from 1 to 30% by mass, and preferably from 2 to 15% by mass and which has pH at 25° C. of 10 to 13.

As an alkali metal silicate for use in the hydrophilicity-imparting treatment, sodium silicate, potassium silicate, lithium silicate, or the like may be used. Examples of a hydroxide used for increasing the pH of the aqueous alkali metal silicate solution include sodium hydroxide, potassium hydroxide, and lithium hydroxide. It should be noted that an alkaline earth metal salt or a salt of a metal in the group IVB may be blended in the treating solution. Examples of the alkaline earth metal salt include water-soluble salts, such as nitrates (e.g., calcium nitrate, strontium nitrate, magnesium nitrate, and barium nitrate), sulfate, hydrochloride, phosphate, acetate, oxalate, and borate. Examples of the salt of a metal in the group IVB include titanium tetrachloride, titanium trichloride, titanium potassium fluoride, titanium potassium oxalate, titanium sulfate, titanium tetraiodide, zirconium chlorooxide, zirconium dioxide, zirconium oxychloride, and zirconium tetrachloride.

One of the alkaline earth metal salts or the salts of a metal in the group IVB may be used alone, or two or more thereof may be used in combination. The amount of the metal salt(s) in the treating solution is preferably from 0.01 to 10% by mass, and more preferably from 0.05 to 5.0% by mass. Also, it is effective to use silicate electrodeposition as described in U.S. Pat. No. 3,658,662. Furthermore, it is preferable to subject a support which has been subjected to electrolytic graining, as disclosed in JP-B No. 46-27481, and JP-A Nos. 52-58602 and 52-30503, to a surface treatment that is a combination of the anodizing treatment with the hydrophilicity-imparting treatment.

Back Surface Treatment of Support

In the planographic printing plate precursor of the invention, the back surface of the support may be preferably modified to improve the scratch resistance. In the case of using, for example, an aluminum support, the method for modifying the support back surface is, for example, a method of forming an anodized layer uniformly on the entire back surface of the support in the same manner as the formation of an anodized layer on the recording layer side face of the support, or a method of forming a backcoat layer on the back surface. In the method of forming an anodized layer, the amount of the formed film is preferably 0.6 g/m$^2$ or more, and more preferably from 0.7 to 6 g/m$^2$. Of these methods, the method of forming a backcoat layer is more effective and preferable. The back surface treating method will be described hereinafter.

1. Formation of Back Surface Anodized Film

First, a method of forming a uniformly anodized film having a thickness of 0.6 g/m$^2$ or more, on the back surface of an aluminum support in the same manner as the recording layer side is described. The anodized film may be formed by the aforementioned processes as those used for the surface treatment of the support. The thickness of the anodized film provided on the back surface of the support may be 0.6 g/m$^2$ or more, and the upper limit of the thickness is not particularly restricted from the viewpoint of performance. However, in consideration of energy such as electric power and time required for forming the film, the upper limit may be about 6 g/m$^2$. The coating amount is preferably 0.7 g to 6 g/m$^2$, and more preferably 1.0 g to 3 g/m$^2$ from the practical viewpoint.

The amount of the anodized film may be determined by measuring the peak of $Al_2O_3$ using fluorescent X-ray, and converting the peak height into the coating amount on the basis of the calibration curve.

In the invention, whether an anodized film is provided on the entire surface of one side surface of the aluminum support in an amount of 0.6 g/m$^2$ or more is confirmed by the fact that the coating amount of the anodized film on the surface of the aluminum support of the planographic printing plate precursor which surface is opposite to the recording layer side is 0.6 g/m$^2$ or more at the center of the film and at portions that is 5 cm off from both ends on the plane which passes through the center and is orthogonal to the machine direction of the planographic printing plate precursor.

2. Formation of Backcoat Layer

Next, a method for providing a backcoat layer on the back surface of the aluminum support is described. The backcoat layer in the invention may have any composition. Preferable examples of the backcoat layer include a backcoat layer including a metal oxide prepared through hydrolysis and polycondensation of the organic metal compound or inorganic metal compound, which will be described later, and colloidal silica sol, and a backcoat layer composed of an organic resin film.

2-1. Backcoat Layer Including Metal Oxide and Colloidal Silica Sol

A first embodiment of the backcoat layer in the invention is a backcoat layer including a metal oxide and colloidal silica sol.

More specifically, the backcoat layer may be preferably formed from a so-called sol-gel reaction liquid, in which an organic or inorganic metal compound is hydrolyzed or polycondensed in water and an organic solvent in the presence of a catalyst such as an acid or alkali.

Examples of the organic or inorganic metal compound to be used for forming the backcoat layer include metal alkoxides, metal acetylacetonates, metal acetates, metal oxalates, metal nitrates, metal sulfates, metal carbonates, metal oxychlorides, metal chlorides, and condensates thereof prepared through partial hydrolysis and oligomerization.

A metal alkoxide may be represented by formula $M(OR)_n$ (wherein M represents a metal element, R represents an alkyl group, and n represents the oxidation number of the metal element). Specific examples thereof include $Si(OCH_3)_4$, $Si(OC_2H_5)_4$, $Si(OC_3H_7)$, $Si(OC_4H_9)_4$, $Al(OCH_3)_3$, $Al(OC_2H_5)_3$, $Al(OC_3H_7)_3$, $Al(OC_4H_9)_3$, $B(OCH_3)_3$, $B(OC_2H_5)_3$, $B(OC_3H_7)_3$, $B(OC_4H_9)_3$, $Ti(OCH_3)_4$, $Ti(OC_2H_5)_4$, $Ti(OC_3H_7)_4$, $Ti(OC_4H_9)_4$, $Zr(OCH_3)_4$, $Zr(OC_2H_5)_4$, $Zr(OC_3H_7)_4$, and $Zr(OC_4H_9)_4$, and other examples include alkoxides of Ge, Li, Na, Fe, Ga, Mg, P, Sb, Sn, Ta, and V, and monosubstituted silicon alkoxides of $CH_3Si(OCH_3)_3$, $C_2H_5Si(OCH_3)_3$, $CH_3Si(OC_2H_5)_3$, and $C_2H_5Si(OC_2H_5)_3$.

One of these organometallic compounds and inorganic metal compounds may be used alone, or two or more thereof may be used in combination. Of these organometallic compounds and inorganic metal compounds, metal alkoxides are preferable since the compounds have high reactivity and easily produce polymers having metal-oxygen bonds. Specifically, alkoxide compounds of silicon, such as $Si(OCH_3)_4$, $Si(OC_2H_5)_4$, $Si(OC_3H_7)_4$, and $Si(OC_4H_9)_4$ are preferable since they are inexpensive and easily available, and each of them provides an excellent coating layer of a metal oxide. Also, oligomers obtained by hydrolyzing these silicon alkoxides partially so as to be condensed are preferably used. Examples thereof include ethyl silicate oligomers, which are pentamers on average, including 40% by mass of $SiO_2$.

It is also preferable to use, together with the metal alkoxides, a so-called silane coupling agent, in which one or two alkoxy groups of any one of the tetraalkoxy compounds of silicon are substituted by one or two alkyl groups or reactive groups. Examples of the silane coupling agent added to the backcoat layer in the invention include silane coupling agents each obtained by substituting one or two alkoxy groups of any one of the silicon tetraalkoxy compounds with one or two hydrophobic substituents such as long-chain alkyl groups having 4 to 20 carbon atoms, or fluorine-substituted alkyl groups. Particularly preferable are silane coupling agents having a fluorine-substituted alkyl group. Specific examples thereof include $CF_3CH_2CH_2Si(OCH_3)_3$, $CF_3CF_2CH_2CH_2Si(OCH_3)_3$, and $CF_3CH_2CH_2Si(OC_2H_5)_3$, and commercially available products such as LS-1090 (trade name, manufactured by Shin-Etsu Chemical Co., Ltd.). The amount of the silane coupling agent is from 5 to 90% by mass, and more preferably from 10 to 80% by mass, with respect to the total solid content of the backcoat layer.

Examples of the catalyst that may be used for obtaining the sol-gel coating solution for the backcoat layer include organic and inorganic acids, and organic and inorganic alkalis. Specific examples thereof include: inorganic acids such as hydrochloric acid, sulfuric acid, sulfurous acid, nitric acid, nitrous acid, hydrofluoric acid, phosphoric acid, and phosphorous acid; organic acids such as formic acid, acetic acid, propionic acid, butyric acid, glycolic acid, chloroacetic acid, dichloroacetic acid, trichloroacetic acid, fluoroacetic acid, bromoacetic acid, methoxyacetic acid, oxalacetic acid, citric acid, oxalic acid, succinic acid, malic acid, tartaric acid, fumaric acid, maleic acid, malonic acid, ascorbic acid, benzoic acid, substituted benzoic acids such as 3,4-dimethoxybenzoic acid, phenoxyacetic acid, phthalic acid, picric acid, nicotinic acid, picolinic acid, pyrazine, pyrazole, dipicolinic acid, adipic acid, p-toluic acid, terephthalic acid, 1,4-cyclohexene-2,2-dicarboxylic acid, erucic acid, lauric acid, n-undecanoic acid, and ascorbic acid; and alkalies such as hydroxides of alkali metals and alkaline earth metals, ammonia, ethanolamine, diethanolamine, and triethanolamine.

Other examples of the catalyst include sulfonic acids, sulfinic acids, alkyl sulfates, phosphonic acids, phosphates, and organic acids. Specific examples thereof include p-toluenesulfonic acid, dodecylbenzenesulfonic acid, p-toluenesulfinic acid, ethylic acid, phenylphosphonic acid, phenyl phosphate, and diphenyl phosphate.

One of these catalysts may be used alone, or two or more thereof may be used in combination. The amount of the catalyst(s) is preferably from 0.001 to 10% by mass, and more preferably from 0.05 to 5% by mass, with respect to the metal compound as the starting material. When the amount of the catalyst is less than this range, the initiation of sol-gel reaction is delayed. When the amount is more than the range, the reaction advances rapidly and uneven sol-gel particles are generated, so that the obtained coating layer easily peels off.

An appropriated amount of water is required for initiating the sol-gel reaction. The addition amount of water is preferably from 0.05 to 50 times by mole, and more preferably from 0.5 to 30 times by mole the amount of water used to completely hydrolyze the metal compound as the starting material. When the amount of the water is smaller than this range, hydrolysis does not proceed readily. When the amount is larger than this range, the reaction also does not proceed readily, presumably because of the low concentration of the starting material in the mixture.

A solvent may be further added to the sol-gel reaction solution. The solvent may be any solvent as far as the solvent dissolves the metal compound as the starting material, and allows dissolution or dispersion of sol-gel particles generated by the reaction. Examples thereof include lower alcohols such as methanol, ethanol, propanol and butanol, and ketones such as acetone, methyl ethyl ketone, and diethyl ketone. To improve the surface quality of the backcoat layer, or the like, a mono- or di-alkyl ether of a glycol such as ethylene glycol, diethylene glycol, triethylene glycol, propylene glycol, or dipropylene glycol, or an acetic acid ester may be used. Of these solvents, the lower alcohols, which are miscible with water, are preferable. The concentration of the sol-gel reaction solution is adjusted, with the solvent, so as to be a suitable concentration for the application of the solution. However, when the entire amount of the solvent is added to the reaction solution at the start of the reaction, the hydrolysis does not advance easily; this may possibly be because of the dilution of the starting material. Thus, it is preferred to add a portion of the solvent to the sol-gel reaction solution, and subsequently add the remainder thereto when the reaction advances to a certain extent.

The coating amount of the thus-prepared backcoat layer, which includes a metal oxide and a colloidal silica sol, is preferably from 0.01 to 3.0 g/m², and more preferably from 0.03 to 1.0 g/m².

2-2. Backcoat Layer which is an Organic Resin Coating Film

Another example of the backcoat layer in the invention is a backcoat layer which is an organic resin coating film formed on the back surface of the support.

Examples of the resin which may form the backcoat layer in an exemplary embodiment of the invention include thermosetting resins such as urea resins, epoxy resins, phenol resins, melamine resins, or diallyl phithalate resins. Of the resins, phenol resins are preferred since the physical strength of the layer formed therefrom is high. Specific examples of the phenol resins include Novolak resins such as phenol formaldehyde resins, m-cresol formaldehyde resins, p-cresol formaldehyde resins, m-/p-cresol mixed formaldehyde resins, phenol/cresol mixed formaldehyde resins (in which cresol may be m- or p-cresol, or a m-/p-cresol mixture), and pyrogallol acetone resin.

Other examples of the phenol resins include t-butylphenol formaldehyde resins as described in U.S. Pat. No. 4,123,279, and condensed polymer made from phenol having a substituent having 3 to 8 carbon atoms and formaldehyde, such as octylphenol formaldehyde resins.

The weight-average molecular weight of the phenol resin is preferably 500 or more from the viewpoint of image forming performance, and is more preferably from 1,000 to 700,000. The number-average molecular weight thereof is preferably 500 or more, and more preferably from 750 to 650,000. The dispersivity (i.e. weight-average molecular weight/number-average molecular weight) of phenol resin is preferably from 1.1 to 10.

One of the phenol resins may be used alone, or two or more thereof may be used in combination. When two or more thereof is used in combination, it may be possible to additionally use at least one of the following: a condensed polymer made from phenol having an alkyl group having 3 to 8 carbon atoms as a substituent and formaldehyde, such as a condensed polymer made from t-butylphenol and formaldehyde or a condensed polymer made from octylphenol and formaldehyde, as described in U.S. Pat. No. 4,123,279; or an organic resin having a phenolic structure having an electron withdrawing group on an aromatic ring, which is described in JP-A No. 2000-241972.

A surfactant may additionally be added to the backcoat layer in the invention to improve the surface quality or control the surface physical property. Examples of the surfactant include anionic surfactants having any one of carboxylic acid, sulfonic acid, sulfate, and phosphate; cationic surfactants such as aliphatic amines and quaternary ammonium salts; betaine amphoteric surfactants; nonionic surfactants such as aliphatic esters of a polyoxy compound, polyalkyleneoxide condensed surfactants, and polyethyleneimide condensed surfactants; and fluorine-containing surfactants. Of those, fluorine-containing surfactants are particularly preferable.

The addition amount of the surfactant may be appropriately selected in accordance with the purpose. In general, the amount thereof may be from 0.1 to 10.0% by mass of the backcoat layer.

As a fluorine-containing surfactant, a fluorine-containing surfactant having a perfluoroalkyl group in its molecule is particularly preferable. Such a fluorine-containing surfactant will be described in detail.

Examples of the fluorine-containing surfactant which can be suitably used for the backcoat layer include anionic surfactants such as perfluoroalkyl carboxylate, perfluoroalkyl sulfonate, or perfluoroalkyl phosphate; amphoteric surfactants such as perfluoroalkyl betaine; cationic surfactants such as perfluoroalkyl trimethylammonium salt; nonionic surfactants such as perfluoroalkyl amine oxide, perfluoroalkyl ethylene oxide adduct, an oligomer including a perfluoroalkyl group and a hydrophilic group, an oligomer including a perfluoroalkyl group and a lipophilic group, an oligomer including a perfluoroalkyl group, a hydrophilic group and a lipophilic group, or a urethane including a perfluoroalkyl group and a lipophilic group. Among these, it is preferable that the fluoroaliphatic group be a group represented by the following Formula (VII).

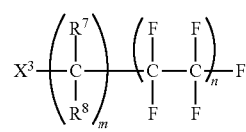

Formula (VII)

In Formula (VII), $R^7$ and $R^8$ each independently represent a hydrogen atom or an alkyl group having 1 to 4 carbon atoms; $X^3$ represents a single bond or a bivalent linking group, which may be selected from an alkylene group, an arylene group, and the like; m represents an integer of 0 or more; and n represents an integer of 1 or more.

When $X^3$ represents a bivalent linking group, the linking group, such as an alkylene or arylene group, may have a substituent. The linking group may further have, in the structure thereof, a linking group selected from ether, ester, amide groups and the like. Examples of the substituent that may be introduced into the alkylene or arylene group include: halogen atoms; and hydroxyl, mercapto, carboxyl, epoxy, alkyl and aryl groups. These substituents may further have a substituent. $X^3$ preferably represents an alkylene group, an arylene group, or an alkylene group having a linking group selected from ether, ester and amide groups, and the like, more preferably an unsubstituted alkylene group, an unsubstituted arylene group, or an alkylene group having therein an ether or ester group, and most preferably an unsubstituted alkylene group or an alkylene group having therein an ether or ester group.

The amount of a fluorine-containing surfactant in the backcoat layer is preferably from about 0.5 to about 10% by mass.

When the backcoat layer is an organic resin coating film, it may be provided on the back surface of an aluminum support by various methods. Examples thereof include: a method in which fine particles made of silica gel or the like is optionally added to the components of the backcoat layer (specifically, respective starting materials, the main component of which is an organic resin), and a coating solution is prepared, for example, by dissolving the resultant into an appropriate solvent or preparing an emulsion dispersion of the resultant, and this coating solution is applied onto the back surface of the support, and then dried; a method of adhering an organic resin layer which has been formed into a film onto the aluminum support via an adhesive or by heating; and a method of forming a melted coating film with a melt extruder, and then adhering the film onto the support. The method of applying and drying the solution is the most preferable method from the viewpoint of easiness of the control of the coating amount. The solvent used in this method may be one of the organic solvents as described in JP-A No. 62-251739, or a mixture of the solvents.

Examples of a device for applying the backcoat layer coating solution onto the support surface include a bar coater, a roll coater, a gravure coater, a curtain coater, an extruder, a slide hopper, and other known metering coaters. Of those, noncontact metering coaters such as a curtain coater, an extruder, and a slide hopper are preferable since the back surface of the aluminum support is not scratched or injured.

Regarding each of the backcoat layer including a metal oxide and a colloidal silica sol and the backcoat layer which is an organic resin layer, the thickness of the backcoat layer formed in the invention may be preferably from 0.1 to 8 µm. When the thickness is in this range, the surface sliding property of the aluminum support back surface is improved, and further a fluctuation in the thickness resulting from dissolution or swelling of the backcoat layer caused by a chemical agent used in the printing and before and after the printing, and a deterioration in print quality due to changes in printing pressure, resulting from the fluctuation, can be suppressed.

Of the backcoat layers, the backcoat layer which is an organic resin coating film is more preferable.

Method of Making Plate

Hereinafter, the method of making a plate from the planographic printing plate precursor according to the invention will be described.

In an exemplary embodiment of the method of making a plate from the planographic printing plate precursor, a plurality of the planographic printing plate precursors described above are stacked such that the protective layer directly contacts with the back surface of the support; the stack of the planographic printing plate precursors is then set in a plate setter and the planographic printing plate precursors are automatically conveyed one by one; each precursor is imagewise exposed to light having a wavelengths of 750 to 1400 nm; and then the precursor is developed to remove the non-image region so that the plate-making process is completed. Even when the planographic printing plate precursors according to the invention are stacked without inserting interleaving paper between the precursors, the adhesion between the planographic printing plate precursors and flaws on the protective layer can be suppressed, and therefore, the planographic printing plate precursor can be applied to the plate-making method described above. According to this plate-making method, since the stack of the planographic printing plate precursors in which the precursors are stacked without using interleaving paper between the precursors is used, the process of removing the interleaving paper is unnecessary, and thus the productivity in the plate-making process is improved.

As a matter of course, plate-making can be conducted using a stack in which the planographic printing plate precursors according to the invention and sheets of interleaving paper are stacked alternately.

Exposure to Light

As a light exposure process for the planographic printing plate precursor to which the curable composition of the present invention is applied, any known processes may be used without limitation.

As a light source for exposing the recording layer of the curable composition of the present invention to light, any known light sources may be used without limitation. The wavelength of a light source may be 300 nm to 1200 nm. Specifically, various lasers may be used as a light source. Especially, a semiconductor laser may be used which emits infrared rays having a wavelength of from 760 nm to 1200 nm.

A laser may be used as the light source. Examples of available laser light sources having a wavelength of 350 to 450 nm include:

gas lasers such as an Ar ion laser (364 nm, 351 nm, 10 mW to 1 W), a Kr ion laser (356 nm, 351 nm, 10 mW to 1 W), and a He—Cd laser (441 nm, 325 nm, 1 mW to 100 mW); solid lasers such as a combination of Nd:YAG ($YVO_4$) and THG crystal×twice (355 nm, 5 mW to 1 W) and a combination of Cr:LiSAF and an SHG crystal (430 nm, 10 mW); semiconductor lasers such as $KNbO_3$, a ring resonator (430 nm, 30 mW), a combination of a waveguide-type wavelength conversion element, AlGaAs semiconductor, and InGaAs semiconductor (380 nm to 450 nm, 5 mW to 100 mW), a combination of a waveguide-type wavelength conversion element, AlGaInP semiconductor, and AlGaAs semiconductor (300 nm to 350 nm, 5 mW to 100 mW), and AlGaInN semiconductor (350 nm to 450 nm, 5 mW to 30 mW); pulse lasers such as an $N_2$ laser (337 nm, pulse: 0.1 to 10 mJ) and XeF (351 nm, pulse: 10 to 250 mJ).

Of these, an AlGaInN semiconductor laser (commercially-available InGaN semiconductor laser, 400 to 410 nm, 5 to 30 mW) is suitable from the viewpoints of wavelength characteristics and cost.

Other examples of available light sources having a wavelength of 450 nm to 700 nm include an $Ar^+$ laser (488 nm), YAG-SHG laser (532 nm), a He—Ne laser (633 nm), a He—Cd laser, a red semiconductor laser (650 to 690 nm), and preferable examples of available light sources having a wavelength of 700 nm to 1200 nm include a semiconductor laser (800 to 850 nm), and a Nd-YAG laser (1064 nm).

Other examples of useful light sources include mercury lamps of ultrahigh pressure, high pressure, middle pressure, or low pressure, chemical lamps, carbon arc lamp, xenon lamps, metal halide lamps, ultraviolet laser lamps (e.g. an ArF excimer laser, a KrF excimer laser), various visible laser lamps, fluorescent lamps, tungsten lamps, solar light, and radiations such as electron beams, X rays, ion beams, and far infrared rays.

Among them, the light source of the rays used for the imagewise exposure of the image recording material according to the invention is preferably a light source having a luminescence wavelength in the near-infrared region to infrared region, and is particularly preferably a solid laser or a semiconductor laser.

The light exposure device may be any of internal drum system, external drum system, and flatbed system.

In particular, in the case where a light source having a wavelength of from 750 nm to 1400 nm is used for light exposure, the light source may be freely selected from those emitting rays having the wavelength. However, the imagewise exposure is preferably conducted by a solid laser or a semiconductor laser emitting infrared rays having a wavelength of from 750 nm to 1400 nm.

The laser preferably has an output of 100 mW or more, and preferably includes a multi-beam laser device for reducing the light exposure time. The light exposure time for one pixel is preferably 20µ seconds or shorter. The amount of radiation energy radiated per unit area of the planographic printing plate precursor is preferably from 10 to 300 $mJ/cm^2$.

The light exposure may be carried out by overlapping beams from a light source. The term "overlapping" means that exposure is conducted under such a condition that the sub-scanning pitch is smaller than the beam diameter. For example, when the beam diameter is expressed in terms of full-width at half-maximum (FWHM) of the beam intensity, overlapping can be quantitatively expressed in FWHM/sub-scanning pitch (overlapping coefficient). In the invention, the overlapping coefficient may be preferably 0.1 or more.

The scanning system for a light source in the light exposure device is not particularly limited, and a drum outer surface scanning method, a drum inner surface scanning method, a flatbed scanning method, or the like may be used. The channel of the light source may be a single channel or a multi-channel, but in the case of the drum outer surface scanning method, a multi-channel may be preferably used.

In plate-making, the planographic printing plate precursor according to the invention may be subjected to development treatment without carrying out special thermal treatment and/or water washing treatment usually conducted after exposure treatment. Because the thermal treatment is not carried out, image unevenness attributable to the thermal treatment can be prevented. Because the thermal treatment and/or water washing treatment is/are not carried out, stable high-speed treatment is possible in development treatment.

Development

Hereinafter, a developer for use in development treatment performed after the light-exposure treatment will be described.

Developer

The developer to be used in the development is not particularly limited as long as the developer is an aqueous solution having a pH of from 2.0 to 13.0. Examples of the developer include an aqueous solution including a carbonate ion, a hydrogen carbonate ion, and a water-soluble polymer compound (i.e. developer A), and an aqueous alkali solution including an alkali agent and having a pH of 14 or less (i.e. developer B).

1. Developer Including Carbonate Ion, Hydrogen Carbonate Ion, and Water-soluble Polymer Compound (Developer A)

In the developer including a carbonate ion, a hydrogen carbonate ion, and a water-soluble polymer compound, the carbonate ion and hydrogen carbonate ion are present, thereby exerting a buffer action. Accordingly, even when the developer is used for a long period of time, fluctuation in pH of the developer may be prevented, whereby deterioration in developing property, generation of development scum, and the like caused by the fluctuation in pH may be prevented.

The carbonate ion and hydrogen carbonate ion may be introduced into the developer by adding a carbonic acid salt and a hydrogen carbonate salt into the developer, or by adding a carbonic acid salt and a hydrogen carbonate salt and then controlling the pH of the developer so as to generate a carbonate ion and a hydrogen carbonate ion. Examples of the carbonic acid salt and the hydrogen carbonate salt include, but are not particularly limited thereto, alkali metal salts of carbonic acid and alkali metal salts of hydrogen carbonate. Examples of the alkali metal include lithium, sodium, and potassium, with sodium being particularly preferable. The alkali metal may be used singly, or two or more alkali metals may be used in combination.

The developer has a pH of preferably from 5 to 12, more preferably from 7 to 11, and most preferably from 8.5 to 10.8.

The total amount of the carbonate salt and the hydrogen carbonate salt which are included in the developer is preferably from 1 to 20 mass %, more preferably from 3 to 15 mass %, and particularly preferably 4 to 12 mass %, with respect to the mass of the aqueous solution. The total amount of 1 mass % or more may provide good developing property and high processing power. When the total amount is 20 mass % or less, precipitation of crystals hardly occurs, and gelatinization of the developer hardly occurs during neutralization for waste developer, whereby the waste developer may be treated without trouble.

In order to precisely control the pH and in order to help dissolution of the photosensitive layer in a non-image portion, the developer may further include an alkali agent such as an organic alkali agent. Examples of the organic alkali agent include monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine, and tetramethyl ammonium hydroxide. The alkali agent may be used singly, or two or more alkali agents may be used in combination.

Examples of the water-soluble polymer compound to be used in the developer include soybean polysaccharides, modified starch, gum arabic, dextrin, cellulose derivatives (such as carboxymethylcellulose, carboxyethylcellulose, and methylcellulose) and modified products thereof, pullulan, polyvinyl alcohol and derivatives thereof, polyvinyl pyrrolidone, polyacrylamide and acrylamide copolymers, vinyl methyl ether-maleic anhydride copolymers, vinyl acetate-maleic anhydride copolymers, and styrene-maleic anhydride copolymers. The water-soluble polymer compound preferably has an acid value of from 0 to 3.0 meq/g.

Hereinafter, the water-soluble polymer compounds will be described.

As the soybean polysaccharides, any known soybean polysaccharide may used, examples of which include SOYAFIBE (trade name, manufactured by Fuji Oil Co., Ltd.) of various grades. Preferable examples thereof include a soybean polysaccharide which provides a viscosity of from 10 to 100 mPa/sec when made into a 10-mass % aqueous solution.

Preferable examples of the modified starch include a starch having a structure represented by the following formula (IV). The starch having the structure represented by the formula (IV) may be obtained from corn, potato, tapioca, rice, wheat, or the like. The modified starch may be produced, for example, by decomposing the starch with an acid, an enzyme, or the like such that each decomposed product molecule has 5 to 30 glucose residues, and then adding oxypropylene to the decomposed product molecule under alkaline condition.

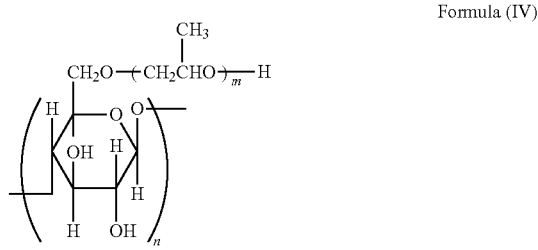

Formula (IV)

The degree of etherification (i.e. degree of substitution) of the compound of the formula (IV) is from 0.05 to 1.2 per glucose unit. In the formula (IV), n represents an integer of 3 to 30, and m represents an integer of 1 to 3.

Particularly preferable examples of the water-soluble polymer compound include soybean polysaccharides, modified starches, gum arabic, dextrin, carboxymethylcellulose, and polyvinyl alcohol.

The water-soluble polymer compound may be used singly, or two or more compounds may be used in combination. The developer may include the water-soluble polymer compound in an amount of preferably from 0.1 to 20 mass %, and more preferably from 0.5 to 10 mass %.

The developer may further include a surfactant such as an anionic surfactant, a nonionic surfactant, or a cationic surfactant.

Examples of the anionic surfactant which may be added to the developer include fatty acid salts, abietic acid salts, hydroxyalkane sulfonic acid salts, alkane sulfonic acid salts, dialkyl sulfosuccinic acid salts, straight-chain alkylbenzene sulfonic acid salts, branched-chain alkylbenzene sulfonic acid salts, alkylnaphthalene sulfonic acid salts, alkylphenoxypolyoxyethylenepropyl sulfonic acid salts, polyoxyethylenealkylsulfophenyl ether salts, sodium salts of N-methyl-N-oleyltaurine, N-alkylsulfosuccinic acid monoamide disodium salts, petroleum sulfonic acid salts, sulfated castor oil, sulfated beef tallow oil, sulfated esters of fatty acid alkyl ester, alkyl sulfate salts, polyoxyethylene alkyl ether sulfate salts, fatty acid monoglyceride sulfate salts, polyoxyethylene alkylphenyl ether sulfate salts, polyoxyethylene styrylphenyl ether sulfate salts, alkyl phosphate salts, polyoxyethylene alkyl ether phosphate salts, polyoxyethylene alkylphenyl ether phosphate salts, partially-saponified products of a styrene-maleic anhydride copolymer, partially-saponified products of an olefin-maleic anhydride copolymer, and formalin condensates of naphthalene sulfonate salts. Of those, particularly preferable are dialkyl sulfosuccinic acid salts, alkyl sulfate salts, and alkylnaphthalene sulfonic acid salts.

The cationic surfactant which may be added to the developer is not particularly limited, and any known cationic surfactant may be used. Examples thereof include alkylamine salts, quaternary ammonium salts, polyoxyethylene alkylamine salts, and polyethylene polyamine derivatives.

Examples of the nonionic surfactant which may be added to the developer include polyethylene glycol type nonionic surfactants such as an ethyleneoxide adduct of a higher alcohol, an ethyleneoxide adduct of an alkyl phenol, an ethyleneoxide adduct of a fatty acid, an ethyleneoxide adduct of a polyhydric alcohol fatty acid ester, an ethyleneoxide adduct of a higher alkylamine, an ethyleneoxide adduct of a fatty acid amide, an ethyleneoxide adduct of fat and oil, an ethyleneoxide adduct of polypropylene glycol, a dimethylsiloxane-ethyleneoxide block copolymer, and a dimethylsiloxane-(propylenoxide-ethyleneoxide) block copolymer, and polyhydric alcohol type nonionic surfactants such as a fatty acid ester of glycerol, a fatty acid ester of pentaerythritol, a fatty acid ester of sorbitol, a fatty acid ester of sorbitan, a fatty acid ester of sucrose, an alkyl ether of a polyhydric alcohol, and a fatty acid amide of an alkanolamine.

Preferable examples of the surfactant which is used in the developer include an ethyleneoxide adduct of sorbilol and sorbitan fatty acid ester, an ethyleneoxide adduct of polypropylene glycol, a dimethylsiloxane-ethyleneoxide block copolymer, a dimethylsiloxane-(propyleneoxide-ethyleneoxide) block copolymer, and a fatty acid ester of a polyhydric alcohol.

From the viewpoints of stable solubility in or miscibility with water, the nonionic surfactant may have a hydrophile-lipophile balance (HLB) value of preferably 6 or more, and more preferably 8 or more. Moreover, oxyethylene adducts of acetylene glycol or acetylene alcohol, fluorine-containing surfactants, or silicon-containing surfactants may also be used.

The surfactant may be used singly, or two or more surfactants may be used in combination. The developer may include the surfactant in an amount of preferably from 0.01 to 10 mass %, and more preferably from 0.01 to 5 mass %.

The developer may further include at least one of a moistening agent, a preservative agent, a chelate compound, a defoaming agent, an organic acid, an organic solvent, an inorganic acid, an inorganic salt, or the like.

Examples of the moistening agent include ethylene glycol, propylene glycol, triethylene glycol, butyrene glycol, hexylene glycol, diethylene glycol, dipropylene glycol, glycerin, trimethylolpropane, and diglycerin. The moistening agent may be used singly, or two or more moistening agents may be used in combination. The amount of the moistening agent to be used may usually be from 0.1 to 5 mass % with respect to the total mass of the developer.

Examples of the preservative agent include phenol and derivatives thereof, formalin, imidazole derivatives, sodium dehydroacetate, 4-isothiazolin-3-one derivatives, benzoisothiazolin-3-one, 2-methyl-4-isothiazolin-3-one, benztriazole derivatives, amidine derivatives, guanidine derivatives, quaternary ammonium salts, derivatives of pyridine, quinoline, and guanidine, diazine, triazole derivatives, oxazole, oxazine derivatives, nitrobromoalcohols such as 2-bromo-2-nitropropane-1,3-diol, 1,1-dibromo-1-nitro-2-ethanol, and 1,1-dibromo-1-nitro-2-propanol. It is preferable to use two or more of the preservatives in combination so as to obtain efficacy in killing various molds and bacteria. The preservative may be added in an amount stably exerting its effect on bacteria, molds, yeasts, and the like. Although the amount of the preservative may depend on the types of the bacteria, molds, yeasts, and the like, it is preferably from 0.01 to 4 mass % with respect to the developer.

Examples of the chelate compound include: ethylenediamine tetraacetic acid, and potassium salt and sodium salt thereof; diethylenetriamine pentaacetic acid, and potassium salt and sodium salt thereof; triethylenetetraamine hexaacetic acid, and potassium salt and sodium salt thereof; hydroxyethyl ethylenediamine triacetic acid, and potassium salt and sodium salt thereof; nitrilotriacetic acid and sodium salt thereof; 1-hydroxyethane-1,1-diphosphonic acid, potassium salt and sodium salt thereof; and organic phosphonic acids and phosphonoalkane tricarboxylic acids such as aminotri (methylenephosphonic acid), and potassium salt and sodium salt thereof. In addition to the sodium salts and potassium salts of the chelate agents, organic amine salts of the chelate agents may also be preferably used. The chelate agent may be selected from those which can stably exist in a developer composition and do not adversely affect printing property. The amount of the chelate agent to be added is preferably from 0.001 to 1.0 mass % with respect to the developer.

Examples of the defoaming agent include generally-used, self-emulsifying or emulsifying silicone defoaming agents, and nonionic compounds having a HLB value of 5 or less, with the silicone defoaming agents being preferable. Examples of the silicone defoaming agents, which can be used, include emulsifying and dispersing defoaming agents and solubilizing defoaming agents. The amount of the defoaming agent may be preferably from 0.001 to 1.0 mass % with respect to the developer.

Examples of the organic acid include citric acid, acetic acid, oxalic acid, malonic acid, salicylic acid, caprylic acid, tartaric acid, malic acid, lactic acid, levulinic acid, p-toluenesulfonic acid, xylenesulfonic acid, phytic acid, and organic phosphonic acid. Alkali metal salts or ammonium salts of the organic acids may also be used. The amount of the organic acid may be preferably from 0.01 to 0.5 mass % with respect to the developer.

Examples of the organic solvent include aliphatic hydrocarbons such as hexane, heptane, ISOPAR E, ISOPAR H, and ISOPAR G (all trade names, manufactured Exxon Mobil Corporation), gasoline, and kerosene; aromatic hydrocarbons such as toluene and xylene; halogenated hydrocarbons such as methylene dichloride, ethylene dichloride, trichlene, and monochlorobenzene; and polar solvents.

Examples of the polar solvents include alcohols such as methanol, ethanol, propanol, isopropanol, benzyl alcohol, ethylene glycol monomethyl ether, 2-ethoxyethanol, diethylene glycol monoethyl ether, diethylene glycol monohexyl ether, triethylene glycol monomethyl ether, propylene glycol monoethyl ether, propylene glycol monomethyl ether, polyethylene glycol monomethyl ether, polypropylene glycol, tetraethylene glycol, ethylene glycol monobutyl ether, ethylene glycol monobenzyl ether, ethylene glycol monophenyl ether, methylphenylcarbinol, n-amyl alcohol, and methylaniyl alcohol, ketones such as acetone, methyl ethyl ketone, ethyl butyl ketone, methyl isobutyl ketone, and cyclohexanone, esters such as ethyl acetate, propyl acetate, butyl acetate, amyl acetate, benzyl acetate, methyl lactate, butyl lactate, ethylene glycol monobutyl acetate, propylene glycol monomethyl ether acetate, diethylene glycol acetate, diethyl phthalate, and butyl levulinate, and other compounds such as triethyl phosphate, tricresyl phosphate, N-phenylethanolamine, and N-phenyldiethanolamine.

When the organic solvent is a solvent insoluble in water, the organic solvent may be dissolved in water with a surfactant or the like prior to use. When the developer includes an organic solvent, the concentration of the solvent may be preferably less than 40 mass % in the developer from the viewpoints of safety and inflammability.

Examples of the inorganic acid and inorganic salt include phosphoric acid, metaphosphoric acid, ammonium primary phosphate, ammonium secondary phosphate, sodium primary phosphate, sodium secondary phosphate, potassium primary phosphate, potassium secondary phosphate, sodium tripolyphosphate, potassium pyrophosphate, sodium hexametaphosphate, magnesium nitrate, sodium nitrate, potassium nitrate, ammonium nitrate, sodium sulfate, potassium sulfate, ammonium sulfate, sodium sulfite, ammonium sulfite, sodium hydrogen sulfate, and nickel sulfate. The amount of the inorganic salt or inorganic acid may be preferably from 0.01 to 0.5 mass % with respect to the total mass of the developer.

2. Aqueous Alkali Solution Including Alkali Agent and having pH of 14 or Less (Developer B)

Alternatively, an aqueous alkali solution including an alkali agent and having a pH of 14 or less (preferably from 9.0 to 13.0) may be used as the developer.

Alkali Agent

Examples of the alkali agent used in the developer include inorganic alkali agents such as tertiary sodium phosphate, tertiary potassium phosphate, tertiary ammonium phosphate, sodium borate, potassium borate, ammonium borate, sodium hydroxide, potassium hydroxide, ammonium hydroxide and lithium hydroxide, and organic alkali agents such as monomethylamine, dimethylainine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethylene imine, ethylene diamine, pyridine and tetramethyl ammonium hydroxide. One of the alkali agents may be used, or a combination of two or more of the alkali agents may be used.

Another example of the alkali agent is an alkali silicate. The alkali silicate may be used in combination with a base. The alkali silicate to be used may be a salt which exhibits alkalinity when dissolved in water. Examples thereof include sodium silicate, potassium silicate, lithium silicate, and ammonium silicate. One of these alkali silicates may be used alone, or two or more thereof may be used in combination.

When the alkali silicate is used, the developer properties can easily be adjusted into optimal ranges by adjusting the concentration of the silicate, and the blend ratio between silicon oxide $SiO_2$, which is a silicate component, and an alkali oxide $M_2O$, which is an alkali component, wherein M represents an alkali metal or an ammonium group. The blend ratio of silicon oxide $SiO_2$ to the alkali oxide $M_2O$ (the ratio by mole of $SiO_2/M_2O$) is preferably from 0.75 to 4.0, and more preferably from 0.75 to 3.5 from the viewpoints of reducing stains generated by excessive dissolution (etching) of the anodized layer on the support, or suppressing the generation of insoluble gas generated from the formation of a complex from dissolved aluminum and the silicate, or the like.

Regarding the concentration of the alkali silicate in the developer, the amount of $SiO_2$ is preferably from 0.01 to 1 mol/L, and more preferably from 0.05 to 0.8 mol/L, with respect to the mass of the developer from the viewpoints of: the developability; effects of suppressing the dissolution (etching) of the anodized layer on the support, suppressing the generation of precipitations or crystals, and preventing gelatinization of the developer in neutralization at the time of waste solution disposal; and the like.

Aromatic Anionic Surfactant

The developer B may preferably include an aromatic anionic surfactant from the viewpoints of a development promoting effect, dispersion stability of the negative-working polymerizable recording layer components and protective layer components in the developer, and development stabilization.

The aromatic anionic surfactant to be used is not particularly limited, and may be a compound represented by the following Formula (VIII) or Formula (IX).

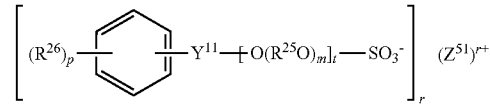

Formula (VIII)

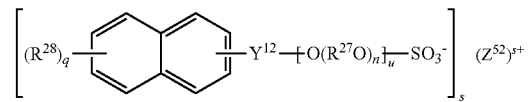

Formula (IX)

In Formula (VIII) or (IX), $R^{25}$ and $R^{27}$ each independently represent a linear or branched alkylene group having 1 to 5 carbon atoms, and specific examples include an ethylene group, a propylene group, a butylene group and a pentylene group, among which an ethylene group and a propylene group are particularly preferable.

m and n each independently represent an integer from 1 to 100, and is preferably from 1 to 30, more preferably from 2 to 20. When m is 2 or greater, there are plural $R^{25}$s which may be the same as or different from each other. When n is 2 or greater, there are plural $R^{27}$s which may be the same as or different from each other.

t and u each independently represent 0 or 1.

$R^{26}$ and $R^{28}$ each independently represent a linear or branched alkyl group having 1 to 20 carbon atoms, and specific examples include a methyl group, an ethyl group, a propyl group, a butyl group, a hexyl group and a dodecyl group, among which a methyl group, an ethyl group, an iso-propyl group, an n-propyl group, an n-butyl group, an iso-butyl group and a tert-butyl group are particularly preferable.

Each of p and q represents an integer from 0 to 2. Each of $Y^{11}$ and $Y^{12}$ represents a single bond or an alkylene group having 1 to 10 carbon atoms and is preferably a single bond, a methylene group or an ethylene group, particularly preferably a single bond.

$(Z^{51})^{r+}$ and $(Z^{52})^{s+}$ each independently represent an alkali metal ion, an alkaline earth metal ion, unsubstituted ammonium ion or an ammonium ion substituted by an alkyl group. Specific examples include a lithium ion, a sodium ion, a potassium ion, a magnesium ion, a calcium ion, an ammonium ion, a secondary to quaternary ammonium ion substituted by an alkyl, aryl or aralkyl group having 20 or less carbon atoms. $(Z^{51})^{r+}$ and $(Z^{52})^{s+}$ each is particularly preferably a sodium ion. r and s each independently represent 1 or 2.

Specific examples of the aromatic anionic surfactant are shown below. However, the examples should not be construed as limiting the invention.

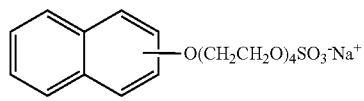
K-1

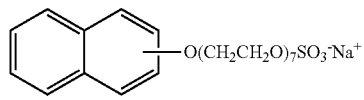
K-2

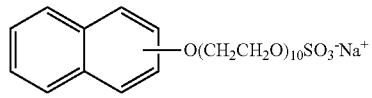
K-3

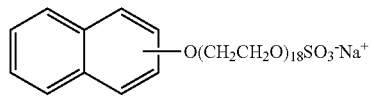
K-4

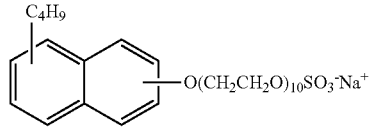
K-5

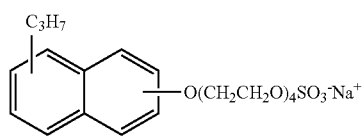
K-6

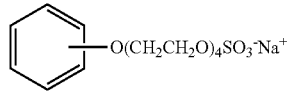
K-7

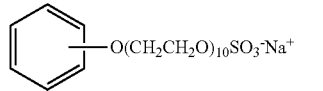
K-8

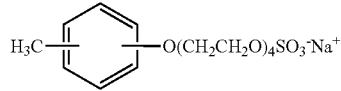
K-9

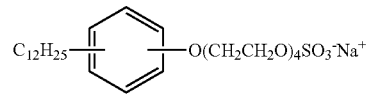
K-10

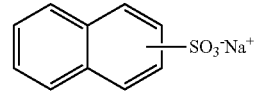
K-11

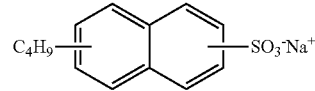
K-12

In an exemplary embodiment, only one aromatic anionic surfactant is used. In another exemplary embodiment, an arbitrary combination of two or more aromatic anionic surfactants is used. The amount of aromatic anionic surfactant to be added is not particularly limited. From the viewpoints of developability, the solubility of the recording layer components and the specified protective layer components, and the printing durability of the resultant printing plate, the concentration of the aromatic anionic surfactant(s) in the developer may be in a range of from 1.0 to 10% by mass, and preferably in a range of from 2 to 10% by mass.

In the developer, the aromatic anionic surfactant may be used in combination with one or more other surfactants. Such other surfactants may be nonionic surfactants, and examples thereof include polyoxyethylene alkyl ethers such as polyoxyethylene naphthyl ether, polyoxyethylene alkyl phenyl ether, polyoxyethylene lauryl ether, polyoxyethylene cetyl ether, and polyoxyethylene stearyl ether, polyoxyethylene alkyl esters such as polyoxyethylene stearate, sorbitan alkyl esters such as sorbitan monolaurate, sorbitan monostearate, sorbitan distearate, sorbitan monooleate, sorbitan sesquioleate and sorbitan trioleate, and monoglyceride alkyl esters such as glycerol monostearate and glycerol monooleate.

The amount of such additional surfactant in the developer may be from 0.1 to 10% by mass.

Chelate Agent

For the purpose of preventing the influence from calcium ions etc. contained in hard water, for example, a chelate agent for divalent metals may be included in the developer. Examples of the chelate agent for divalent metals include polyphosphates such as $Na_2P_2O_7$, $Na_5P_3O_3$, $Na_3P_3O_9$, $Na_2O_4P(NaO_3P)PO_3Na_2$, and Calgon (sodium polymetaphosphate), aminopolycarboxylic acids (for example, ethylenediaminetetraacetic acid, potassium salts thereof, and sodium salts thereof, amine salt thereof; diethylenetriaminepentaacetic acid, potassium salt thereof, sodium salt thereof; triethylenetetraminehexaacetic acid, potassium salt thereof, sodium salt thereof; hydroxyethylenediaminetriacetic acid, potassium salt thereof, sodium salt thereof; nitrilotriacetic acid, potassium salt thereof, sodium salt thereof; 1,2-diaminocyclohexanetetraacetic acid, potassium salt thereof, sodium salt thereof; 1,3-diamino-2-propanol tetraacetic acid, potassium salt thereof, sodium salt thereof); other polycarboxylic acids (for example, 2-phosphonobutane-1,2,4-tricarboxylic acid, potassium salt thereof, sodium salt thereof; 2-phosphonobutanone-2,3,4-tricarboxylic acid, potassium salt thereof, sodium salt thereof), organic phosphonic acids (for example, 1-phosphonoethane-1,2,2-tricarboxylic acid, potassium salt thereof, sodium salt thereof; 1-hydroxyethane-1,1-diphosphonic acid, potassium salt thereof, sodium salt thereof; and aminotri(methylene phosphonic acid), potassium salt thereof, and sodium salt thereof, among which ethylenediaminetetraacetic acid, potassium salt thereof, sodium salt thereof, amine salt thereof; ethylenediaminetetra (methylenephosphonic acid), ammonium salt thereof, potassium salt thereof; hexamethylenediaminetetra(methylenephosponic acid), ammonium salt thereof, and potassium salt thereof are particularly preferable.

The optimum amount of the chelate agent varies depending on the hardness and amount of hard water used. In general, the chelate agent may be included in an amount of 0.01 to 5% by mass, and more preferably from 0.01 to 0.5% by mass, in the developer at use.

In addition, an alkali metal salt of an organic acid and/or an alkali metal salt of an inorganic acid may be added as the development regulating agent to the developer. For example, sodium carbonate, potassium carbonate, ammonium carbonate, sodium citrate, potassium citrate or ammonium citrate, or a combination of two or more of such salts may be used.

In addition to the components described above, components as described below may be also included, if necessary, in the developer: organic carboxylic acids such as benzoic acid, phthalic acid, p-ethylbenzoic acid, p-n-propylbenzoic acid, p-isopropylbenzoic acid, p-n-butylbenzoic acid, p-t-butylbenzoic acid, p-t-butylbenzoic acid, p-2-hydroxyethylbenzoic acid, decanoic acid, salicylic acid and 3-hydroxy-2-naphthoic acid, organic solvents such as propylene glycol, and other components such as a reducing agent, a dye, a pigment and a preservative.

From the viewpoints of developability of the non-image region during development, reduction of damage to the image portion, and handling property of the developer, the pH of the developer B at 25° C. may be in a range of from pH 10 to 12.5, and more preferably in a range of from pH 11 to 12.5.

The conductivity x of the developer A or B may be more than 2 mS/cm but less than 30 mS/cm (i.e. x satisfies the inequality "2 mS/cm<x<30 mS/cm"), and preferably from 5 mS/cm to 25 mS/cm. For adjusting the conductivity, a conductivity adjustor such as an alkali metal salt of an organic acid, or an alkali metal salt of an inorganic acid may be added.

The developer A or B may be used as a developer and a replenisher for the light-exposed planographic printing plate precursor, and is preferably applied to an automatic developing machine. When the planographic printing plate precursor is developed with an automatic developing machine, the developer is exhausted depending on throughput. Therefore, processing power may be recovered by using a replenisher or a fresh developer. This replenishing system can be preferably used also in the plate-making method in the invention.

To restore the processing power of the developer in an automatic developing machine, replenishing may be conducted by a method described in U.S. Pat. No. 4,882,246. Developers described in JP-A No. 50-26601, JP-A No. 58-54341, JP-B No. 56-39464, JP-B No. 56-42860 and JP-B No. 57-7427 are also preferable.

The planographic printing plate precursor which was subjected to development treatment in this manner may be post-treated with washing water, a surfactant-containing rinse, or a desensitizing gum solution including gum arabic or a starch derivative, as described in JP-A No. 54-8002, JP-A No. 55-115045 and JP-A No. 59-58431. Various combinations of these treatments may be used.

For the purpose of improving strength of image portion and printing durability, the entire surface of the image after development may be heated or exposed to light. Extremely severe conditions may be utilized for the heating after development, and the heating temperature may usually be in a range of from 200 to 500° C.

The planographic printing plate obtained by these treatments may be placed onto an offset printing machine, and used for printing on a large number of sheets.

At the time of printing, a plate cleaner used for removing dirt from the plate may be a PS plate cleaner conventionally known in the art, such as Multi-cleaners CL-1, CL-2, CP, CN-4, CN, CG-1, PC-1, SR or IC (Fuji Film Corporation).

The planographic printing plate of the planographic printing plate precursor of the present invention enables production of a number of sheets of printed products as described above.

Hereinafter, exemplary embodiments of the invention will be described.

(1) A curable composition, including:
a polymerizable compound having an ethylenically unsaturated bond;
a binder;
a radical polymerization initiator; and
at least one amine compound represented by Formula (I), Formula (II), or Formula (III):

(I)

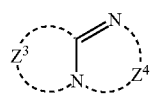

(II)

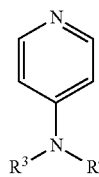

(III)

wherein, in Formulae (I) to (III), $R^1$ and $R^2$ each independently represent a hydrogen atom, an alkyl group, a cycloalkyl group, an aralkyl group, an aryl group, or an acyl group; $R^3$ and $R^4$ each independently represent a hydrogen atom, an alkyl group, a cycloalkyl group, an aralkyl group, or an aryl group; $Z^1$ to $Z^4$ each independently represent an atomic group that forms a monocyclic or polycyclic structure with the amino group(s); and $Z^1$ and $Z^2$ may be combined with each other to form a ring and $Z^3$ and $Z^4$ may be combined with each other to form a ring.

(2) The curable composition according to item (1), wherein the amine compound is represented by Formula (I); the alkyl group represented by $R^1$ or $R^2$ is a straight chain or branched alkyl group having 1 to 20 carbon atoms; the cycloalkyl group represented by $R^1$ or $R^2$ has 3 to 20 carbon atoms; the aralkyl group represented by $R^1$ or $R^2$ has 7 to 20 carbon atoms; and the aryl group represented by $R^1$ or $R^2$ has 6 to 20 carbon atoms.

(3) The curable composition according to item (1), wherein the amine compound is represented by Formula (I) and the number of carbon atoms of $Z^1$ and/or $Z^2$ is 2 to 10.

(4) The curable composition according to item (1), wherein the amine compound is represented by Formula (I), and the substituent represented by $R^1$ or $R^2$ may further include a substituent selected from the group consisting of an alkyl group, a cycloalkyl group, an aralkyl group, an aryl group, an acyl group, a hydroxyl group, an amino group, a halogen group, a carboxyl group, a carbonyl group, a sulfonyl group, and a nitro group.

(5) The curable composition according to item (1), wherein the amine compound is represented by Formula (II) and the number of carbon atoms of $Z^3$ and/or $Z^4$ is 2 to 10.

(6) The curable composition according to item (1), wherein the amine compound is represented by Formula (III); the alkyl group represented by $R^3$ or $R^4$ is a straight chain or branched alkyl group having 1 to 20 carbon atoms; the aralkyl group represented by $R^3$ or $R^4$ has 7 to 20 carbon atoms; and the aryl group represented by $R^3$ or $R^4$ has 6 to 8 carbon atoms.

(7) The curable composition according to item (1), wherein the amine compound is represented by Formula (III); and the substituent represented by $R^3$ or $R^4$ may further include a substituent selected from the group consisting of an alkyl group, a cycloalkyl group, an aralkyl group, an aryl group, an acyl group, a hydroxyl group, an amino group, a halogen group, a carboxyl group, a carbonyl group, a sulfonyl group, and a nitro group.

(8) The curable composition according to item (1), wherein the amine compound represented by Formula (I), Formula (II), or Formula (III) is included in an amount of 1 to 100 parts by mass with respect to 100 parts by mass of the polymerizable compound having an ethylenically unsaturated bond.

(9) The curable composition according to item (1), wherein the amine compound represented by Formula (I), Formula (II), or Formula (III) has a molecular weight of from about 90 to about 1500.

(10) The curable composition according to item (1), further comprising an infrared absorbing agent.

(11) The curable composition according to item (1), further including a sensitizing dye.

(12) The curable composition according to item (11), wherein the sensitizing dye has an absorption maximum in the range of from 300 nm to 450 nm.

(13) An image forming material, including:

a support; and a recording layer provided on the support, the recording layer including a curable composition including:

a polymerizable compound having an ethylenically unsaturated bond;

a binder;

a radical polymerization initiator; and at least one amine compound represented by Formula (I), Formula (II), or Formula (III):

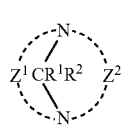

(I)

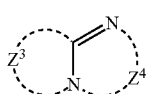

(II)

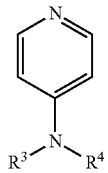

(III)

wherein, in Formulae (I) to (III), $R^1$ and $R^2$ each independently represent a hydrogen atom, an alkyl group, a cycloalkyl group, an aralkyl group, an aryl group, or an acyl group; $R^3$ and $R^4$ each independently represent a hydrogen atom, an alkyl group, a cycloalkyl group, an aralkyl group, or an aryl group; $Z^1$ to $Z^4$ each independently represent an atomic group that forms a monocyclic or polycyclic structure with the amino group(s); and $Z^1$ and $Z^2$ may be combined with each other to form a ring and $Z^3$ and $Z^4$ may be combined with each other to form a ring.

(14) The image forming material according to item (13), further including an oxygen blocking layer on the recording layer.

(15) A planographic printing plate precursor, including the image forming material according to item (13).

(16) A planographic printing plate precursor, including the image forming material according to item (14).

All publications, patent applications, and technical standards mentioned in this specification are herein incorporated by reference to the same extent as if each individual publication, patent application, or technical standard was specifically and individually indicated to be incorporated by reference.

EXAMPLES

Hereinafter, the present invention will be described with reference to Examples, but is not particularly limited thereto.

Examples 1 to 6 and Comparative Examples 1 to 5

A curable composition coating solution having the formulation described below was prepared, and was applied onto an aluminum plate with a wire bar. The resultant was dried at 115° C. for 34 seconds in a hot air dryer.

| Curable composition coating solution | |
|---|---|
| Infrared absorbing agent (IR-1: the following structure) | 0.074 g |
| Polymerization initiator (P-1: the following structure) | 0.300 g |
| Sensitization aid (AM-1: the following structure) | 0.161 g |
| Specific amine compound or a comparative compound (Compound shown in Table 1) | 0.200 g or 0 g (not added) |
| Polymerizable compound (A-BPE-4 (tradename), manufactured by Shin-Nakamura Chemical Co., Ltd.) | 1.00 g |
| Binder polymer (BT-1: the following structure) (Weight average molecular weight: 100,000) | 1.00 g |
| Colorant (CL-1: the following structure) | 0.04 g |
| Fluorine-containing surfactant (MEGAFAC F-780-F (tradename, manufactured by Dainippon Ink & Chemicals, Inc.), methyl isobutyl ketone (MIBK) 30 mass % solution) | 0.016 g |
| Methyl ethyl ketone | 10.4 g |
| Methanol | 5.16 g |
| 1-methoxy-2-propanol | 10.4 g |

The structures of the polymerization initiator (P-1), the infrared absorbing agent (IR-1), the additive (AM-1), the polymerizable compound (A-BPE-4, tradename, manufactured by Shin-Nakamura Chemical Co., Ltd.), the binder polymer (BT-1), and the colorant (CL-1) were shown below.

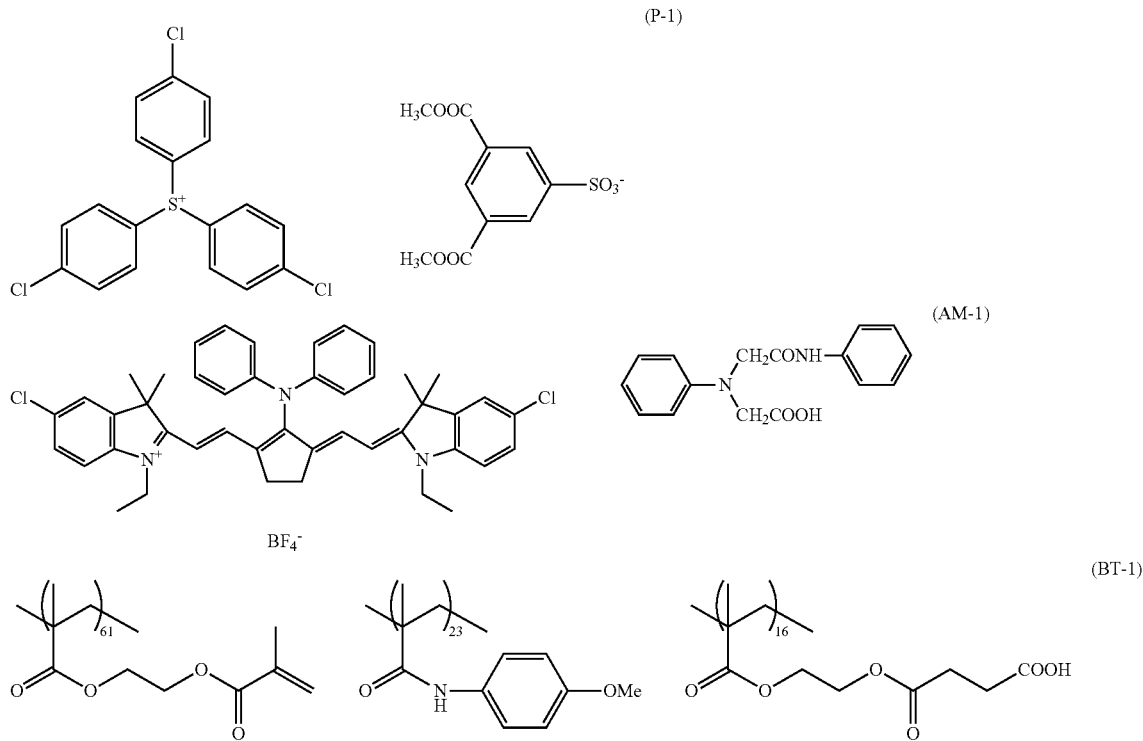

Evaluation of Curing Properties of Curable Composition

Cured films each made from one of the curable composition coating solutions of Examples 1 to 6 and Comparative Examples 1 to 5 were evaluated with respect to resistance against polymerization inhibition due to oxygen ($O_2$), as follows.

More specifically, each of the cured films was exposed to light at an energy of 72 mJ/cm$^2$ using a FT-IR (tradename: NICOLET 6700 manufactured by Thermo Fisher Scientific Co. Ltd) having, as a light source, a UV light source (tradename: EXECURE 3000, manufactured by HOYA CANDEO OPTRONICS, Inc.), in a nitrogen atmosphere (indicated as ($N_2$) in Table 1), and also in air without performing oxygen blocking (indicated as (Air) in Table 1), and the disappearance ratio of double bonds in each of the materials (in the range of from 800 to 820 cm$^{-1}$) at that time was measured.

Here, cured films with a high disappearance ratio of double bonds indicate that double bonds in a polymerizable compound were used in the polymerization curing, and then disappeared. It is thought that cured films having a high disappearance ratio under the condition of "Air" in the table are less likely to suffer from polymerization inhibition due to oxygen, and are efficiently cured with high sensitivity. The results of the evaluation are shown in Table 1.

TABLE 1

| | (D) Specific amine compound or Comparative compound | C=C disappearance ratio ($N_2$) 72 mJ/cm$^2$ | C=C disappearance ratio (Air) 72 mJ/cm$^2$ |
|---|---|---|---|
| Example 1 | Hexamethylenetetramine (I-1) | 58% | 55% |
| Example 2 | 1,3,5-triaza-adamantan-7-ylamine (I-2) | 62% | 58% |
| Example 3 | 1,8-diazabicyclo[5,4,0]-7-undecene (II-1) | 62% | 60% |
| Example 4 | 7-methyl-1,5,7-tri-azabicyclo[4,4,0]dec-5-ene (II-5) | 61% | 60% |
| Example 5 | 4-di(methylamino) pyridine (III-3) | 41% | 40% |
| Example 6 | 4-(methylamino)pyridine (III-2) | 38% | 37% |
| Comparative Example 1 | No additive (for comparative purposes) | 44% | 8% |
| Comparative Example 2 | Didecylmethylamine (for comparative purposes: a chain amine) | 68% | 30% |
| Comparative Example 3 | N,N-didecylmethylamine (for comparative purposes: a chain amine) | 64% | 30% |
| Comparative | N,N-diethylaniline | 49% | 16% |

TABLE 1-continued

|  | (D) Specific amine compound or Comparative compound | C═C disappearance ratio (N$_2$) 72 mJ/cm$^2$ | C═C disappearance ratio (Air) 72 mJ/cm$^2$ |
|---|---|---|---|
| Example 4 | (for comparative purposes: an aniline) | | |
| Comparative Example 5 | N,N-diethyl-p-toluidine (for comparative purposes: an aniline) | 51% | 16% |

As is clear from the results shown in Table 1, the curable composition of the present invention formed a coating film without an oxygen blocking layer even in the case of low energy exposure, and, upon curing, polymerization proceeded efficiently. Moreover, little suppression of polymerization in an oxygen atmosphere was observed, compared to curing in a nitrogen atmosphere, under which the composition was not influenced by oxygen. In contrast, the Comparative Examples showed significant reductions in disappearance ratio in an oxygen atmosphere compared to a nitrogen atmosphere. All of the curable compositions of the present invention were confirmed to show high resistance against polymerization inhibition due to oxygen, compared to the Comparative Examples.

Example 7

Planographic Printing Plate Precursor
Preparation of Support

A melt of a JIS A1050 aluminum alloy including 99.5% by mass or more aluminum, 0.30% by mass Fe, 0.10% by mass Si, 0.02% by mass Ti, and 0.013% by mass Cu was subjected to cleaning treatment and then cast. In this cleaning treatment, the melt was degassed to remove unnecessary gas such as hydrogen, and filtered through a ceramic tube filter. Casting was conducted by a DC casting method. After 10-mm surface layer was removed from the coagulated ingot plate of 500 mm in thickness, the plate was subjected to homogenization treatment at 550° C. for 10 hours so that intermetallic compounds were not agglomerated.

Then, the plate was hot-rolled at 400° C., then annealed at 500° C. for 60 seconds in a continuous annealing furnace and cold-rolled to form an aluminum rolled plate of 0.30 mm in thickness. By regulating the roughness of pressure rollers, the central line average surface roughness Ra after cold rolling was regulated to be 0.2 µm. Thereafter, the plate was placed in a tension leveler to improve flatness.

As surface treatment for finishing the plate as a support of planographic printing plate, the following treatments (a) to (f) were performed consecutively. After each treatment and washing, a nip roller was used to drain off excess liquid.

(a) The aluminum plate was subjected to etching treatment performed under the following conditions: the concentration of sodium hydroxide was 26% by mass, the concentration of ammonium ions was 6.5% by mass, and the temperature was 70° C. 5 g/m$^2$ of the aluminum plate was dissolved, followed by washing with water.

(b) The aluminum plate was subjected to desmutting treatment performed by spraying using an aqueous 1 mass % concentration of nitric acid solution (including 0.5% by mass of aluminum ions) maintained at 30° C., followed by washing with water.

(c) Electrochemical surface roughening treatment was continuously performed using an alternating voltage of 60 Hz. The electrolyte used for the treatment was an aqueous 1 mass % nitric acid solution (including 0.5% by mass of aluminum ions and 0.007% by mass of ammonium ions), having a temperature of 30° C. A time TP until the current value reached a peak from zero was 2 msec, the duty ratio was 1/1, the alternating voltage was in a trapezoidal form, and a carbon electrode was used as a counter electrode in the electrochemical surface-roughening treatment. Ferrite was used for an auxiliary anode. The current density was 25 A/dm$^2$ at the peak value of electric current. The total electricity quantity when the aluminum plate serves as the anode was 250 C/cm$^2$. 5% of the electric current flowing from the power source was diverted to the auxiliary anode. Thereafter, the plate was washed with water.

(d) A solution including 26% by mass of sodium hydroxide and 6.5% by mass of aluminum ions and having a temperature of 35° C. was sprayed onto the aluminum plate to conduct etching treatment to dissolve the aluminum plate by 0.2 g/m$^2$, thereby removing smut components, consisting mainly of aluminum hydroxide generated when the alternating voltage was used to conduct the electrochemical surface-roughening, and also dissolving edge regions of generated pits to make the edge regions smooth. Thereafter, the plate was washed with water.

(e) The aluminum plate was subjected to desmutting treatment performed by spraying using an aqueous 25 mass % sulfuric acid solution (including 0.5% by mass of aluminum ions) maintained at 60° C., followed by washing with water.

(f) The aluminum plate was subjected to anodizing treatment for 50 seconds under the following conditions: the concentration of sulfuric acid was 170 g/l (including 0.5% by mass of aluminum ions), the temperature was 33° C. and the current density was 5 (A/dm$^2$), followed by washing with water. The weight of the anodized film at this time was 2.7 g/m$^2$.

The surface roughness Ra of the aluminum support obtained in this manner was 0.27 µm (measuring device: SURFCOM, manufactured by TOKYO SEIMITSU Co., Ltd., with a tracer head having a 2 µm diameter).

Undercoat Layer

Next, the following undercoat layer coating solution was applied onto this aluminum support by using a wire bar and dried at 90° C. for 30 minutes. The amount applied was 10 mg/m$^2$.

| Coating solution for undercoat layer | |
|---|---|
| High molecular weight compound A having the following structure (weight average molecular weight: 30,000) | 0.05 g |
| Methanol | 27 g |
| Ion exchange water | 3 g |

High Molecular Weight Compound A

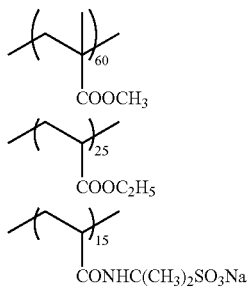

Formation of Recording Layer

A photosensitive layer (i.e. recording layer) coating solution 1 described below was prepared, and then applied to the above-mentioned aluminum support with a wire bar. The resultant was dried at 115° C. for 34 seconds in a hot air dryer to thereby obtain a planographic printing plate precursor of Example 7. The coating amounts after drying were from 1.4 to 2.0 g/m².

| Coating solution for a recording layer 1 | |
|---|---|
| Infrared absorbing agent (IR-1) | 0.074 g |
| Polymerization initiator (P-1) | 0.300 g |
| Additive (AM-1) | 0.161 g |
| Specific amine compound or comparative compound (Compound shown in Table 2) (Note that the addition amount of the specific amine compound in Example 8 was 1.00 g) | 0.200 g or 0 g (not added) |
| Polymerizable compound (tradename: A-BPE-4, manufactured by Shin-Nakamura Chemical Co., Ltd.) | 1.00 g |
| Binder polymer (BT-1) (Weight average molecular weight: 100,000) | 1.00 g |
| Ethyl violet (CL-1) | 0.04 g |
| Fluorine-containing surfactant (tradename: MEGAFAC F-780-F, manufactured by Dainippon Ink & Chemicals, Inc., methyl isobutyl ketone (MIBK) 30 mass % solution) | 0.016 g |
| Methyl ethyl ketone | 10.4 g |
| Methanol | 5.16 g |
| 1-methoxy-2-propanol | 10.4 g |

Example 8

A planographic printing plate precursor of Example 8 was obtained in the same manner as in Example 7 except that the amount of hexamethylenetetramine (I-1), which was a specific amine compound, was changed to 1.00 g in the preparation of the coating solution for a photosensitive layer used in Example 7.

Example 9

A planographic printing plate precursor having two oxygen blocking layers was produced in the same manner as in Example 7 except that a lower protective layer (serving as an oxygen blocking layer) and an upper protective layer (serving as another oxygen blocking layer), which are described below, were formed on the surface of the recording layer.

Formation of Lower Protective Layer

A mixture solution (protective layer coating solution) was obtained by mixing synthetic mica (trade name: SOMASHIF MEB-3L, manufactured by Co-op Chemical Co., Ltd.; a 3.2% dispersion of mica in water), polyvinyl alcohol (registered name: GOHSERAN CKS-50 (sulfonic acid-modified polyvinyl alcohol), manufactured by Nippon Synthetic Chemical Industry, Co., Ltd.; saponification degree: 99% by mole, polymerization degree: 300), a surfactant A (EMALEX 710: trade name, manufactured by Nihon Emulsion Co., Ltd.), and a surfactant B (ADEKA PLURONIC P-84: trade name, manufactured by ADEKA Corporation). The mixture solution was applied by a wire bar onto the surface of the recording layer. The resultant was dried with a hot-wind drier at 125° C. for 30 seconds.

In the mixture solution (protective layer coating solution), the ratio of the synthetic mica (solid content), polyvinyl alcohol, surfactant A, and surfactant B (i.e. synthetic mica/polyvinyl alcohol/surfactant A/surfactant B) was 7.5/89/2/1.5 (mass %). The anount of the applied mixture solution was 0.5 g/m² (as the amount after the drying).

Formation of Upper Protective Layer

A mixture solution (protective layer coating solution) was obtained by mixing an organic filler (ART PEARL J-7P, manufactured by Negami Chemical Industrial Co., Ltd.), synthetic mica (trade name: SOMASHIF MEB-3L, manufactured by Co-op Chemical Co., Ltd.; a 3.2% dispersion of mica in water), polyvinyl alcohol (trade name: L-3266 (sulfonic acid-modified polyvinyl alcohol), manufactured by Nippon Synthetic Chemical Industry, Co., Ltd.; saponification degree: 87% by mole, polymerization degree: 300), a thickening agent (trade name: CELLOGEN FS-B, manufactured by Dai-ichi Kogyo Seiyaku Co., Ltd.), a polymer compound A (having the above-mentioned structure), and a surfactant (EMALEX 710: trade name, manufactured by Nihon Emulsion Co., Ltd.). The mixture solution was applied by wire bar onto the surface of the lower protective layer. The resultant was dried with a hot-wind drier at 125° C. for 30 seconds.

In the upper protective layer coating solution, the proportion of the organic filler, synthetic mica (solid content), polyvinyl alcohol, thickening agent, polymer compound A, and surfactant (i.e. organic filler/synthetic mica/polyvinyl alcohol/thickening agent/polymer compound A/surfactant) was 4.7/2.8/67.4/18.6/2.3/4.2 (mass %). The amount of the applied mixture solution was 1.8 g/m² (as the amount after the drying).

Examples 10 to 14

Planographic printing plate precursors were obtained in the same manner as in Example 7 except that the specific amine compound included in the photosensitive layer coating solution 1 was changed to the specific amine compounds or comparative compounds shown in Table 2.

Comparative Example 6

A planographic printing plate precursor was obtained in the same manner as in Example 7 except that the specific amine compound was not added to the photosensitive layer coating solution 1.

Comparative Examples 7 to 10

Planographic printing plate precursors were obtained in the same manner as in Example 7 except that the specific amine compound included in the photosensitive layer coating solution 1 was changed to the comparative compounds shown in Table 2.

Evaluation of Planographic Printing Plate Precursor (1) Evaluation of Sensitivity With an exposure device (trade name: TRENDSETTER 800IIQUANTUM, manufactured by Creo Inc.), each of the resultant planographic printing plate precursors was exposed to light under the following conditions: the resolution was 2400 dpi, the rotation speed of an outer face drum was 200 rpm, the output was in the range of from 0 to 8 W, the output being changed in increments of 0.15 as a value of log e within the above output range, the temperature was 25° C., and the relative humidity was 50%.

Without subjecting the precursor to heating treatment or washing treatment after the exposure, the precursor was subjected to development treatment by use of an automatic developing machine (trade name: LP-1310HII, manufactured by Fuji Photo Film Co., Ltd.) at a conveyance speed (line speed) of 2 m/minute and a development temperature of 30° C. The developer used was a solution obtained by diluting a developing agent (trade name: DH-N) with water at a dilution ratio of 1:4, the development replenisher used was a solution obtained by diluting a replenisher agent (trade name: FCT-421) with water at a dilution ratio of 1:1.4, and the finisher used was a solution obtained by diluting a finisher agent (trade name: GN-2K, manufactured by Fuji Photo Film Co., Ltd.) with water at a dilution ratio of 1:1.

(2) Evaluation of Printing Durability

With the exposure device (trade name: TRENDSETTER 800II QUANTUM, manufactured by Creo Inc.), each of the resultant planographic printing plate precursors was exposed to light under the following conditions: the resolution was 2400 dpi, the rotation speed of the outer face drum was 200 rpm, the output was 8 W, the temperature was 25° C., and the relative humidity was 50%.

After the exposure, the precursor was developed in the same manner as in the developing process described in (1) "Evaluations of sensitivity". The resultant planographic printing plate and a printer (trade name: LITHRON, manufactured by Komori Corp.) were used to make printing onto sheets by aid of an ink (trade name: Trans Black N, manufactured by Toyo Ink Mfg. Co., Ltd.) and an aqueous solution as dampening water including 10% by mass of isopropyl alcohol and 1% by mass of EU-3. The printing was stopped when sufficient ink concentration could no longer be maintained, and the number of sheets printed with sufficient ink concentration was counted.

The number of printed sheets obtained by use of the planographic printing plate obtained in Example 7 was regarded as 100, and the number of printed sheets obtained by use of each of the other planographic printing plates was represented as a relative value thereto. A larger value thus indicates a higher printing durability. The evaluation results are shown in Table 2.

TABLE 2

| | Specific amine compound (D) or Comparative compound | Sensitivity (%) | Printing durability (%) |
|---|---|---|---|
| Example 7 | Hexamethylenetetramine (I-1) | 100 | 100 |
| Example 8 | Hexamethylenetetramine (I-1) (addition amount: 1.00 g) | 107 | 83 |
| Example 9 | Hexamethylenetetramine (I-1) (protective layers are provided) | 160 | 123 |
| Example 10 | 1,3,5-triaza-adamantan-7-ylamine (I-2) | 102 | 95 |
| Example 11 | 1,8-diazabicyclo[5,4,0]-7-undecene (II-1) | 110 | 96 |
| Example 12 | 7-methyl-1,5,7-triazabicyclo[4,4,0]dec-5-ene (II-5) | 109 | 102 |
| Example 13 | 4-di(methylamino) pyridine (III-3) | 88 | 95 |
| Example 14 | 4-(methylamino) pyridine (III-2) | 84 | 88 |
| Comparative Example 6 | No additive (for comparative purposes) | 23 | 33 |
| Comparative Example 7 | Didecylmethylamine (for comparative purposes: chain amine) | 55 | 60 |
| Comparative Example 8 | N,N-didodecylmethylamine (for comparative purposes: chain amine) | 50 | 55 |
| Comparative Example 9 | N,N-diethylaniline (for comparative purposes: aniline) | 30 | 45 |
| Comparative Example 10 | N,N-diethyl-p-toluidine (for comparative purposes: aniline) | 26 | 46 |

Regarding the density of the image region of a planographic printing plate obtained by development, the cyan density was measured using a Macbeth reflection densitometer RD-918 through a red filter equipped on the densitometer. The reciprocal number of the exposure dose necessary for achieving the measured density of 0.6 was used as an index of sensitivity. The sensitivity of the planographic printing plate obtained in Example 7 was regarded as 100, and the sensitivity of each of the other planographic printing plates was represented as a relative value thereto. A larger value indicates a higher sensitivity.

As is evident form Table 2, in the planographic printing plate precursors of the invention, even when the precursors having no oxygen blocking layer are subjected to image formation under the oxygen atmosphere, polymerization of the composition advances efficiently so that the precursors exhibit high sensitivity and printing durability.

On the other hand, the precursor of Comparative Example 6, which also has no oxygen blocking layer and does not include the specific alicyclic compound of the invention, has remarkably lower sensitivity and printing durability than the precursors of the present invention that have no oxygen blocking layer. Meanwhile, Comparative Examples 7 to 10 each employing a compound that includes a urea bond but is not the specific alicyclic compound of the invention, the sensitivity and printing durability of the resultant precursors are lower than that of the precursors of the invention.

Furthermore, as apparent from the comparison between Example 7 and Example 9, it is confirmed that the sensitivity and printing durability are further improved by arranging an oxygen blocking layer on a recording layer.

Example 15

Preparation of Support

A support was obtained in the same manner as that used for obtaining the supports of Examples 7 to 14.

Undercoat Layer

The support was immersed in an aqueous solution containing 4 g/L of polyvinyl phosphonic acid at 40° C. for 10 seconds, and washed with tap water having a temperature of 20° C. for 2 seconds, followed by drying, thereby preparing an aluminum support on which an undercoat layer is provided.

Formation of Recording Layer

The recording layer coating solution 2 described below was prepared and then applied onto the undercoat layer provided on the aluminum support by use of a wire bar. The resultant was dried with a hot-wind drier at 115° C. for 34 seconds, thereby providing a planographic printing plate precursor. The coating amount after the drying was from 1.3 to 2.0 g/m².

Recording Layer Coating Solution 2:

| | |
|---|---|
| Polymerizable compound (Compound A): | 1.00 g |
| Binder polymer (Binder A): | 0.50 g |
| Specific amine compound or Comparative compound (shown in Table 3): | 0.200 g or 0 g (none) |
| Sensitizing dye (C-1) having the structure shown below: | 0.08 g |
| Polymerization initiator (D-1) having the structure shown below: | 0.15 g |
| Chain transfer agent (E-1) having the structure shown below: | 0.14 g |
| Aluminum N-nitrosophenylhydroxylamine salt: | 0.005 g |
| ε-Phthalocyanine pigment dispersion: | 0.18 g |
| (pigment: 15 parts by mass; dispersant (polymer (1) shown below): 10 parts by mass; solvent: cyclohexanone/methoxypropyl acetate/1-methoxy-2-propanol = 15/20/40 (parts by mass)) | |
| Fluorine-containing nonionic surfactant (trade name: MEGAFAC F780, manufactured by Dainippon Ink & Chemicals, Inc.): | 0.004 g |
| Methyl ethyl ketone: | 12 g |
| Propylene glycol monomethyl ether: | 12 g |

The structures of the polymerizable compound (Compound A), the binder polymer (Binder A), the polymerization initiator (D-1), the sensitizing dye (C-1), the chain transfer agent (E-1), and the polymer (1) are shown below.

Mixture of the Isomers Shown Above

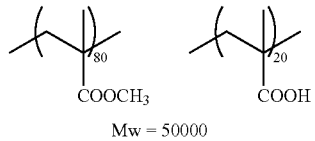

Binder A

Mw = 50000

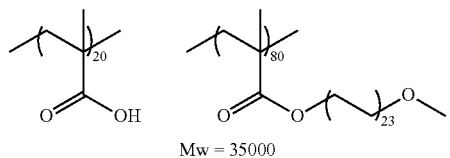

Polymer (1)

Mw = 35000

Sensitizing dye C-1

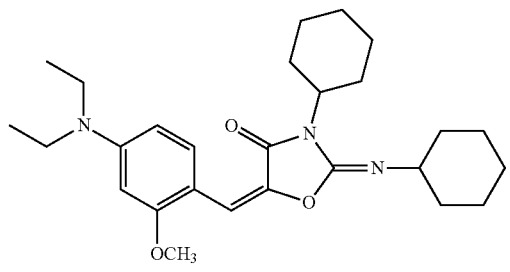

λ max = 385 nm

Polymerization initiator D-1

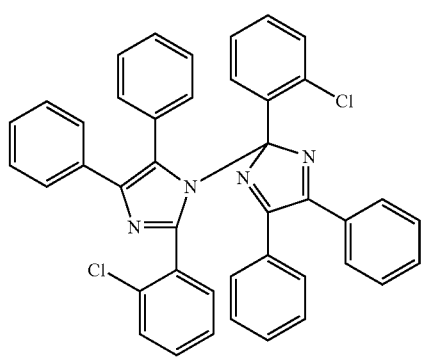

Chain transfer agent E-1

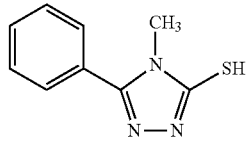

Compound A

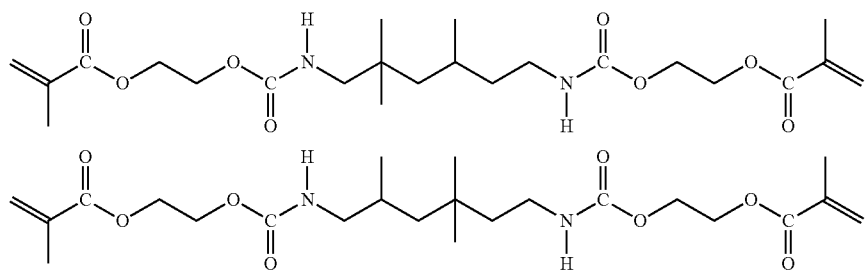

Example 16

A planographic printing plate precursor was prepared in the same manner as in Example 15 except that the amount of hexamethylenetetramine (I-1) used as the specific amine compound in the preparation of the photosensitive layer coating solution 2 was changed to 1.00 g.

Example 17

A planographic printing plate precursor having two oxygen blocking layers was produced in the same manner as in Example 15 except that a lower protective layer (serving as an oxygen blocking layer) and an upper protective layer (serving as another oxygen blocking layer), which are described below, were formed on the surface of the recording layer.

Formation of Lower Protective Layer

A mixture solution (protective layer coating solution) was obtained by mixing synthetic mica (trade name: SOMASHIF MEB-3L, manufactured by Co-op Chemical Co., Ltd.; a 3.2% dispersion of mica in water), polyvinyl alcohol (registered name: GOHSERAN CKS-50 (sulfonic acid-modified polyvinyl alcohol), manufactured by Nippon Synthetic Chemical Industry, Co., Ltd.; saponification degree: 99% by mole, polymerization degree: 300), a surfactant A (EMALEX 710: trade name, manufactured by Nihon Emulsion Co., Ltd.), and a surfactant B (ADEKA PLURONIC P-84: trade name, manufactured by ADEKA Corporation). The mixture solution was applied by a wire bar onto the surface of the recording layer. The resultant was dried with a hot-wind drier at 125° C. for 30 seconds.

In the mixture solution (protective layer coating solution), the ratio of the synthetic mica (solid content), polyvinyl alcohol, surfactant A, and surfactant B (i.e. synthetic mica/polyvinyl alcohol/surfactant A/surfactant B) was 7.5/89/2/1.5 (mass %). The amount of the applied mixture solution was 0.5 $g/m^2$ (as the amount after the drying).

Formation of Upper Protective Layer

A mixture solution (protective layer coating solution) was obtained by mixing an organic filler (ART PEARL J-7P, manufactured by Negami Chemical Industrial Co., Ltd.), synthetic mica (trade name: SOMASHIF MEB-3L, manufactured by Co-op Chemical Co., Ltd.; a 3.2% dispersion of mica in water), polyvinyl alcohol (trade name: L-3266 (sulfonic acid-modified polyvinyl alcohol), manufactured by Nippon Synthetic Chemical Industry, Co., Ltd.; saponification degree: 87% by mole, polymerization degree: 300), a thickening agent (trade name: CELLOGEN FS-B, manufactured by Dai-ichi Kogyo Seiyaku Co., Ltd.), a polymer compound A (having the above-mentioned structure), and a surfactant (EMALEX 710: trade name, manufactured by Nihon Emulsion Co., Ltd.). The mixture solution was applied by wire bar onto the surface of the lower protective layer. The resultant was dried with a hot-wind drier at 125° C. for 30 seconds.

In the mixture solution (protective layer coating solution), the ratio of the organic filler, synthetic mica (solid content), polyvinyl alcohol, thickening agent, polymer compound A, and surfactant (i.e. organic filler/synthetic mica/polyvinyl alcohol/thickening agent/polymer compound A/surfactant) was 4.7/2.8/67.4/18.6/2.3/4.2 (mass %). The amount of the applied mixture solution was 1.8 $g/m^2$ (as the amount after the drying).

Examples 18 to 22

Planographic printing plate precursors were obtained in the same manner as in Example 15 except that the specific amine compound included in the photosensitive layer coating solution 2 was changed to the specific amine compounds shown in Table 3.

Comparative Example 11

A planographic printing plate precursor was obtained in the same manner as in Example 15 except that the specific amine compound was not added to the photosensitive layer coating solution 2.

Comparative Examples 12 to 15

Planographic printing plate precursors were obtained in the same manner as in Example 15 except that the specific amine compound included in the photosensitive layer coating solution 2 was changed to the comparative compounds shown in Table 3.

Evaluation of Planographic Printing Plate Precursors (1) Evaluation of Sensitivity With a Violet semiconductor laser Vx9600 (InGaN semiconductor laser: 405 nm±10 nm) (trade name, manufactured by FUJIFILM Electronic Imaging Ltd.), each of the resultant planographic printing plate precursors was exposed to light under the following conditions: the resolution was 2483 dpi, the exposure pattern was 50-% square dots, and the output was changed among the precursors, the temperature was 25° C., and the relative humidity was 50%.

After the exposure, the resultant materials were each immersed in a developer having the following composition at 25° C. for 15 seconds for development. The minimum exposure dose in terms of $mJ/cm^2$ necessary for forming an image was obtained, and the reciprocal number of the calculated value was used as an index of sensitivity. The sensitivity of the planographic printing plate of Example 15 was regarded as 100, and the sensitivity of each of the other planographic printing plates was represented in terms of a relative value thereto. A larger value indicates a higher sensitivity. The evaluation results are shown in Table 3.

| Composition of developer | |
|---|---|
| Sodium carbonate: | 130 g |
| Sodium hydrogen carbonate: | 70 g |
| NEWCOL B13 (trade name, manufactured by Nippon Nyukazai Co., Ltd.): | 500 g |
| Gum arabic (water-soluble polymer): | 250 g |
| Hydroxyalkylated starch (water-soluble polymer; trade name: PENON JE66 manufactured by Nippon Starch Chemical Co., Ltd.): | 700 g |
| Ammonium primary phosphate: | 20 g |
| 2-Bromo-2-nitropropane-1,3-diol: | 0.1 g |
| 2-Methyl-4-isothiazolin-3-one: | 0.1 g |

(2) Evaluation of Printing Durability

With a Violet semiconductor laser Vx9600 (InGaN semiconductor laser: 405 nm±10 nm) (trade name, manufactured by FUJIFILM Electronic Imaging Ltd.), each of the resultant planographic printing plate precursors was exposed to light under the following conditions: the resolution was 2483 dpi, the exposure pattern was 50-% square dots, and the output was 30 mW, and the plate surface energy was 90 $\mu J/cm^2$. After the exposure, the precursor was developed in the same manner as in the development process described in (1) "Evaluation of sensitivity". The resultant planographic printing plate and a printer (trade name: LITHRON, manufactured by Komori Corp.) were used to perform printing onto sheets in such a manner that the ink present on the surface of the plate was removed after every 10,000 printed sheets, using a multi-cleaner manufactured by Fuji Film Corporation. The printing was stopped when sufficient ink concentration could no longer be maintained, and the number of printed sheets that had been printed was used as an index of printing durability.

The number of printed sheets obtained by use of the planographic printing plate obtained in Example 15 was regarded as 100, and the number of printed sheets obtained by use of each of the other planographic printing plates was represented as a relative value thereto. A larger value thus indicates a higher printing durability. The evaluation results are shown in Table 3.

TABLE 3

|  | Specific amine compound (D) or Comparative compound | Sensitivity (%) | Printing durability (%) |
|---|---|---|---|
| Example 15 | Hexamethylenetetramine (I-1) | 100 | 100 |
| Example 16 | Hexamethylenetetramine (I-1) (addition amount: 1.00 g) | 110 | 88 |
| Example 17 | Hexamethylenetetramine (I-1) (protective layers are provided) | 170 | 133 |
| Example 18 | 1,3,5-triaza-adamantan-7-ylamine (I-2) | 104 | 96 |
| Example 19 | 1,8-diazabicyclo[5,4,0]-7-undecene (II-1) | 115 | 99 |
| Example 20 | 7-methyl-1,5,7-triazabicyclo[4,4,0]dec-5-ene (II-5) | 110 | 100 |
| Example 21 | 4-di(methylamino)pyridine (III-3) | 90 | 94 |
| Example 22 | 4-(methylamino)pyridine (III-2) | 85 | 80 |
| Comparative example 11 | No additive (for comparative purposes) | 13 | 10 |
| Comparative example 12 | Didecylmethylamine (for comparative purposes: chain amine) | 50 | 40 |
| Comparative example 13 | N,N'-didocecylmethylamine (for comparative purposes: chain amine) | 55 | 50 |
| Comparative example 14 | N,N-diethylaniline (for comparative purposes: chain aniline) | 40 | 35 |
| Comparative example 15 | N,N-diethyl-p-toluidine (for comparative purposes: chain aniline) | 20 | 30 |

As is evident form Table 3, in the planographic printing plate precursors of the invention, even when the precursors having no oxygen blocking layer are subjected to image formation under the oxygen atmosphere, polymerization of the composition advances efficiently so that the precursors exhibit high sensitivity and printing durability.

On the other hand, the precursor of Comparative Example 11, which also has no oxygen blocking layer and does not include the specific alicyclic compound of the invention, has remarkably lower sensitivity and printing durability than the precursor of the present invention which has no oxygen blocking layer. Meanwhile, Comparative Examples 12 to 15 each employing a compound that includes a urea bond but is not the specific alicyclic compound of the invention, the sensitivity and printing durability of the resultant precursors are lower than that of the precursors of the invention.

Furthermore, as apparent from the comparison between Example 15 and Example 17, it is confirmed that the sensitivity and printing durability are further improved by arranging an oxygen blocking layer on a recording layer.

What is claimed is:

1. A curable composition, comprising:
a polymerizable compound having an ethylenically unsaturated bond; a binder;
a radical polymerization initiator which is an onium salt compound; and
at least one amine compound represented by Formula (I) or Formula (III):

(I)

-continued

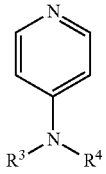
(III)

wherein, in Formulae (I) and (III), $R^1$ and $R^2$ each independently represents a hydrogen atom, an alkyl group, a cycloalkyl group, an aralkyl group, an aryl group, or an acyl group; $R^3$ and $R^4$ each independently represents a hydrogen atom, an alkyl group, a cycloalkyl group, an aralkyl group, or an aryl group; $Z^1$ and $Z^2$ each independently represents an atomic group that forms a monocyclic or polycyclic structure with the amino group(s); and $Z^1$ and $Z^2$ may be combined with each other to form a ring.

2. The curable composition according to claim 1, wherein the amine compound is represented by Formula (I); the alkyl group represented by $R^1$ or $R^2$ is a straight chain or branched alkyl group having 1 to 20 carbon atoms; the cycloalkyl group represented by $R^1$ or $R^2$ has 3 to 20 carbon atoms; the aralkyl group represented by $R^1$ or $R^2$ has 7 to 20 carbon atoms; and the aryl group represented by $R^1$ or $R^2$ has 6 to 20 carbon atoms.

3. The curable composition according to claim 1, wherein the amine compound is represented by Formula (I) and the number of carbon atoms of $Z^1$ and/or $Z^2$ is 2 to 10.

4. The curable composition according to claim 1, wherein the amine compound is represented by Formula (I), and the substituent represented by $R^1$ or $R^2$ may further include a substituent selected from the group consisting of an alkyl group, a cycloalkyl group, an aralkyl group, an aryl group, an acyl group, a hydroxyl group, an amino group, a halogen group, a carboxyl group, a carbonyl group, a sulfonyl group, and a nitro group.

5. The curable composition according to claim 1, wherein the amine compound is represented by Formula (III); the alkyl group represented by $R^3$ or $R^4$ is a straight chain or branched alkyl group having 1 to 20 carbon atoms; the aralkyl group represented by $R^3$ or $R^4$ has 7 to 20 carbon atoms; and the aryl group represented by $R^3$ or $R^4$ has 6 to 8 carbon atoms.

6. The curable composition according to claim 1, wherein the amine compound is represented by Formula (III); and the substituent represented by $R^3$ or $R^4$ may further include a substituent selected from the group consisting of an alkyl group, a cycloalkyl group, an aralkyl group, an aryl group, an acyl group, a hydroxyl group, an amino group, a halogen group, a carboxyl group, a carbonyl group, a sulfonyl group, and a nitro group.

7. The curable composition according to claim 1, wherein the amine compound represented by Formula (I) or Formula (III) is included in an amount of 1 to 100 parts by mass with respect to 100 parts by mass of the polymerizable compound having an ethylenically unsaturated bond.

8. The curable composition according to claim 1, wherein the amine compound represented by Formula (I), or Formula (III) has a molecular weight of from about 90 to about 1500.

9. The curable composition according to claim 1, further comprising an infrared absorbing agent.

10. The curable composition according to claim 1, further comprising a sensitizing dye.

11. The curable composition according to claim 10, wherein the sensitizing dye has an absorption maximum in the range of from 300 nm to 450 nm.

12. A curable composition according to claim 1, wherein the onium salt compound is a compound having a structure selected from Formulae (RI-I) to (RI-III):

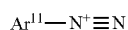 (RI-I)

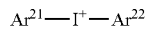 (RI-II)

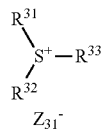 (RI-III)

wherein in Formula (RI-I), $Ar^{11}$ represents an aryl group having 20 or less carbon atoms, which may have 1 to 6 substituents, and the substituents are selected from alkyl groups having 1 to 12 carbon atoms, alkenyl groups having 1 to 12 carbon atoms, alkynyl groups having 1 to 12 carbon atoms, aryl groups having 1 to 12 carbon atoms, alkoxy groups having 1 to 12 carbon atoms, aryloxy groups having 1 to 12 carbon atoms, halogen atoms, alkylamino groups having 1 to 12 carbon atoms, dialkylamino groups having 1 to 12 carbon atoms, alkyl amide groups having 1 to 12 carbon atoms, aryl amide groups having 1 to 12 carbon atoms, carbonyl groups, carboxyl groups, cyano groups, sulfonyl groups, thioalkyl groups having 1 to 12 carbon atoms, and thioaryl groups having 1 to 12 carbon atoms; and $Z_{11}^-$ represents a monovalent anion which is selected from a halogen ion, a perchlorate ion, a hexafluorophosphate ion, a tetrafluoroborate ion, a sulfonate ion, a sulfinate ion, a thiosulfonate ion and a sulfate ion;

in Formula (RI-II), $Ar^{21}$ and $Ar^{22}$ each independently represents an aryl group which has 20 or less carbon atoms and may have 1 to 6 substituents, and the substituents are selected from alkyl groups each having 1 to 12 carbon atoms, alkenyl groups each having 1 to 12 carbon atoms, alkynyl groups each having 1 to 12 carbon atoms, aryl groups each having 1 to 12 carbon atoms, alkoxy groups each having 1 to 12 carbon atoms, aryloxy groups each having 1 to 12 carbon atoms, halogen atoms, alkylamino groups each having 1 to 12 carbon atoms, dialkylamino groups each having 1 to 12 carbon atoms, alkyl amide groups each having 1 to 12 carbon atoms, aryl amide groups each having 1 to 12 carbon atoms, carbonyl groups, carboxyl groups, cyano groups, sulfonyl groups, thioalkyl groups each having 1 to 12 carbon atoms, and thioaryl groups each having 1 to 12 carbon atoms; and $Z_{21}^-$ represents a monovalent anion which is selected from a halogen ion, a perchlorate ion, a hexafluorophosphate ion, a tetrafluoroborate ion, a sulfonate ion, a sulfinate ion, a thiosulfonate ion and a sulfate ion; and in Formula (RI-III), $Ar^{31}$, $Ar^{32}$, and $Ar^{33}$ each independently represents an aryl, alkyl, alkenyl, or alkynyl group which has 20 or less carbon atoms and may have 1 to 6 substituents, and the substituents are selected from alkyl groups each having 1 to 12 carbon atoms, alkenyl groups each having 1 to 12 carbon atoms, alkynyl groups each having 1 to 12 carbon atoms, aryl groups each having 1 to 12 carbon atoms, alkoxy groups each having 1 to 12 carbon atoms, aryloxy groups each having 1 to 12 carbon atoms, halogen atoms, alkylamino groups each having 1 to 12 carbon atoms, dialkylamino groups each having 1 to 12 carbon atoms, alkyl amide groups each having 1 to 12 carbon atoms, aryl amide groups each having 1 to 12 carbon atoms, carbonyl groups, carboxyl groups, cyano groups, sulfonyl groups, thioalkyl groups each having 1 to 12 carbon atoms, and thioaryl groups each having 1 to 12 carbon atoms; and $Z_{31}^-$ represents a monovalent anion which is selected from a halogen ion, a perchlorate ion, a hexafluorophosphate ion, a tetrafluoroborate ion, a sulfonate ion, a sulfinate ion, a thiosulfonate ion and a sulfate ion.

13. An image forming material, comprising:

a support; and a recording layer provided on the support, the recording layer including a curable composition including:

a polymerizable compound having an ethylenically unsaturated bond; a binder;

a radical polymerization initiator which is an onium salt compound; and at least one amine compound represented by Formula (I) or Formula (III):

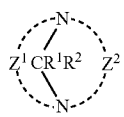

(I)

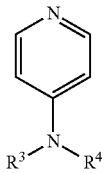

(III)

wherein, in Formulae (I) and (III), $R^1$ and $R^2$ each independently represents a hydrogen atom, an alkyl group, a cycloalkyl group, an aralkyl group, an aryl group, or an acyl group; $R^3$ and $R^4$ each independently represents a hydrogen atom, an alkyl group, a cycloalkyl group, an aralkyl group, or an aryl group; $Z^1$ and $Z^2$ each independently represents an atomic group that forms a monocyclic or polycyclic structure with the amino group(s); and $Z^1$ and $Z^2$ may be combined with each other to form a ring.

14. The image forming material according to claim 13, further comprising an oxygen blocking layer on the recording layer.

15. A planographic printing plate precursor, comprising the image forming material according to claim 14.

16. A planographic printing plate precursor, comprising the image forming material according to claim 13.

* * * * *